(12) United States Patent
Machida et al.

(10) Patent No.: US 6,285,047 B1
(45) Date of Patent: *Sep. 4, 2001

(54) LINEAR IMAGE SENSOR DEVICE, IC ASSEMBLING SUBSTRATE AND METHOD FOR ASSEMBLING THE SAME

(75) Inventors: Satoshi Machida; Yukito Kawahara; Masahiro Yokomichi; Yoshikazu Kojima; Noritoshi Ando, all of Chiba (JP)

(73) Assignee: Seiko Instruments, Inc., Chiba (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/618,919

(22) Filed: Mar. 20, 1996

(30) Foreign Application Priority Data

| Mar. 22, 1995 | (JP) | 7-063230 |
| Mar. 28, 1995 | (JP) | 7-070063 |
| Mar. 29, 1995 | (JP) | 7-072128 |
| Apr. 26, 1995 | (JP) | 7-102795 |
| Jul. 24, 1995 | (JP) | 7-187542 |
| Jul. 24, 1995 | (JP) | 7-187544 |
| Jul. 24, 1995 | (JP) | 7-187545 |
| Aug. 31, 1995 | (JP) | 7-223797 |
| Sep. 14, 1995 | (JP) | 7-237406 |
| Sep. 14, 1995 | (JP) | 7-237407 |
| Sep. 14, 1995 | (JP) | 7-237408 |
| Dec. 1, 1995 | (JP) | 7-314541 |
| Feb. 9, 1996 | (JP) | 8-024375 |
| Feb. 9, 1996 | (JP) | 8-024376 |
| Mar. 15, 1996 | (JP) | 8-058971 |

(51) Int. Cl.$^7$ ................................................. H01L 31/062
(52) U.S. Cl. .......................... 257/293; 257/433; 257/443; 250/208.1
(58) Field of Search ............................... 257/234, 291, 257/292, 293, 294, 433, 443, 448, 458, 723; 250/208.1

(56) References Cited

U.S. PATENT DOCUMENTS

| 4,733,098 | * | 3/1988 | Seito et al. | 250/578 |
| 5,171,717 | * | 12/1992 | Broom et al. | 437/226 |
| 5,476,566 | * | 12/1995 | Cavasin | 156/249 |
| 5,753,959 | * | 5/1998 | Quinn et al. | 257/443 |

* cited by examiner

Primary Examiner—Sara Crane
(74) Attorney, Agent, or Firm—Hogan & Hartson LLP

(57) ABSTRACT

A linear image sensor IC comprising a plurality of switching circuits each connected to a plurality of light receiving elements in series; scanning circuits for sequentially switching said switching circuits; and driving circuits for operating said scanning circuits, wherein a LOCOS isolation layer is formed between an edge in the main scanning direction of the linear image sensor IC which is closest to an array of the light receiving elements and a light receiving portion of the light receiving element. The inventive image sensor IC is mounted by devising so that the circuit can be put into a thin and long pattern in the scanning direction, so that the chip having a width thinner than a thickness thereof which had been beyond expectation by the prior art can be realized. The use of this very thin IC allows a compact IC assembling substrate having less fluctuation among ICs to be manufactured at low cost. Even more, it becomes possible to mount ICs readily on a cylindrical substrate which had been also difficult in the past. Thereby, electronic devices such as a compact and low cost multi-chip type image sensor or multi-chip type thermal head can be realized. Accordingly, it becomes possible to bring down the cost thereof, which had been difficult in the past, and to realize a low cost facsimile.

12 Claims, 51 Drawing Sheets

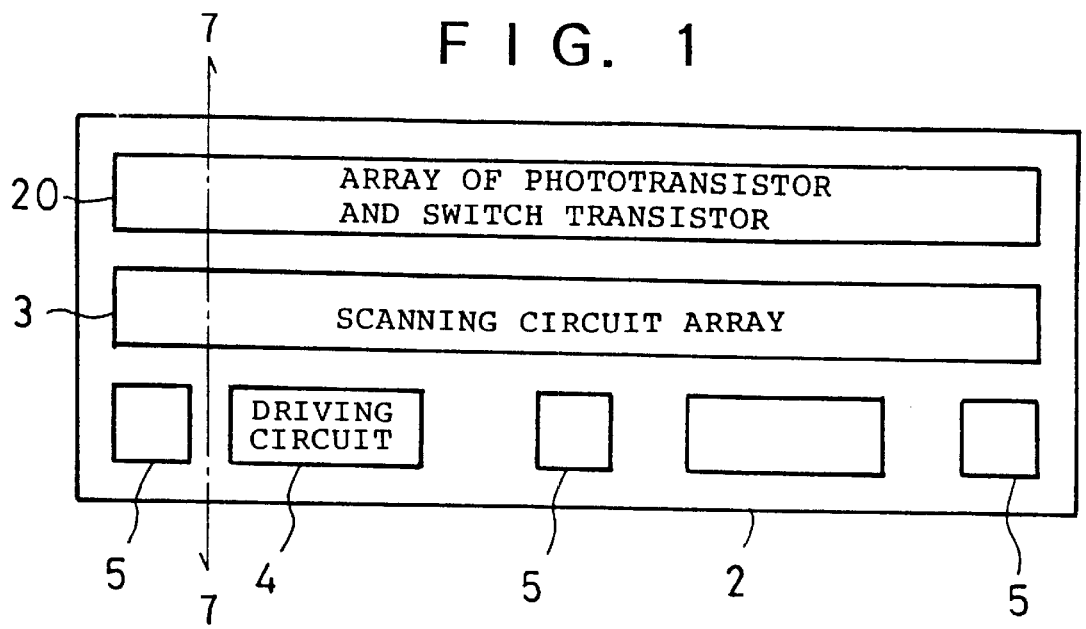
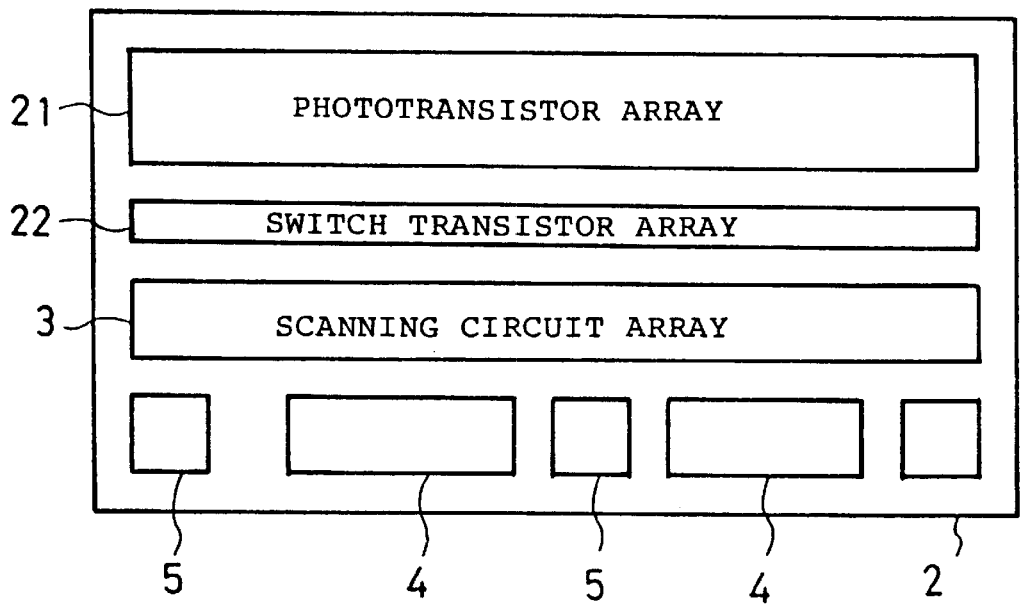

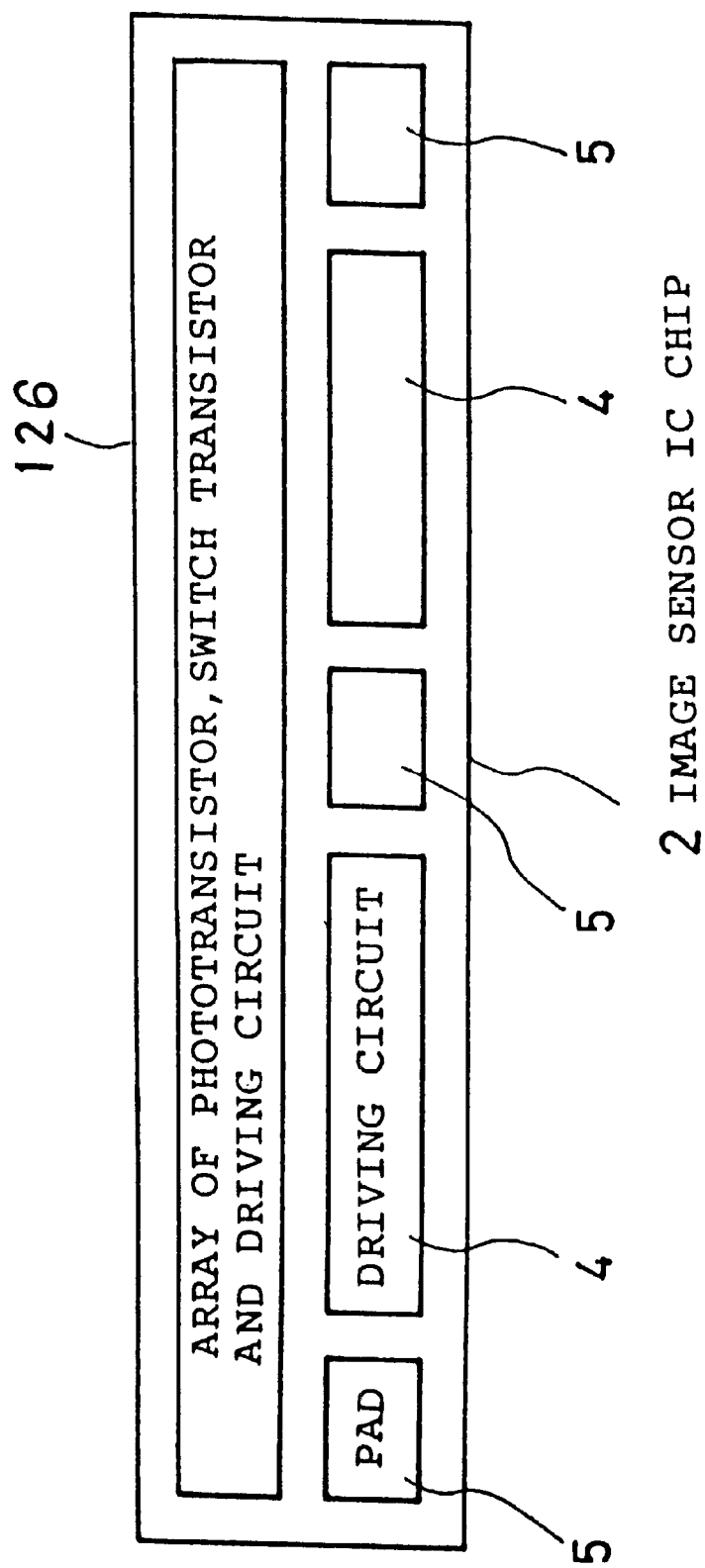

→ MAIN SCANNING DIRECTION

→ MAIN SCANNING DIRECTION

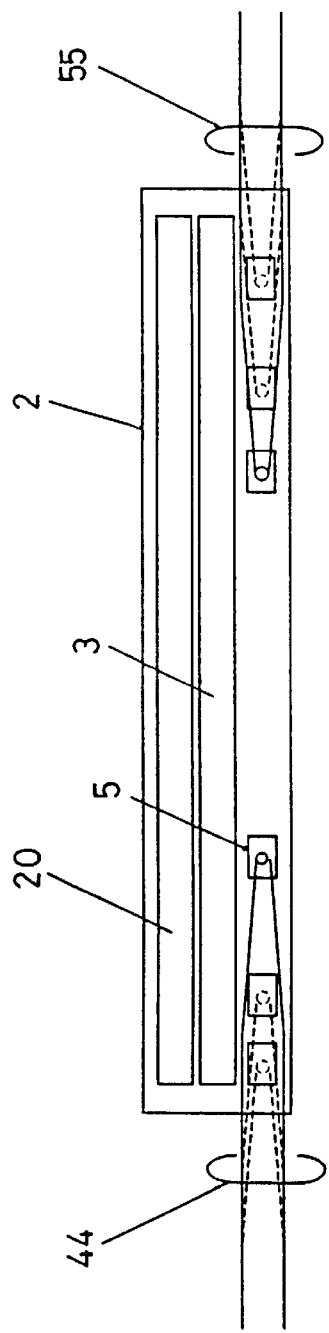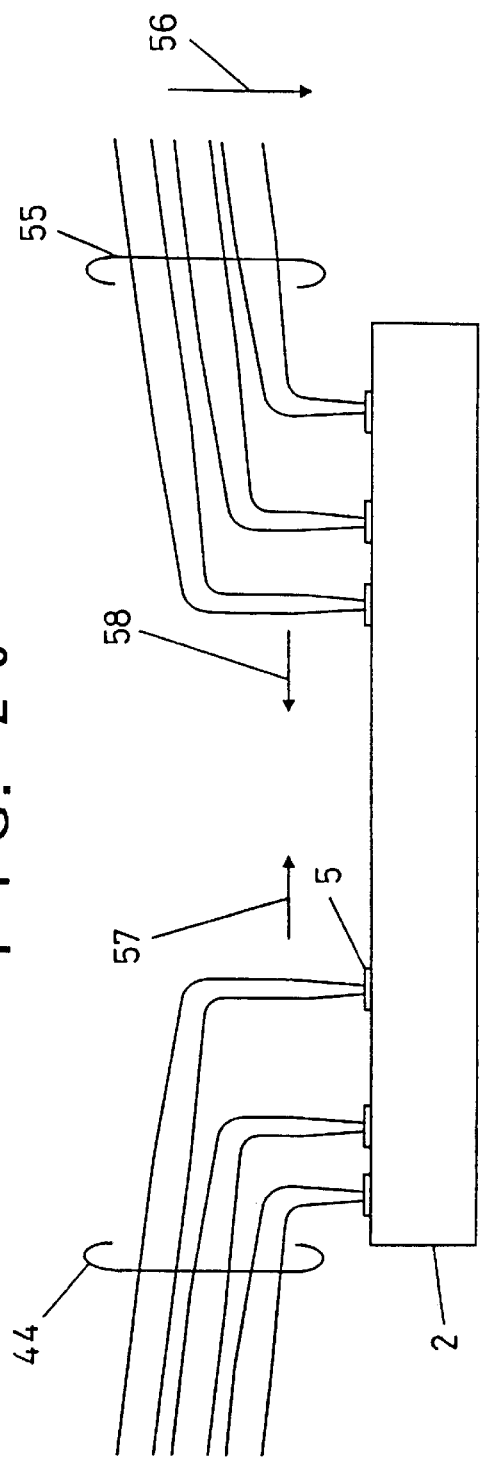

F I G. 4 2
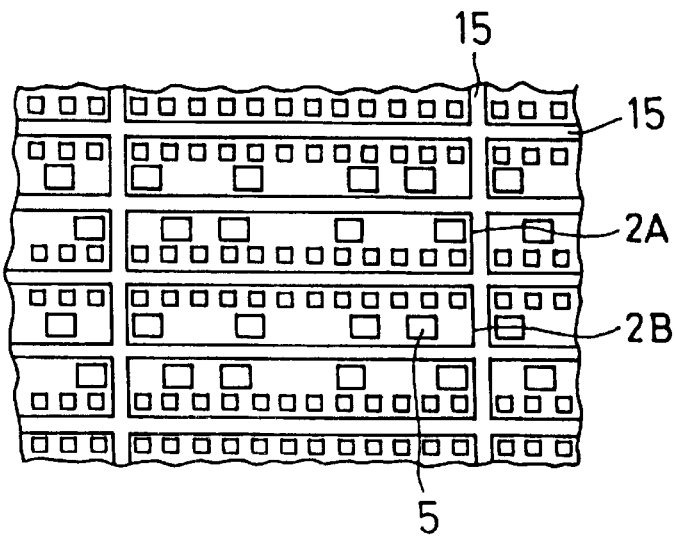
F I G. 4 3
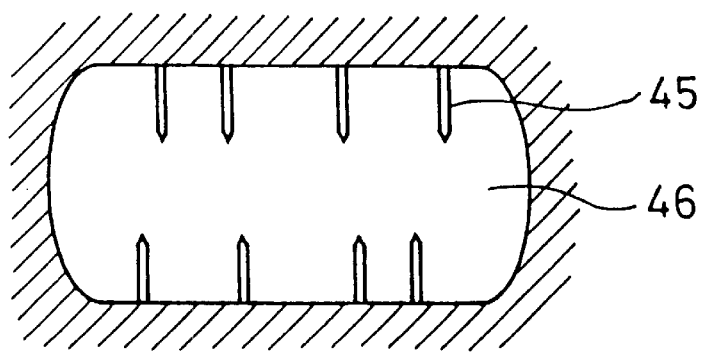
F I G. 4 4
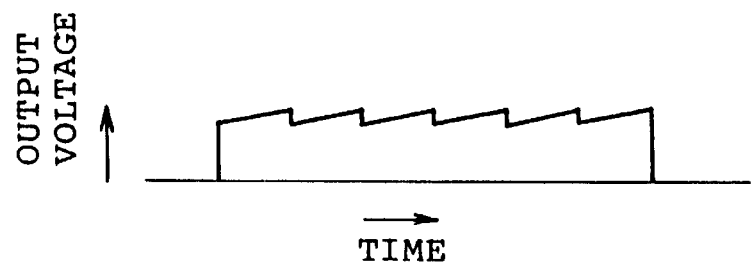
F I G. 4 5
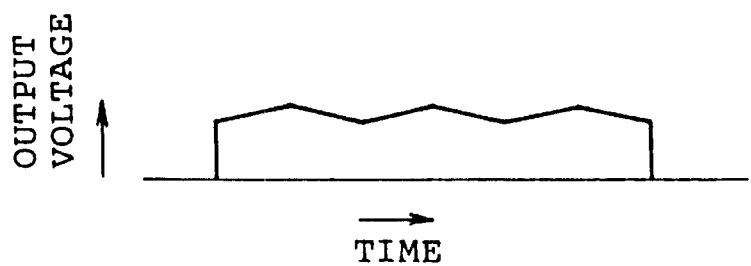

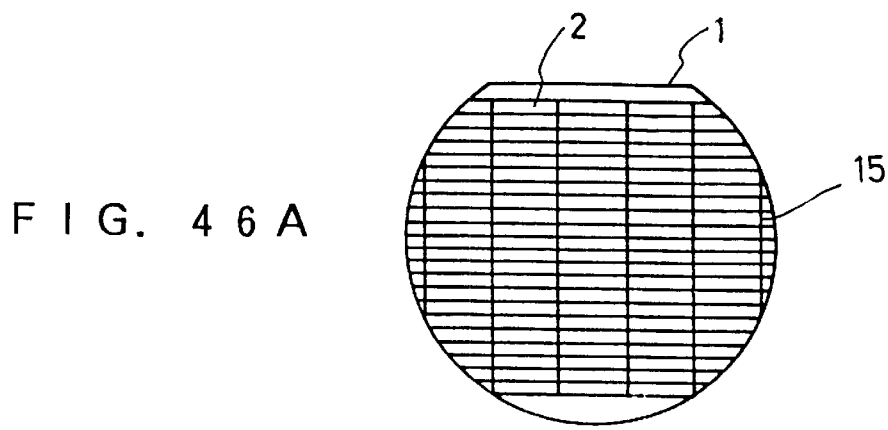
F I G. 4 6 A
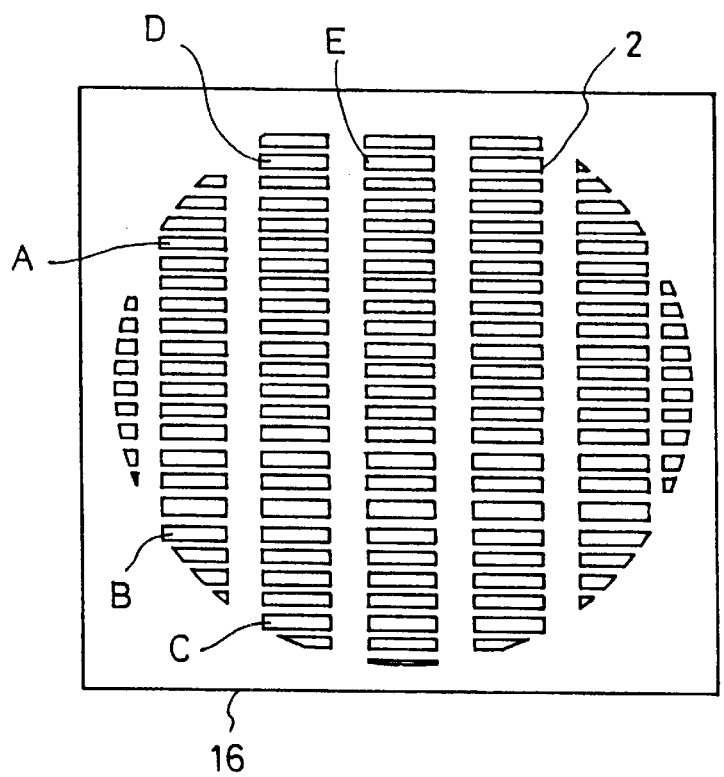
F I G. 4 6 B
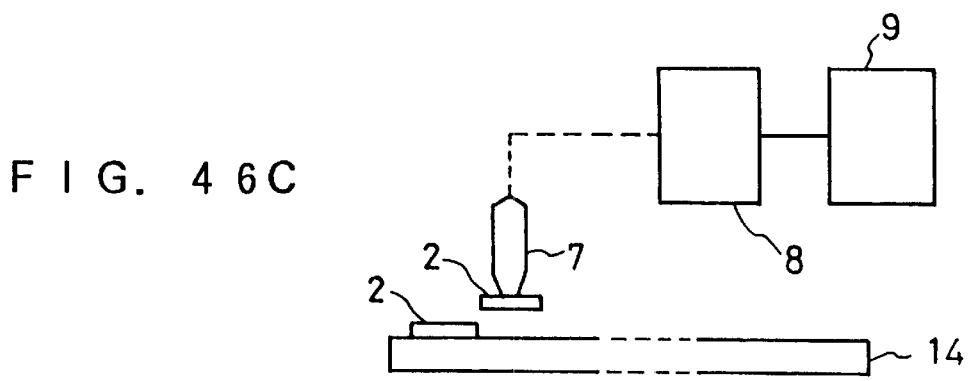
F I G. 4 6 C

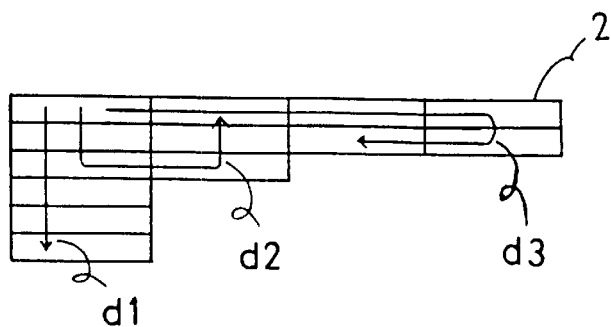
FIG. 50
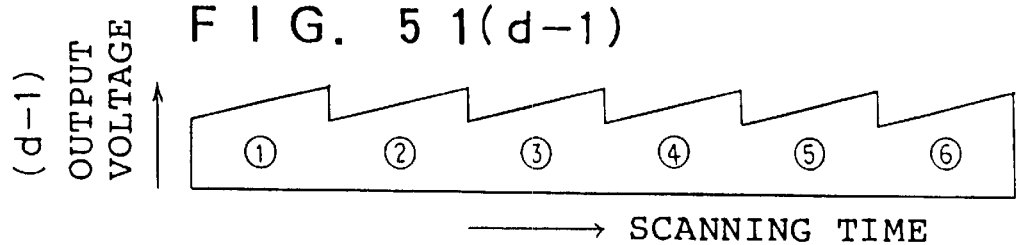
FIG. 51(d-1)
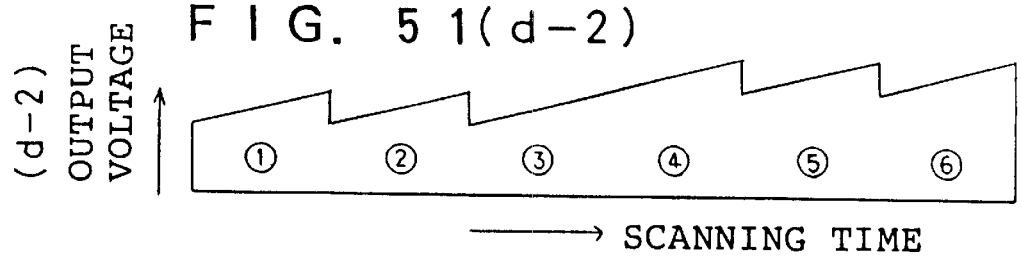
FIG. 51(d-2)
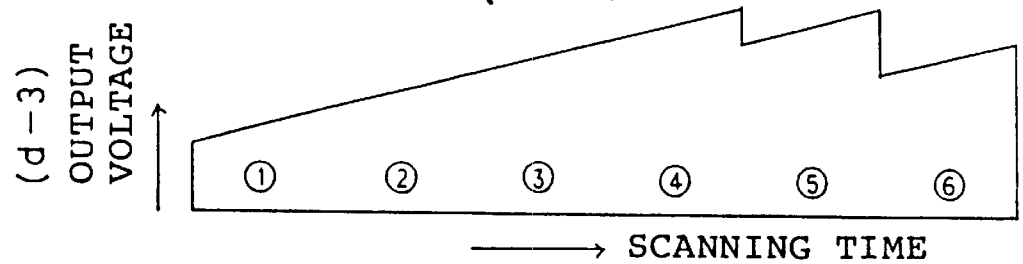
FIG. 51(d-3)

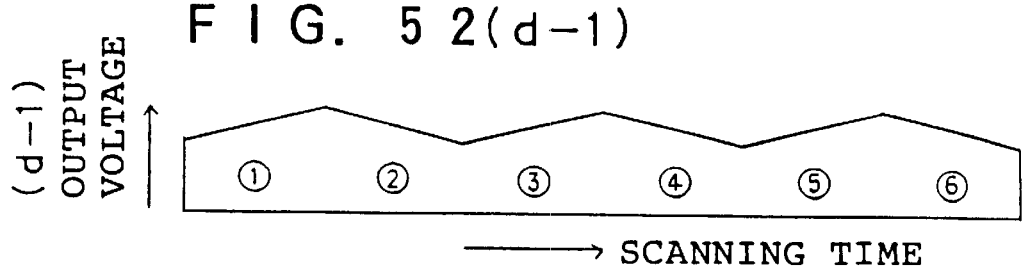
FIG. 52(d-1)
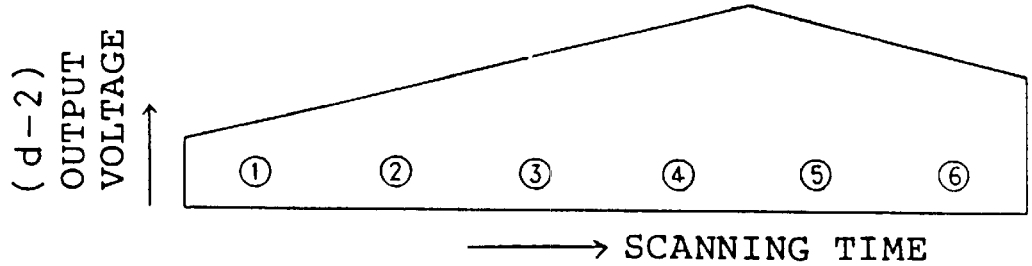
FIG. 52(d-2)
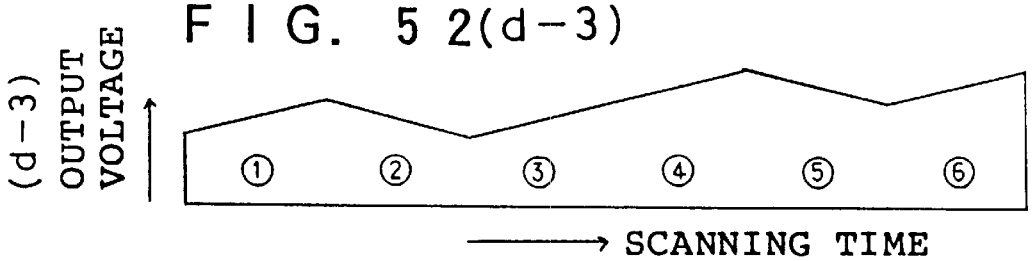
FIG. 52(d-3)

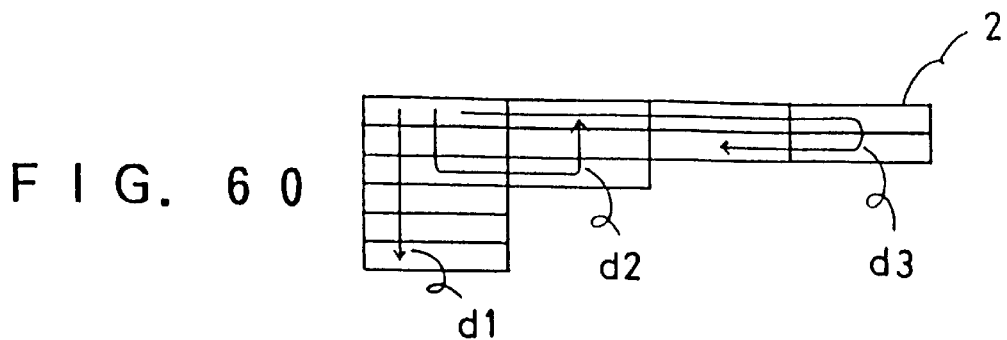
FIG. 60
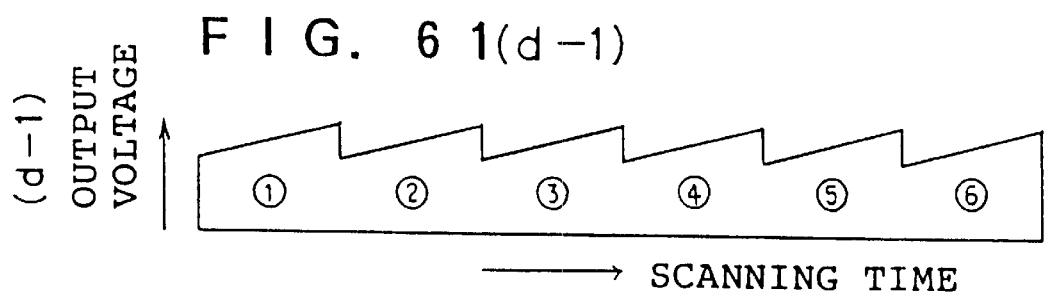
FIG. 61(d-1)
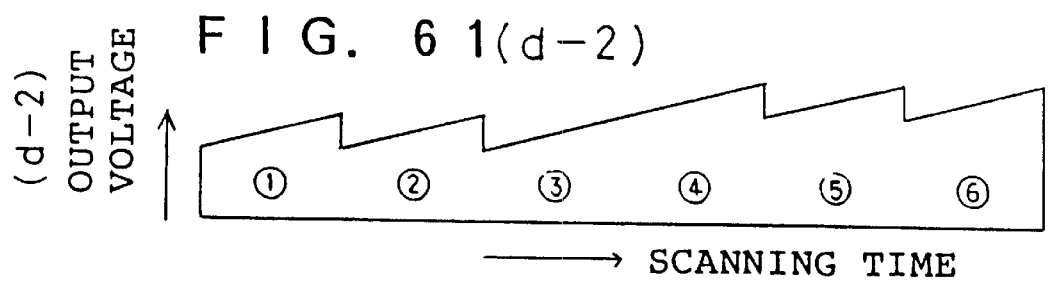
FIG. 61(d-2)
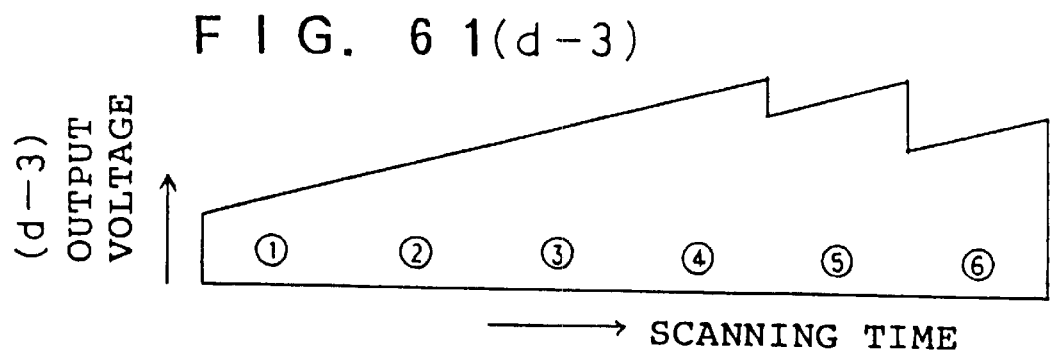
FIG. 61(d-3)

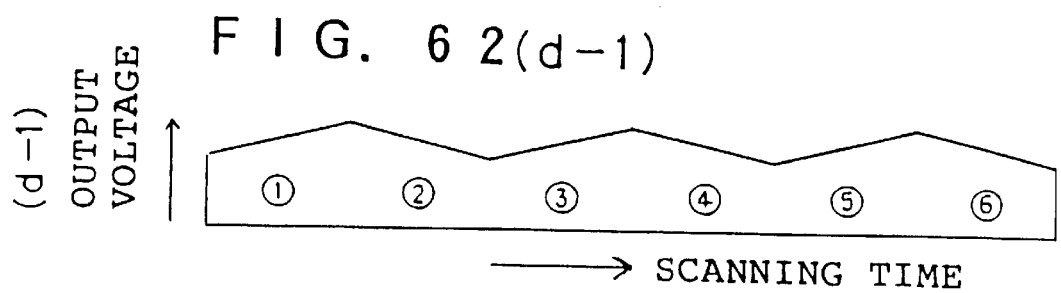
FIG. 62(d-1)
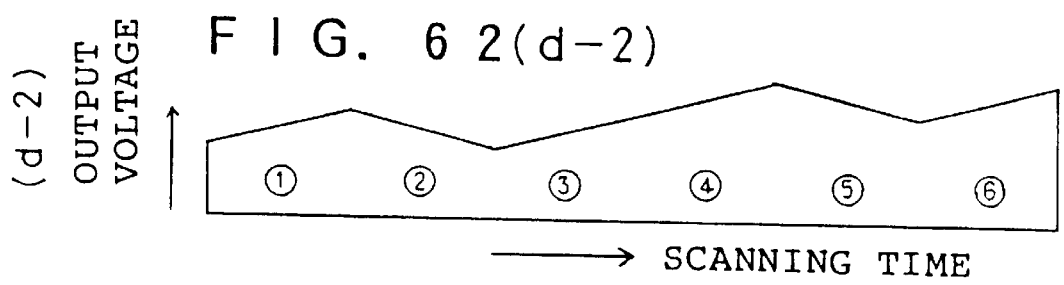
FIG. 62(d-2)
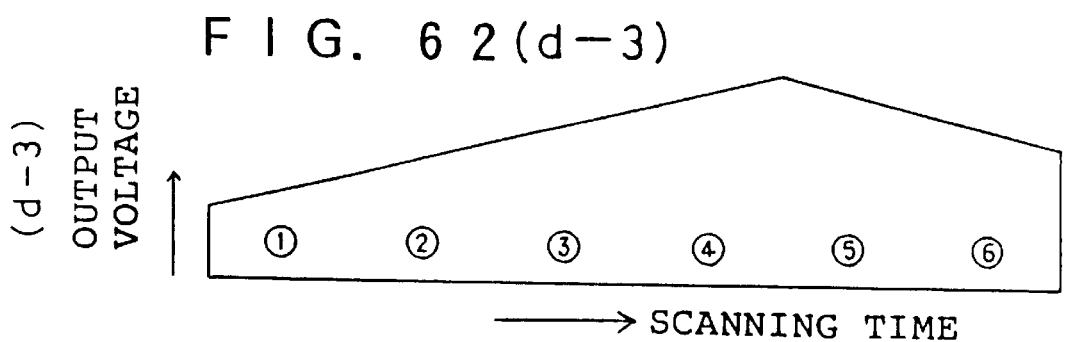
FIG. 62(d-3)

FIG. 72A
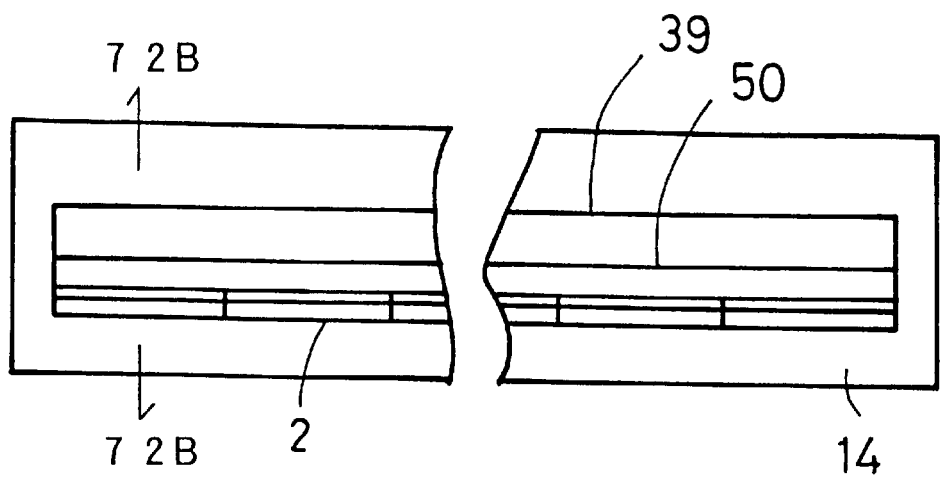
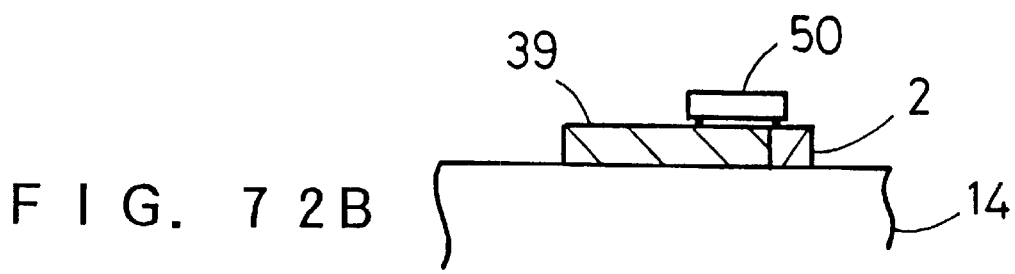
FIG. 72B
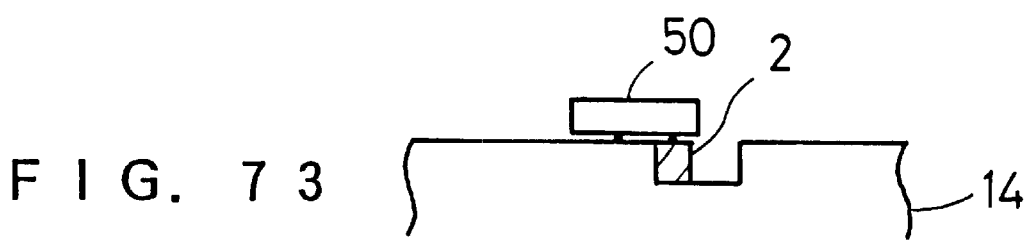
FIG. 73
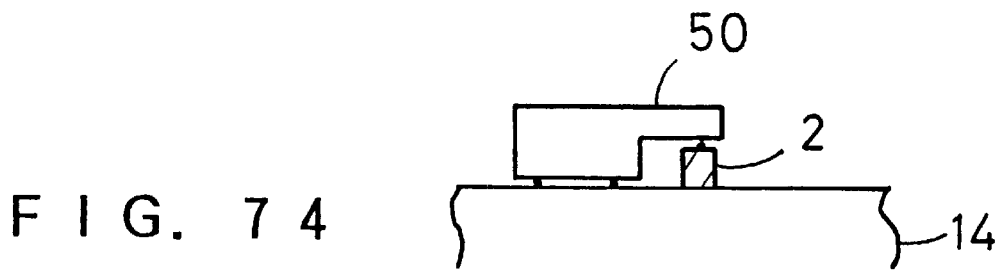
FIG. 74

LINEAR IMAGE SENSOR DEVICE, IC ASSEMBLING SUBSTRATE AND METHOD FOR ASSEMBLING THE SAME

BACKGROUND OF THE INVENTION

The present invention relates to a linear image sensor IC for receiving light reflected from an irradiated original to convert it into electrical signals or an IC for thermal transfer printing. The IC may be applied to an image reader of a facsimile and the like. The present invention also relates to an IC assembling substrate on which the linear image sensor IC or the IC for thermal transfer printing is mounted and to a method for assembling the same.

DESCRIPTION OF THE RELATED ART

FIG. 2 is a block diagram of a contact type linear image sensor IC 2 used in a reader of a conventional facsimile. As shown in FIG. 2, a phototransistor array 21 in which a plurality of phototransistors are arrayed linearly so that the size of the array corresponds with an original in a relationship of one-to-one in the scanning direction, a switch transistor array 22 and a scanning circuit array 3 composed of a plurality of shift registers for sequentially switching each of the switch transistors are placed in strips in parallel from each other in the scanning direction. Driving circuits 4 for driving the scanning circuits are placed among pads 5 which are terminals for taking out electricity externally.

The contact type phototransistor linear image sensor described above is disclosed in Japanese Patent Laid-Open No. 61-124171.

There is also a contact type image sensor head as an IC assembling substrate in which such ICs are mounted linearly. FIG. 38c is a perspective view showing such image sensor head. A plurality of image sensor ICs 2 are provided linearly on the surface of an assembling substrate 6. Signals are supplied to the image sensor ICs by electrically connecting them with wires on the substrate by means of wire bonds 23. The image sensor head is assembled by the following method.

As shown in FIG. 38a, the image sensor ICs 2 are formed in a matrix on the surface of a silicon wafer 11. After that, electrical characteristics of the ICs are measured by using a tester and defective chips are marked with fail marks 12. Then, the silicon wafer 11 is cut along scribe lines to separate each of the ICs. Next, only good chips are selected and are placed on a tray 13 as shown in FIG. 38b. Then, they are placed sequentially on the surface of the assembling substrate 6 from the tray 13 and are wire-bonded as shown in FIG. 38c, thus completing the head.

FIG. 40 is a plan view of the IC to be mounted on the IC assembling substrate. Formed on the IC 2 are four or more pads 5 which are power supply, signal supply and output terminals. Further, a plurality of light receiving elements 32 each having the identical shape and composed of a phototransistor or a photodiode are placed periodically along the longitudinal direction of the chip. The light receiving elements 32 are provided linearly along the scanning direction with the period of reading pitch. Charge accumulated in the light receiving elements is output from the output terminal sequentially from the leftmost light receiving element. As it is apparent from FIG. 40, the array of the light receiving elements 32 and that of the pads 5 are placed separately.

FIG. 70a is a plan view of a multi-chip type image sensor in an image reader of a facsimile and FIG. 70b is a section view thereof. A plurality of image sensor ICs 2 having about 8 mm of length are placed in a line side by side on the surface of a substrate 14 on which wires are printed. To read an original of A4 size paper by the contact type image sensor, it is necessary to place the plurality of ICs 2 by a length equal to a width of the paper. The substrate 14 is electrically connected with each of the image sensor ICs 2 by a bonding lead wire 23 as shown in FIG. 70b. The image sensor IC 2 is so thin as to have only about 0.6 mm of width. Photosensors are formed on the image sensor IC 2 along the longitudinal direction thereof with a reading period.

A thermal head of an output section of the facsimile is also constructed in the same manner. In the case of the thermal head, thermal head driver ICs are placed in a line in the same manner with the image sensor IC 2. While each of the IC are placed having almost no gap therebetween in the case of the image sensor, each of the ICs are placed in a line at certain intervals in the case of the thermal head. Thermal resistors are provided on the surface of the substrate 14 and current is flown to each resistor via wires and a bonding lead line on the substrate 14. The resistors are provided linearly with a density of about 64 pieces/8 mm and a thermosensible paper is printed and output by changing color thereof by Joule heat. Accordingly, 64 driver transistors are provided in each driver IC along the longitudinal direction of the IC. Each driver transistor is provided with an output pad electrically connected. Accordingly, 64 output pads are placed in a line and bonding-connected along the longitudinal direction of the IC of about 8 mm in length at intervals of about 10 $\mu$m.

However, it has been difficult to lower the cost of such linear image sensor because the chip size cannot be reduced simply like a normal memory IC. That is, the length of the chips in the scanning direction cannot be reduced because the length has to be equal to a width of an original. Further, the width of the chip in the direction vertical to the scanning direction could be reduced only around to 0.7 mm because the sensors, switches, scanning circuits and driving circuits are all placed in parallel.

It has been also difficult to lower the cost of such IC assembling substrate because the length of the ICs cannot be shortened in principle. There arises another problem if the width of the IC is thinned that good chips are marked with a fail mark because a size of the fail mark is large and the positioning accuracy is low. Still more, because the ICs are flat in general, they could not be assembled on a cylindrical assembling substrate.

Further, those chips could not be measured by two chips each in the same time. If it could, it would contribute in lowering the IC assembling cost in testing electrical characteristics of the ICs in manufacturing such IC assembling substrate. That is, if the ICs adjoining in the direction vertical to the direction in which IC pixels are arrayed are tested by probing by two chips each in the same time, light receiving elements of either one of those two chips are shaded by a probing needle and homogeneous light cannot be irradiated to the light receiving element array because all the ICs are placed in the same orientation. Accordingly, because the quality of the chips cannot be accurately determined, it has been difficult to test two chips in the same time.

The image sensor IC has had another problem that sensitivity of the light receiving elements fluctuates within the silicon wafer. It is considered to be caused by an uneven heat distribution within the wafer surface in the IC manufacturing process or by an uneven thickness of various insulating films and the sensitivity tends to change continuously within the wafer. Accordingly, a difference of the sensitivity of the light receiving elements may become small if they are close from each other on the wafer and may become large if they are distant from each other. For instance, if the light receiving elements on the right hand side in FIG. 40 have higher sensitivity and when ICs are mounted sequentially on the assembling substrate 6 so as to adjoin each other in the direction vertical to the direction in which the light receiving elements of the IC 2 are placed in a line, an output of the assembling substrate 6 when uniform light is irradiated thereon turns out as shown in FIG. 44. FIG. 44 shows an output waveform of the prior art image sensor head having six IC chips. As shown in the figure, the inclination of the output is always right-up because the orientation of the adjoining IC chips has been the same on the wafer. Accordingly, there is a difference of level of the outputs at the chip connecting portion. That is, because the sensitivity abruptly changes, the output needs to be corrected per each bit. As a result, it has caused a problem that the cost of a product, e.g. a facsimile, applying such image sensor cannot be lowered.

As described above, there has been the problem if the width of the IC is thinned that good chip may be marked with the fail mark because the size of the mark is large and the positioning accuracy is low.

Further, if the width of the IC is thinned further considerably, the prior art multi-chip type electronic device such as the image sensor and the thermal head would have the following problems in assembling the ICs:

(1) a supporting strength is lowered;
(2) it becomes difficult to handle; and
(3) it becomes difficult to electrically connect with the substrate.

That is, because it is difficult to thin the width of the IC further considerably from the reasons (1), (2) and (3) above, it has been difficult to lower the cost of the ICs and hence that of the multi-chip type electronic device.

Accordingly, it is an object of the present invention to solve the aforementioned problems by providing an image sensor IC which can be assembled at low cost and can be formed into a very thin chip.

It is another object of the present invention to supply an IC assembling substrate which can be manufactured at low cost and which can realize even a non-flat substrate.

It is still aother object of the present invention to supply an IC assembling substrate having less difference of level of outputs at the chip connecting portion.

It is a further object of the present invention to provide a low cost electronic device on which ICs whose width is thinner than a thickness thereof or thinner than 0.35 mm can be mounted.

SUMMARY OF THE INVENTION

In order to solve the aforementioned problems, an image sensor IC, an IC assembling substrate and a method for assembling the same of the present invention are constructed in accordance to the following aspects:

(1) In a linear image sensor IC comprising a plurality of switching circuits each connected to a plurality of light receiving elements in series; scanning circuits for sequentially switching the switching circuits; and driving circuits for operating the scanning circuits, a LOCOS isolation layer is formed between an edge in the main scanning direction of the linear image sensor IC which is closest to an array of the light receiving elements and a light receiving portion of the light receiving element.

(2) In the linear image sensor IC of (1), a distance L between the edge of the linear image sensor IC and the light receiving portion of the light receiving element is 40 $\mu$m or less.

(3) In a linear image sensor IC comprising a plurality of switching circuits each connected to a plurality of light receiving elements in series; scanning circuits for sequentially switching the switching circuits; and driving circuits for operating the scanning circuits, no light blocking layer such as Al is formed between an edge in the main scanning direction of the linear image sensor IC which is closest to an array of the light receiving element and a light receiving portion of the light receiving element.

(4) In the linear image sensor IC of (3), a total of the distance L between the edge and the light receiving portion and a width of the light receiving portion in the sub-scanning direction is less than a distance between adjoining light receiving elements.

(5) In a linear image sensor IC comprising a plurality of switching circuits each connected to a plurality of light receiving elements in series; scanning circuits for sequentially switching the switching circuits; and driving circuits for operating the scanning circuits, at least part of the switching circuits is placed between the adjoining light receiving elements.

(6) In a linear image sensor IC comprising a plurality of switching circuits each connected to a plurality of light receiving elements in series; scanning circuits for sequentially switching the switching circuits; and driving circuits for operating the scanning circuits, a light receiving area of the light receiving element is formed to be flat and thin and long in the main scanning direction.

(7) In a linear image sensor IC comprising a plurality of switching circuits each connected to a plurality of phototransistors in series; scanning circuits for sequentially switching the switching circuits; and driving circuits for operating the scanning circuits, a collector electrode is placed between base regions of the adjoining phototransistors.

(8) In a linear image sensor IC in which an image sensor circuit comprising a plurality of switching circuits each connected to a plurality of light receiving elements in series; scanning circuits for sequentially switching the switching circuits; and driving circuits for operating the scanning circuits is formed on the surface of the chip, a relationship among a thickness Z, length X in the scanning direction and a width Y of the linear image sensor IC is $Y \leq Z < X$.

(9) In the linear image sensor IC of (8), $Y \leq 350$ $\mu$m.

(10) In a linear image sensor IC comprising a plurality of switching circuits each connected to a plurality of light receiving elements in series; scanning circuits for sequentially switching the switching circuits; and driving circuits for operating the scanning circuits, at least part of the scanning circuits is placed between adjoining light receiving elements.

(11) In the linear image sensor IC of (10), a light receiving area of the light receiving element is formed to be flat and thin and long in the scanning direction.

(12) In the linear image sensor IC of (10), the light receiving element is a phototransistor and a collector electrode is placed between base regions of the adjoining phototransistors.

(13) In the linear image sensor IC of (10), a relationship among a thickness Z, length X in the scanning direction and a width Y of the image sensor IC is $Y \leq Z < X$.

(14) In the linear image sensor IC of (13), $Y \leq 350$ $\mu$m.

(15) In a linear image sensor IC comprising a plurality of switching circuits each connected to a plurality of light receiving elements in series; scanning circuits for sequentially switching the switching circuits; and driving circuits for operating the scanning circuits, at least part of the switching circuits and the scanning circuits is placed between adjoining light receiving elements.

(16) In the linear image sensor IC of (15), a light receiving area of the light receiving element is formed to be flat and thin and long in the scanning direction.

(17) In the linear image sensor IC of (15), the light receiving element is a phototransistor and a collector electrode is placed between base regions of the adjoining phototransistors.

(18) In the linear image sensor IC of (15), a relationship among a thickness Z, length X in the scanning direction and a width Y of the image sensor IC is $Y \leq Z < X$.

(19) In the linear image sensor IC of (18), $Y \leq 350$ μm.

(20) In a linear image sensor IC comprising a plurality of switching circuits each connected to a plurality of light receiving elements in series; scanning circuits for sequentially switching the switching circuits; and driving circuits for operating the scanning circuits, the light receiving element is inverse-L-shaped and is placed next the switching circuit and the scanning circuit.

(21) In the linear image sensor IC of (20), a relationship among a thickness Z, length X in the scanning direction and a width Y of the image sensor IC is $Y \leq Z < X$.

(22) In the linear image sensor IC of (21), $Y \leq 350$ μm.

(23) In a linear image sensor IC comprising a plurality of switching circuits each connected to a plurality of light receiving elements in series; scanning circuits for sequentially switching the switching circuits; and driving circuits for operating the scanning circuits, the light receiving element is U-shaped and is placed next the switching circuit and the scanning circuit.

(24) In the linear image sensor IC of (23), a relationship among a thickness Z, length X in the scanning direction and a width Y of the image sensor IC is $Y \leq Z < X$.

(25) In the linear image sensor IC of (24), $Y \leq 350$ μm.

(26) In a linear image sensor IC in which an image sensor circuit comprising a plurality of switching circuits each connected to a plurality of light receiving elements in series; scanning circuits for sequentially switching the switching circuits; and driving circuits for operating the scanning circuits is formed on the surface of the chip, a length Xp of the pad electrode of the linear image sensor IC in the main scanning direction and a length Yp thereof in the sub-scanning direction is $Yp \leq 80$ μm and $Xp > Yp$.

(27) In a linear image sensor IC in which an image sensor circuit comprising a plurality of switching circuits each connected to a plurality of light receiving elements in series; scanning circuits for sequentially switching the switching circuits; and driving circuits for operating the scanning circuits is formed on the surface of the chip, tips of probes to be contacted with pad electrodes for testing are advanced almost in parallel with the main scanning direction of the linear image sensor IC and a length of damaged trace on the pad electrode in the main scanning direction caused by the tip of the probe is longer than a length of the damaged trace in the sub-scanning direction.

(28) In a linear image sensor comprising a plurality of photoelectric converter elements, for reading image data, placed in a line on a semiconductor substrate; a plurality of switching elements whose input terminals are connected with the photoelectric converter elements to read signals obtained by the photoelectric converter elements to the outside; and a scanning circuit for driving control terminals of the switching elements, output terminals of the switching elements are connected to common lines, the common lines are connected to input terminals of reset gates and output terminals of the reset gates are connected to a terminal of a reset power supply.

(29) In a linear image sensor comprising a plurality of photoelectric converter elements, for reading image data, placed in a line on a semiconductor substrate; a plurality of switching elements whose input terminals are connected with the photoelectric converter elements to read signals obtained by the photoelectric converter elements to the outside; and a scanning circuit for driving control terminals of the switching elements, output terminals of the switching elements are connected to input terminals of reset gates, output terminals of the reset gates are connected to a terminal of a reset power supply, the scanning circuit are driven by clock pulse having a period of 1/f CK second to synchronize with the control of the switching elements and to control the reset gates to read the signals from the photoelectric converter elements as well as to fix the output terminals of the photoelectric converter elements to a reset potential for 1/f CK second or more.

(30) In a linear image sensor comprising a plurality of photoelectric converter elements, for reading image data, placed in a line on a semiconductor substrate; a plurality of switching elements whose input terminals are connected with the photoelectric converter elements to read signals obtained by the photoelectric converter elements to the outside; and a scanning circuit for driving control terminals of the switching elements, the scanning circuit is driven by clock pulse having a period of 1/f CK second to synchronize with the control of the switching elements and to control the reset gates to read the signals from the photoelectric converter elements, and the switching element is energized for a period longer than the reading period.

(31) In a linear image sensor comprising a plurality of photoelectric converter elements, for reading image data, placed in a line on a semiconductor substrate; a plurality of switching elements whose input terminals are connected with the photoelectric converter elements to read signals obtained by the photoelectric converter elements to the outside; and a scanning circuit for driving control terminals of the switching elements, output terminals of the switching elements are connected to a plurality of common lines, each of the common lines is connected to input terminals of reset gates, output terminals of the reset gates are connected to a terminal of a reset power supply, and a potential of the common lines other than the common line being conductive with the output terminal of the photoelectric converter element is fixed while reading data as the switching element is turned from the de-energized state to the energized state.

(32) In an IC assembling substrate in which a plurality of ICs are arrayed linearly on the surface thereof, the IC is formed thinly by arraying a plurality of light receiving elements or transistors linearly so as to have 0.4 mm or less of width.

(33) In an IC assembling substrate in which a plurality of ICs are arrayed linearly on the surface thereof, the IC is formed thinly by arraying a plurality of light receiving elements or transistors linearly so as to have a width thinner than a thickness thereof.

(34) A method for assembling an IC assembling substrate comprises steps of forming a plurality of ICs repeatedly in a matrix on a surface of a silicon wafer; cutting the silicon wafer; and placing the ICs linearly on the assembling substrate.

(35) A method for assembling an IC assembling substrate comprises steps of forming a plurality of ICs repeatedly in a matrix on a surface of a silicon wafer; adhering a tape on the back of the silicon wafer; cutting the silicon wafer; and placing the ICs linearly on the assembling substrate.

(36) In the method for assembling the IC assembling substrate of (35), an adhesive strength of the tape with the silicon wafer is controlled by irradiating ultraviolet ray.

(37) A method for assembling an IC assembling substrate comprises steps of forming a plurality of ICs repeatedly in a matrix on a surface of a silicon wafer; implementing a probe test by measuring electrical characteristics of the ICs and storing data of the electrical characteristics to an electrically readable storage means in correspondence with the matrix coordinate; cutting the silicon wafer; and placing the ICs sequentially selected corresponding to the data in the storage means on the assembling substrate linearly.

(38) A method for assembling an IC assembling substrate comprises steps of forming a plurality of ICs repeatedly in a matrix on a surface of a silicon wafer; implementing a probe test by measuring electrical characteristics of the ICs; and cutting the silicon wafer to separate the ICs spatially; and the ICs adjoining in the direction vertical to the direction in which light receiving elements of the ICs are arrayed are formed so as to have a relationship of point symmetry each other when the ICs are formed on the surface of the silicon wafer.

(39) In the method for assembling an IC assembling substrate of (38), the ICs adjoining in the direction vertical to the direction in which light receiving elements of the ICs are arrayed are probed and tested in the same time by two chips each.

(40) In a method for assembling an IC assembling substrate comprising the step of mounting the ICs manufactured by the method of (38) linearly on the assembling substrate, the ICs adjoining on the surface of the silicon wafer in the direction vertical to the direction in which pixels of the ICs are arrayed are mounted so as to adjoin each other.

(41) In a silicon wafer on which a plurality of linear image sensor ICs are repeatedly formed in a matrix, the ICs adjoining in the direction vertical to the direction in which light receiving elements of the ICs are arrayed are formed so as to have a relationship of point symmetry each other.

(42) In a linear image sensor of multi-chip type in which a plurality of chips of linear image sensor IC comprising a plurality of linearly arrayed light receiving elements are mounted on a assembling substrate almost at equal intervals in the array direction of the light receiving elements, the linear image sensor IC has a dual-directional scanning function.

(43) In a linear image sensor of multi-chip type in which a plurality of chips of linear image sensor IC comprising a plurality of linearly arrayed light receiving elements are mounted on a assembling substrate almost at equal intervals in the array direction of the light receiving elements, the linear image sensor IC has a dual-direction scanning function and at least one chip of the linear image sensor IC among a pair of the linear image sensor ICs adjoining each other is mounted by turning by 180 degrees with respect to the other linear image sensor IC of the pair on the plane of the assembling substrate.

(44) In a method for manufacturing the linear image sensor described in (42) by cutting out the linear image sensor ICs described in (42) from a silicon wafer in which a plurality of the ICs are formed in a matrix, at least one or more pair of the linear image sensor ICs adjoining in the direction vertical to the direction in which light receiving elements are arrayed or in the vicinity in the vertical direction are cut out and are mounted sequentially so as to adjoin each other and one chip of the linear image sensor IC among the pair of the linear image sensor ICs is mounted by turning by 180 degrees with respect to the other linear image sensor IC of the pair on the plane of the assembling substrate.

(45) In a method for manufacturing the linear image sensor described in (43) by cutting out the linear image sensor ICs described in (42) from a silicon wafer in which a plurality of the ICs are formed in a matrix, the linear image sensor IC which is turned by 180 degrees is the linear image sensor IC adjoining in the direction vertical to the direction in which light receiving elements are arrayed or in the vicinity in the vertical direction cut out from the silicon wafer.

(46) In the linear image sensor of (43), input/output terminals including a power supply of the linear image sensor IC are placed along the array of the light receiving elements so as to sandwich such light receiving elements.

(47) In the method for manufacturing a linear image sensor of (42) by cutting out the linear image sensor ICs described in (42) from a silicon wafer in which a plurality of the ICs are formed in a matrix, at least one or more pair of the linear image sensor ICs adjoining in the direction vertical to the direction in which light receiving elements are arrayed or in the vicinity in the vertical direction are cut out and are mounted sequentially so as to adjoin each other and one chip of the linear image sensor IC among the pair of the linear image sensor ICs is mounted by turning by 180 degrees with respect to the other linear image sensor IC of the pair on the plane of the assembling substrate and the scanning direction thereof within the linear image sensor IC is reversed.

(48) In the linear image sensor of (43) in the method for manufacturing the multi-chip type linear image sensor described in claim 43 by cutting out the linear image sensor ICs described in (42) from a silicon wafer in which a plurality of the ICs are formed in a matrix, the linear image sensor IC which is turned by 180 degrees is the linear image sensor IC adjoining in the direction vertical to the direction in which light receiving elements are arrayed or in the vicinity in the vertical direction cut out from the silicon wafer and whose scanning direction within the linear image sensor IC is opposite.

(49) In a color linear image sensor unit comprising a multi-chip type linear image sensor which is reading means in which a plurality of chips of linear image sensor IC in which a plurality of light receiving elements are arrayed linearly are mounted on a assembling substrate almost at equal intervals in the array direction of the light receiving elements; and color separation means including a light source and lenses, the linear image sensor IC has a dual-direction scanning function.

(50) In a color linear image sensor unit comprising a multi-chip type linear image sensor which is reading means in which a plurality of chips of linear image sensor IC in which a plurality of light receiving elements are arrayed linearly are mounted on an assembling substrate almost at equal intervals in the array direction of the light receiving elements; and color separation means including a light source and lenses, the linear image sensor IC has a dual-direction scanning function and at least one chip of the linear image sensor IC among a pair of the linear image sensor ICs adjoining each other is mounted by turning by 180 degrees with respect to the other linear image sensor IC of the pair on the plane of the assembling substrate.

(51) In a method for manufacturing the linear image sensor described in (49) by cutting out the linear image sensor ICs described in (49) from a silicon wafer in which a plurality of the ICs are formed in a matrix, at least one or more pair of the linear image sensor ICs adjoining in the direction vertical to the direction in which light receiving elements are arrayed or in the vicinity in the vertical direction are cut out and are mounted sequentially so as to adjoin each other and one chip of the linear image sensor IC among the pair of the linear image sensor ICs is mounted by turning by 180 degrees with respect to the other linear image sensor IC of the pair on the plane of the assembling substrate.

(52) In a method for manufacturing the color linear image sensor unit described in (50) by cutting out the linear image sensor ICs described in (49) from a silicon wafer in which a plurality of the ICs are formed in a matrix, the linear image sensor IC which is turned by 180 degrees is the linear image sensor IC adjoining in the direction vertical to the direction in which light receiving elements are arrayed or in the vicinity in the vertical direction cut out from the silicon wafer.

(53) In the color linear image sensor unit of (50), input/output terminals including a power supply of the linear image sensor IC are placed along the array of the light receiving elements so as to sandwich such light receiving elements.

(54) In a method for manufacturing the color linear image sensor unit described in (49) by cutting out the linear image sensor ICs described in (49) from a silicon wafer in which a plurality of the ICs are formed in a matrix, at least one or more pair of the linear image sensor ICs adjoining in the direction vertical to the direction in which light receiving elements are arrayed or in the vicinity in the vertical direction are cut out and are mounted sequentially so as to adjoin each other and one chip of the linear image sensor IC among the pair of the linear image sensor ICs is mounted by turning by 180 degrees with respect to the other linear image sensor IC of the pair on the plane of the assembling substrate and the scanning direction thereof within the linear image sensor IC is reversed.

(55) In a method for manufacturing the color linear image sensor unit described in (50) by cutting out the linear image sensor ICs described in (49) from a silicon wafer in which a plurality of the ICs are formed in a matrix, the linear image sensor IC which is turned by 180 degrees is the linear image sensor IC adjoining in the direction vertical to the direction in which light receiving elements are arrayed or in the vicinity in the vertical direction cut out from the silicon wafer and whose scanning direction within the linear image sensor IC is opposite.

(56) In a silicon wafer semi-product in which a plurality of ICs are repeatedly formed on the surface thereof, the IC comprises a plurality of light receiving elements or transistors linearly arrayed and at least one IC is marked with a fail mark of 100 to 200 $\mu$m in diameter on the surface thereof.

(57) A method for manufacturing a silicon wafer semi-product comprises steps of forming a plurality of ICs repeatedly on the surface of the silicon wafer; implementing a probe test by measuring electrical characteristics of the ICs; and marking a fail mark to a defective IC on the surface thereof; and the marking step is implemented by controlling the size of the fail mark to 100 to 200 $\mu$m in diameter in irradiating laser.

(58) In the method for manufacturing a silicon wafer semi-product of (57), the marking step comprises steps of emitting a laser beam from a YAG laser; transmitting the laser beam by a thin optical fiber whose diameter is smaller than 100 $\mu$m to the vicinity of the silicon wafer; and forming a thermal damage area by focusing the laser beam from the optical fiber on the surface of the IC by an optical lens.

(59) In an electronic device comprising a supporting base and ICs provided on a substrate in contact in the longitudinal direction, a width of the IC is thinner than a thickness thereof.

(60) In the electronic device of (59), the length of the IC is longer than the width thereof by 20 times or more.

(61) In the electronic device of (59), three or more ICs are mounted linearly along the longitudinal direction of the substrate.

(62) In an electronic device comprising a substrate in which a groove is provided linearly in the longitudinal direction and ICs mounted by contacting the side thereof with the groove, a width of the IC is thinner than a thickness thereof.

(63) In the electronic device of (62), the IC is mounted by having a larger contact area with the side of the groove as compared to that with the bottom of the groove.

(64) In the electronic device of (62), the width of the IC is thinner than 0.35 mm.

(65) In an electronic device in which a plurality of thin and long ICs are linearly mounted on a surface of a flat, thin and long substrate, electronic circuits are formed on the surface of the IC and an adhesive area of the side of the IC with the substrate is larger than that of the bottom of the IC with the substrate.

(66) In an electronic device comprising a substrate on which electrical wires are printed and ICs provided on the surface of the substrate, a width of the IC is thinner than a thickness thereof and the ICs are connected with the substrate through an electrical connecting board.

(67) In the electronic device of (66) further comprises a supporting base provided on the surface of the substrate in contact with the IC.

(68) In the electronic device of (57), the electrical connecting board is provided so as to bridge on the surface of the IC and the supporting base.

The above and other related objects and features of the invention will be apparent from a reading of the following description of the disclosure found in the accompanying drawings and the novelty thereof pointed out in the appended claims.

BRIEF DESCRIPTION OF THE DRAWINGS

FIG. 1 is a plan view of circuit blocks of an inventive image sensor IC;

FIG. 2 is a plan view of circuit blocks of a prior art image sensor IC;

FIG. 17 is a plan view of circuit blocks of the inventive image sensor IC;

FIG. 28 is a plan view illustrating when the inventive image sensor IC is inspected;

FIG. 29 is a section view illustrating when the inventive image sensor IC is inspected;

FIGS. 38a through 38c are drawings showing a prior art method for manufacturing an IC assembling substrate in order of process thereof, wherein FIG. 38a is a plan view of a silicon wafer, FIG. 38b is a plan view showing when chips are placed in a tray, and FIG. 38c is a perspective view of the IC assembling substrate when it is completed;

FIGS. 39a through 39c are drawings showing an inventive method for manufacturing an IC assembling substrate in order of process thereof, wherein FIG. 39a is a plan view of a silicon wafer, FIG. 39b is a plan view showing when it has been scribed, and FIG. 39c is an explanatory diagram showing how the ICs are mounted on a assembling substrate;

FIG. 42 is an enlarged view of part of the surface of the inventive silicon wafer;

FIG. 43 is an enlarged view of a center part of an inventive probe card;

FIG. 44 is an output waveform of a prior art image sensor head;

FIG. 45 is an output waveform of an inventive image sensor head;

FIGS. 46a through 46c are drawings showing an inventive method for manufacturing an IC assembling substrate in order of process thereof, wherein FIG. 46a is a plan view of a silicon wafer, FIG. 46b is a plan view showing when it has been scribed, and FIG. 46c is an explanatory diagram showing how the ICs are mounted on a assembling substrate;

FIG. 50 is a plan view showing a sequence for picking up the ICs from the silicon wafer;

FIGS. 51d-1 through 51d-3 are output waveforms of a prior art image sensor head;

FIGS. 52d-1 through 52d-3 are output waveforms of the inventive image sensor head;

FIG. 54b is a plan view of an image sensor head using the image sensor IC in FIG. 54a;

FIG. 55b is a section view at portion A of the linear image sensor in FIG. 55a;

FIGS. 56a through 56c are drawings showing an inventive method for manufacturing an IC assembling substrate in order of process thereof, wherein FIG. 56a is a plan view of a silicon wafer, FIG. 56b is a plan view showing when it has been scribed, and FIG. 56c is an explanatory diagram showing how the ICs are mounted on a assembling substrate;

FIG. 60 is a plan view showing a sequence for picking up the ICs from the silicon wafer;

FIGS. 61d-1 through 61d-3 are output waveforms of a prior art image sensor head;

FIGS. 62d-1 through 62d-3 are output waveforms of the inventive image sensor head;

FIG. 64b is a plan view of an image sensor head using the image sensor IC in FIG. 64a;

FIG. 65a is a perspective view of an inventive color linear image sensor unit and FIG. 65b is a section view at portion A of the color linear image sensor unit in FIG. 65a;

FIG. 66a is a perspective view of another inventive color linear image sensor unit and FIG. 66b is a section view at portion B of the color linear image sensor unit in FIG. 66a;

FIGS. 72a and 72b are a plan view and a section view, respectively, of the inventive electronic device;

FIG. 73 is a section view of the inventive electronic device; and

FIG. 74 is a section view of the inventive electronic device.

DETAILED DESCRIPTION OF THE PREFERRED EMBODIMENTS

A first embodiment of the present invention will be explained with reference to the drawings. FIG. 1 is a circuit block diagram of an inventive image sensor IC. The image sensor IC 2 comprises an array 20 composed of phototransistors and switch transistors, electrically connected with the phototransistors in series, which are placed alternately in a line with a period of reading pitch in the scanning direction, a scanning circuit array 3, for sequentially switching the switch transistors, placed next to the phototransistors in parallel with respect to the scanning direction, pads 5 which are terminals for taking out current externally and driving circuits 4 for driving the scanning circuits placed along the scanning circuit array 3.

Figure 3:
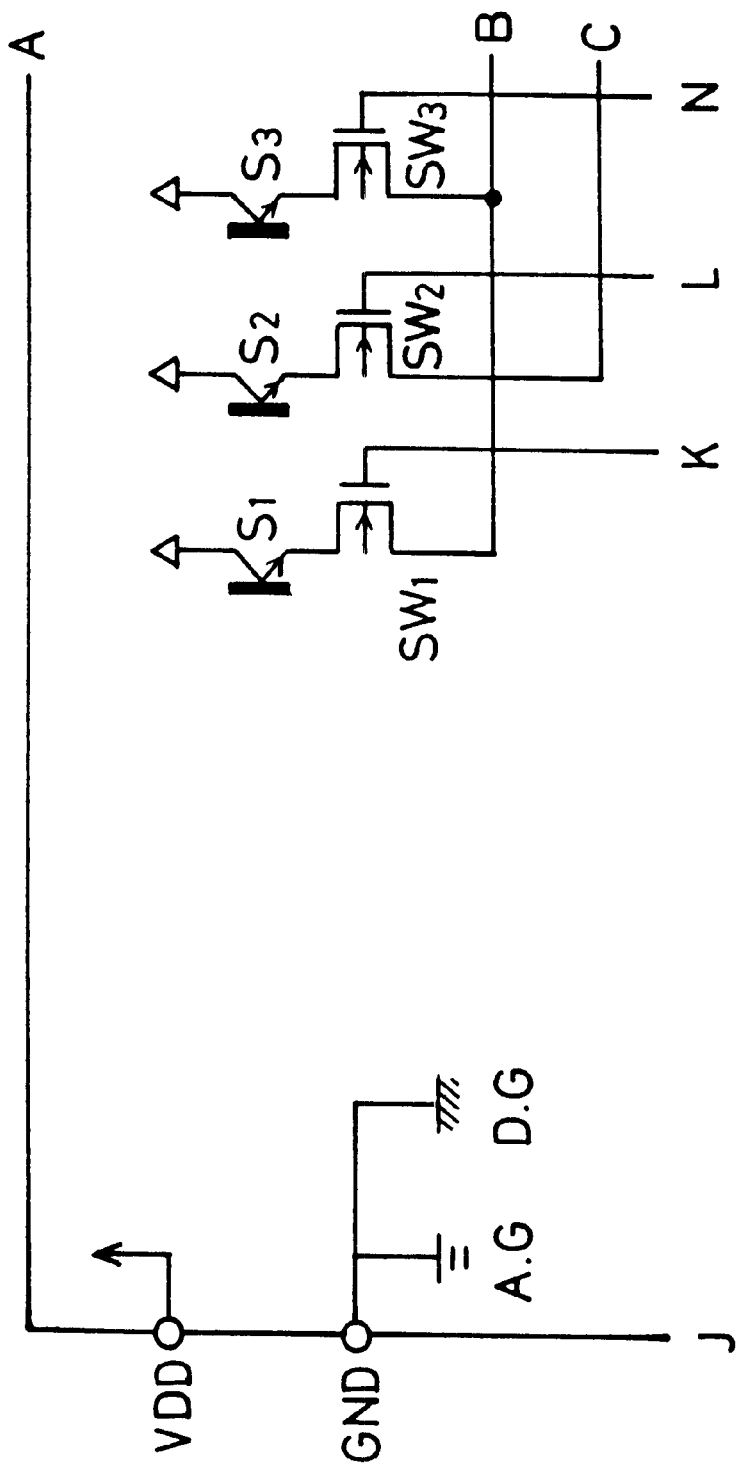
FIG. 3 is an electrical circuit diagram of the inventive image sensor IC.
Figure 4:
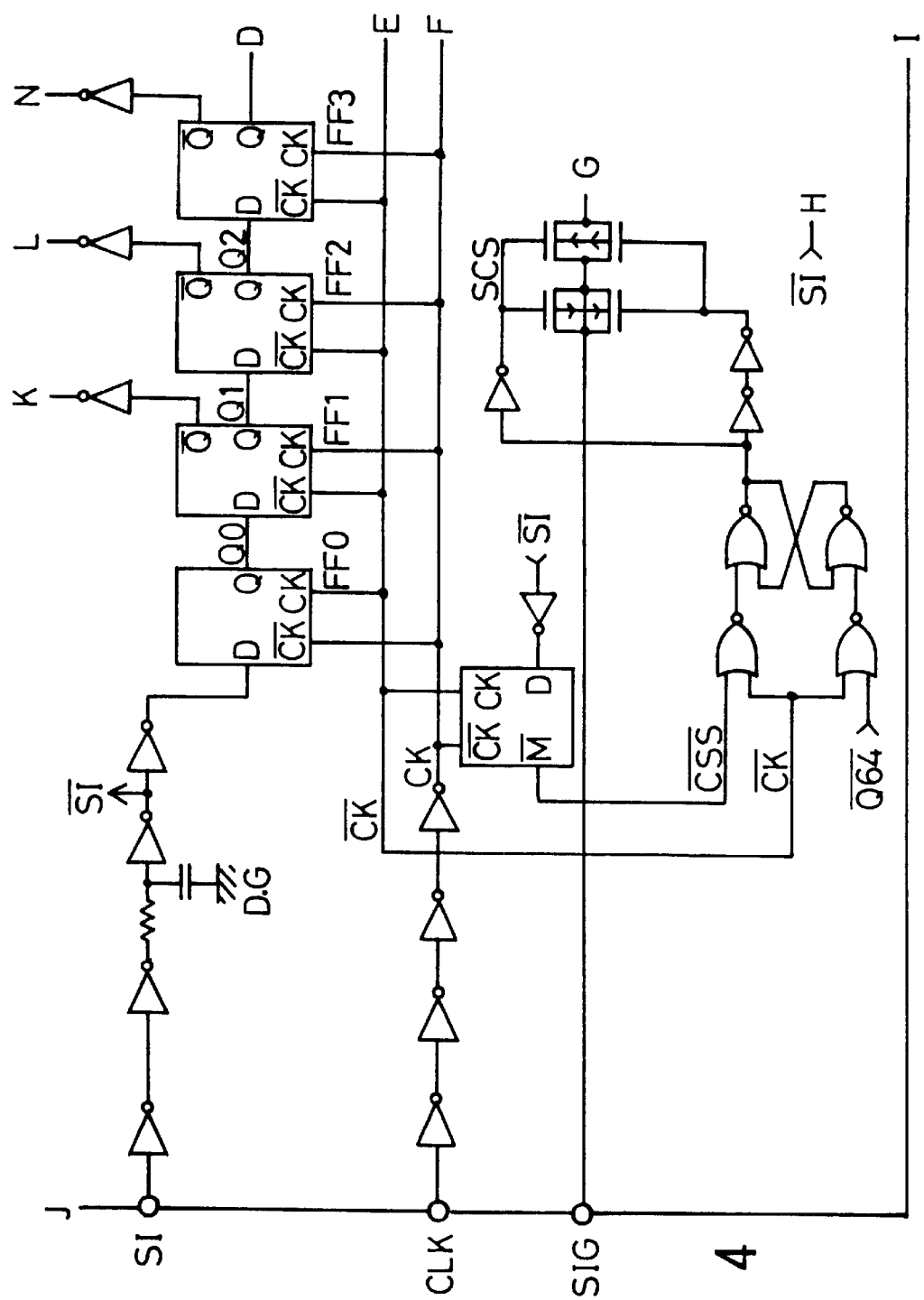
FIG. 4 is an electrical circuit diagram of the inventive image sensor IC.
Figure 5:
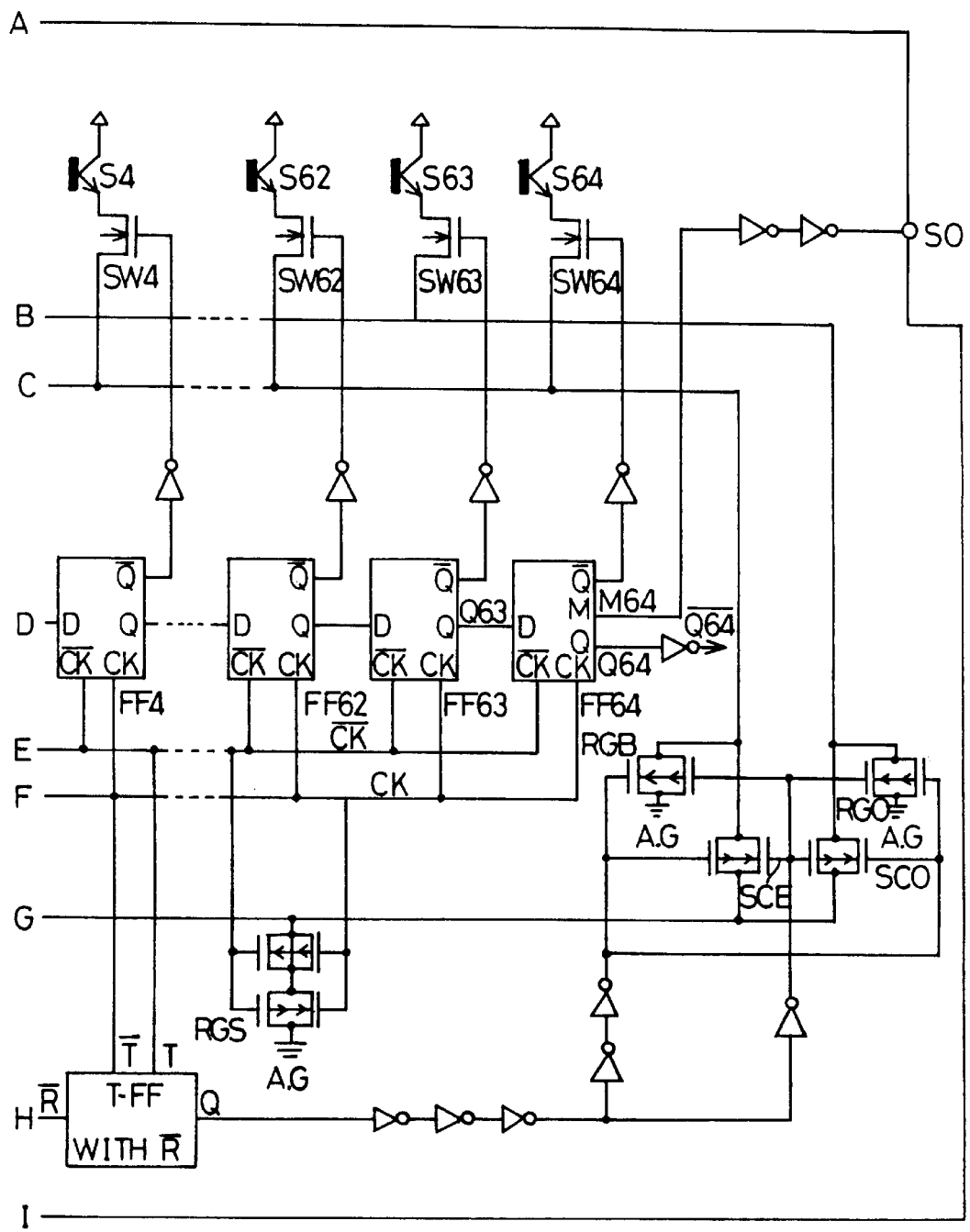
FIG. 5 is an electrical circuit diagram of the inventive image sensor IC.

FIGS. 3, 4 and 5 are electrical circuit diagrams showing the circuit block diagram of FIG. 1 in detail. Sensors S1 through S64 are constructed with bipolar transistors whose potential in the base region floats. A collector electrode thereof is connected with VDD. An emitter electrode is connected with a drain electrode of MOS transistors SW1 through SW64 which are the switching circuits. Source electrodes of the MOS transistors are connected to common lines with alternations of even number and odd number switches. Gate electrodes of the MOS transistors are controlled by signals from shift registers FF 0 through FF 64 which are the scanning circuits.

When the phototransistors, i.e., the sensors, are irradiated by light, charge induced by the light is charged in the base region. The switch circuit is turned OFF during the charge to receive data of the light. Then, the switch circuit is turned ON when reading the data to detect charge flowing out to the emitter region. Each MOS transistor is turned ON/OFF sequentially by the shift register. The scanning circuit composed of the shift register is controlled by the driving circuit. One block of the phototransistor, the switch transistor and the shift register is placed in a line in the scanning direction periodically at intervals of the reading pitch.

Figure 6:
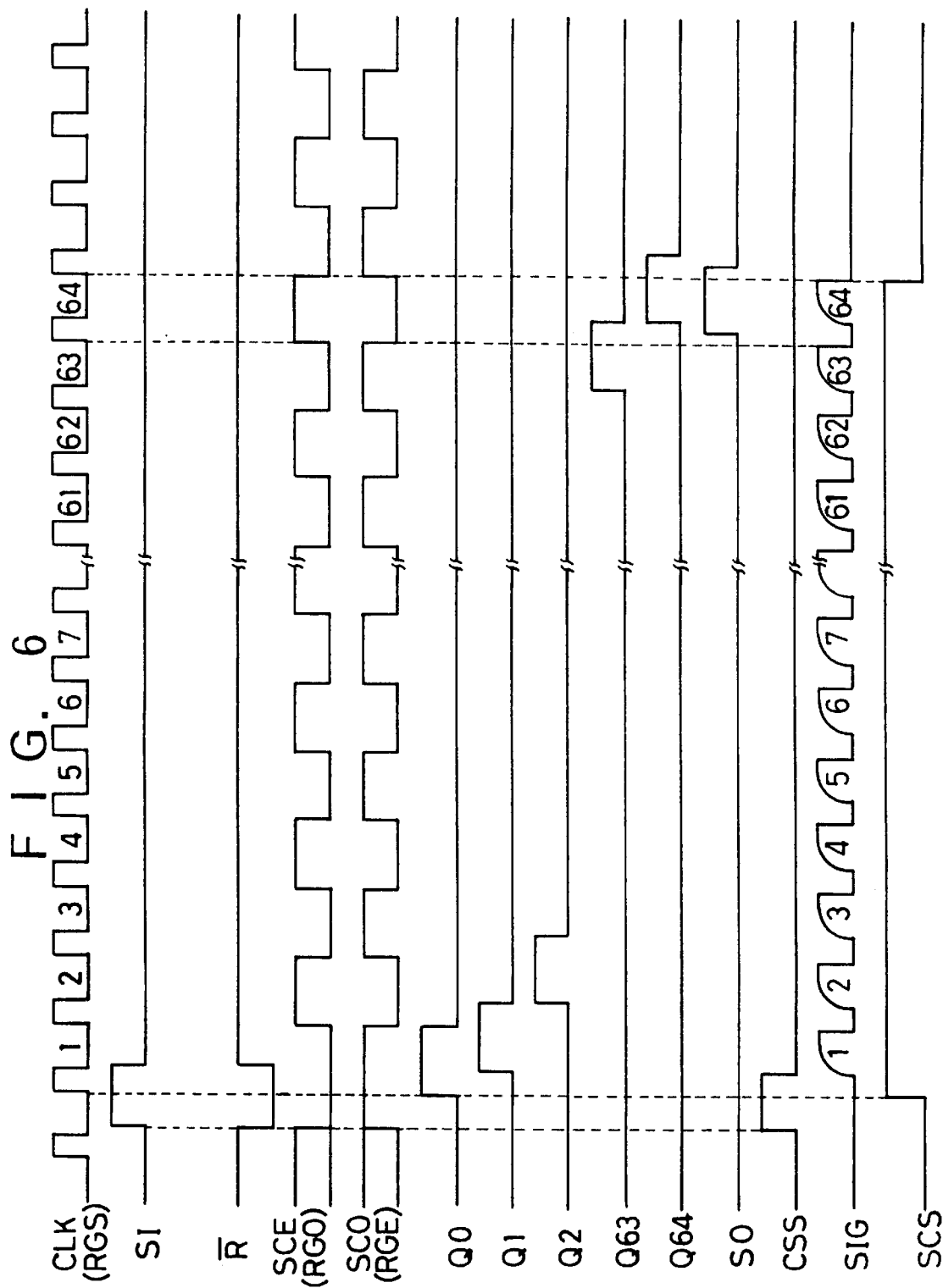
FIG. 6 is a timing chart of the inventive image sensor IC.

FIG. 6 is a timing chart of the inventive image sensor IC shown in FIGS. 3, 4 and 5. Outputs of SO and SIG can be obtained when SI and CLK pulses are input. SIG output can be obtained continuously when SO is input to SI of the next chip.

Figure 7:
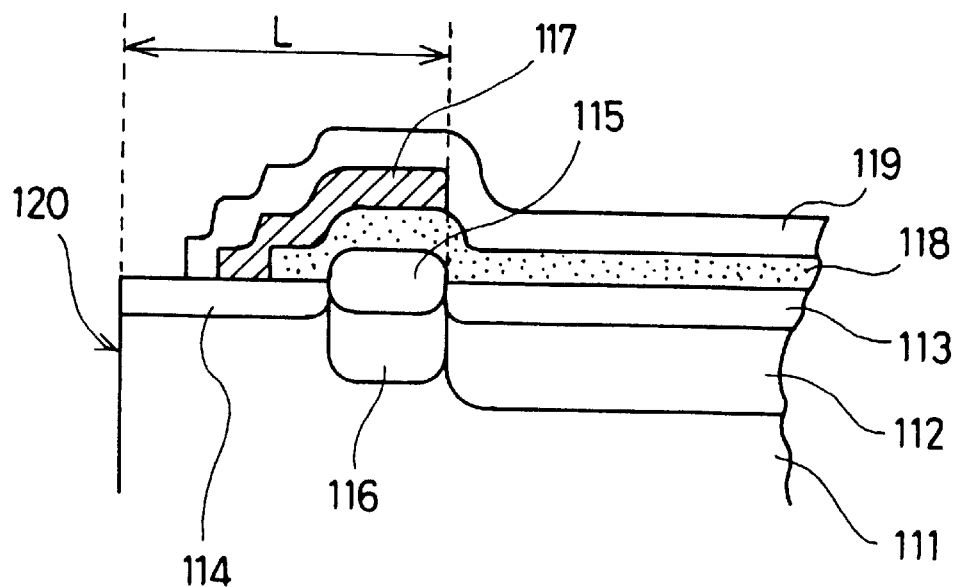
FIG. 7 is a section view of the inventive image sensor IC.

FIG. 7 is a section view of the inventive image sensor IC on the phototransistor side of line A–A' in FIG. 1. Formed on a N– silicon substrate 111 are a P– base diffusion layer 112, a P+ diffusion layer 113, a N+ diffusion layer 114, a LOCOS oxide film 115 and N± isolation layer 116. The N+ diffusion layer 114 is fixed to a power voltage through an Al 117 to stabilize a potential of the N– silicon substrate 111 which is the collector region of the phototransistor. Formed on the P+ diffusion layer 113 are an intermediate insulating layer 118 and a passivation film 119.

This configuration suppresses a diffusion of the P– base diffusion layer 112 by the N± diffusion layer under the LOCOS oxide film and reliably isolates it from the edge portion 120 of the IC chip. That is, even if the IC is cracked more or less from the edge portion 120 when it is cut, no leak will occur between the P– base diffusion layer 112 and the N– silicon substrate 111 which is the collector region. Further, because the Al 117 blocks light from entering between the P– base diffusion layer 112 which is the light receiving section and the edge portion 120, it prevents minority carrier from being generated in the N– silicon substrate 111 due to the input of light. If the minority carrier is transported to the P– base diffusion layer 112, it may worsen MTF in the sub-scanning direction. The N+ diffusion layer 114 is formed between the Al 117 and the edge portion 120 and serves to shorten a life of minority carrier generated by light entering to this portion.

Such configuration allows a distance L between the edge portion 120 and the P– base diffusion layer 112, i.e. the light receiving section, to be reduced to 40 μm or less. Thereby, the IC which is thinner with respect to the scanning direction as compared to the conventional one may be created.

Figure 8:
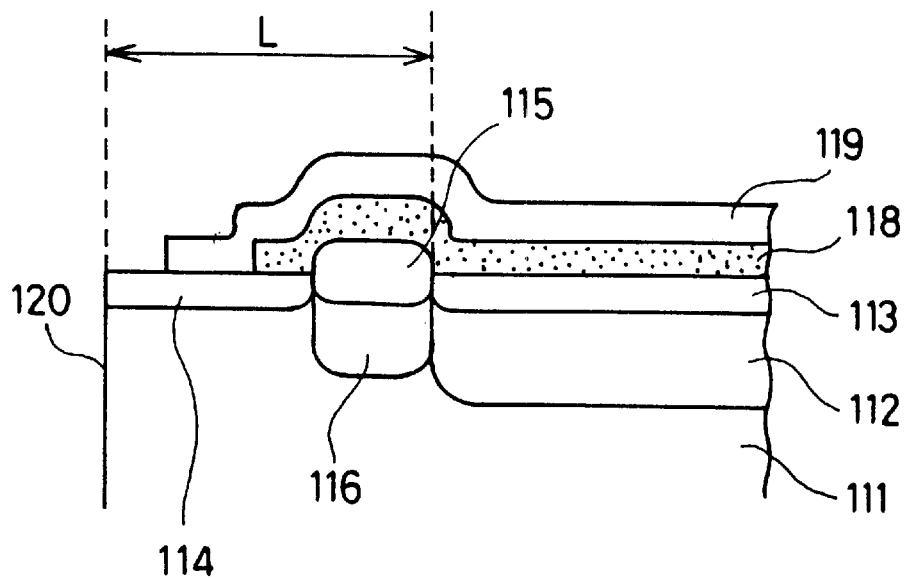
FIG. 8 is a section view of the inventive image sensor IC.

Another configuration will be shown with reference to FIG. 8 which is a section view of the inventive image sensor IC on the phototransistor side of the line A–A' in FIG. 1 and wherein the Al 117 is removed from the configuration shown in FIG. 7. In this configuration, light is input in a region between the edge portion 120 and the P– base diffusion layer 112 and minority carrier is generated in the N– silicon substrate 111. This minority carrier is transported to the closest P– base diffusion layer 112 and becomes a part of the output of the phototransistor. In this case, the MTF in the sub-scanning direction will not be worsened if it is constructed so that the total of a width of the P– base diffusion layer 112 in the sub-scanning direction and L is less than a pitch of pixels found from a required resolution.

This configuration allows the thinner IC to be created because the region between the edge portion 120 and the P-base diffusion layer 112 is used as part of the light receiving section.

Figure 9:
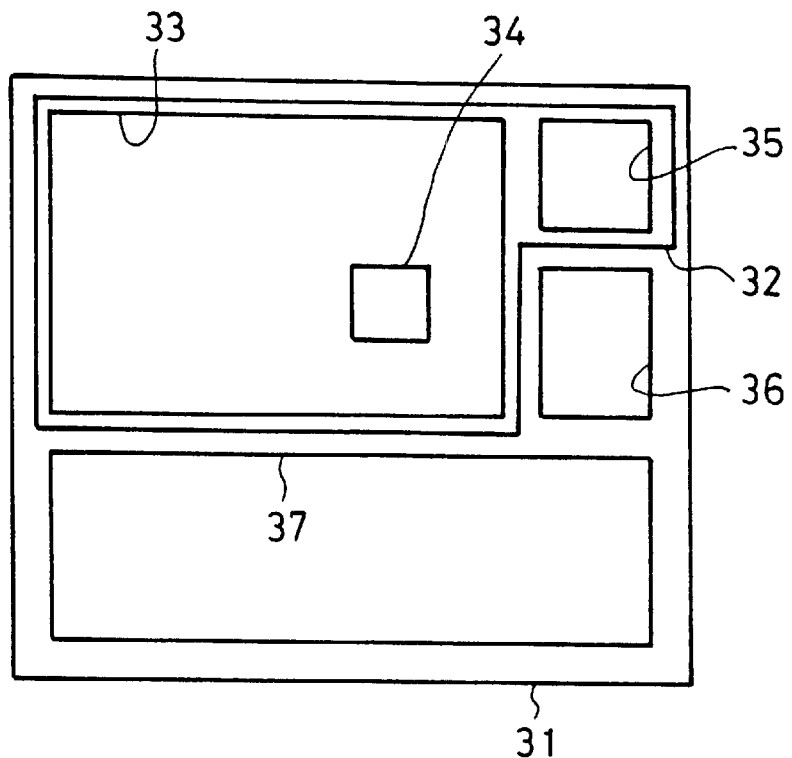
FIG. 9 is a plan view of one reading periodic circuit block of the inventive image sensor IC.

FIG. 9 is a plan view of one reading circuit block of the inventive image sensor IC. One of reading circuit blocks 31 which are placed periodically comprises a phototransistor 38, a switch transistor 36 and a shift register 37. An emitter region 34 is placed within a base region 33 which is a photoelectric conversion region. A collector region 32 is placed around the base region 33. A collector electrode 35 is provided next the base region 33 with respect to the scanning direction. The switch transistor 36 is provided next the base region 33 in the same manner with respect to the scanning direction. The collector electrode 35 and the switch transistor 36 are placed next to each other on the same scanning direction side with respect to the base region 33. The switch transistor 36 is placed within the width of the phototransistor 38. Accordingly, a width of reading block (length in the direction vertical to the scanning direction) may be narrowed by the width of the switch transistor as compared to conventional one. Further, the base region 33 is created to be thin in the scanning direction as shown in FIG. 9. The shift register 37 is placed directly next the phototransistor 38. By constructing the image sensor IC as shown in FIG. 9, the width thereof may be reduced to 0.2 to 0.35 mm.

Figure 10:
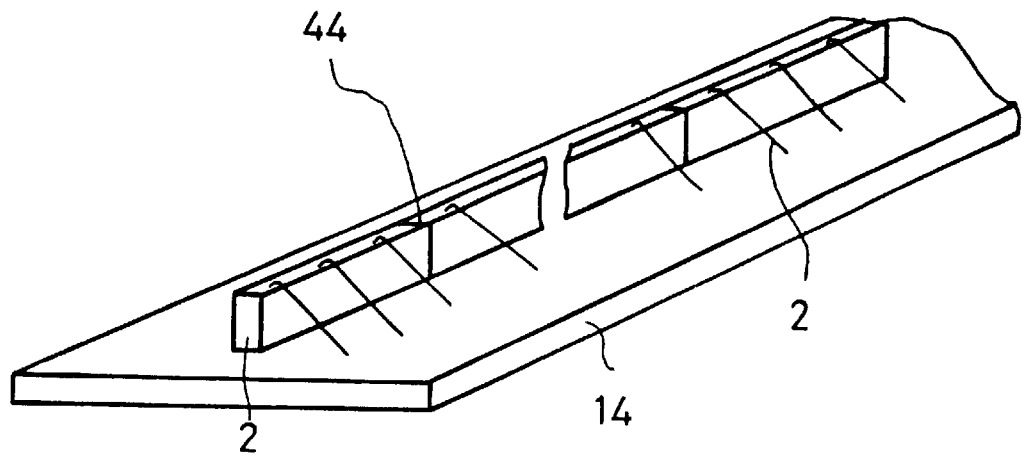
FIG. 10 is a perspective view of a sensor head for a facsimile using the inventive image sensor IC.

FIG. 10 is a perspective view of a sensor head for reading of a facsimile in which a plurality of the inventive image sensor ICs are placed in series. The sensor ICs 2 are placed linearly on a sensor head substrate 14 mechanically having almost no gap between them at sensor IC connecting portions 44. A thickness of the sensor IC shown in FIG. 10 is 350 μm. A width of the image sensor IC is thinned to be less than the thickness thereof after scribing. Accordingly, it allows a very thin sensor head to be created.

Figure 11:
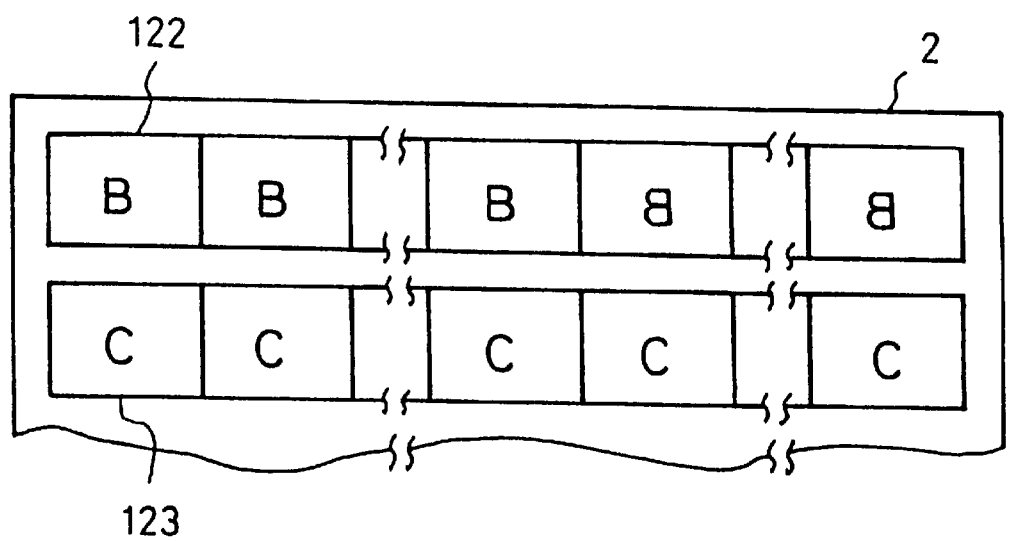
FIG. 11 is a plan view illustrating a placement of the reading periodic circuit block of the inventive image sensor IC.

FIG. 11 is a plan view illustrating a placement of one reading block of the inventive image sensor IC which corresponds to an image of an original. An array 122 of the phototransistors and the switch transistors and a scanning circuit array 123 composed of the shift registers are placed in parallel from each other in the scanning direction. One reading block of the phototransistor and the switch transistor is indicated by B. The scanning circuit of one reading block is indicated by C. As shown in FIG. 11, the shift registers C are all placed in the same direction in the scanning direction. However, one reading block of the phototransistor and the switch transistor is different at the both ends of the scanning direction of the IC. That is, in the reading block on the scan starting side, the base region is placed on the scan starting side and the switch transistor is placed on the scan side as shown in FIG. 9.

Figure 12:
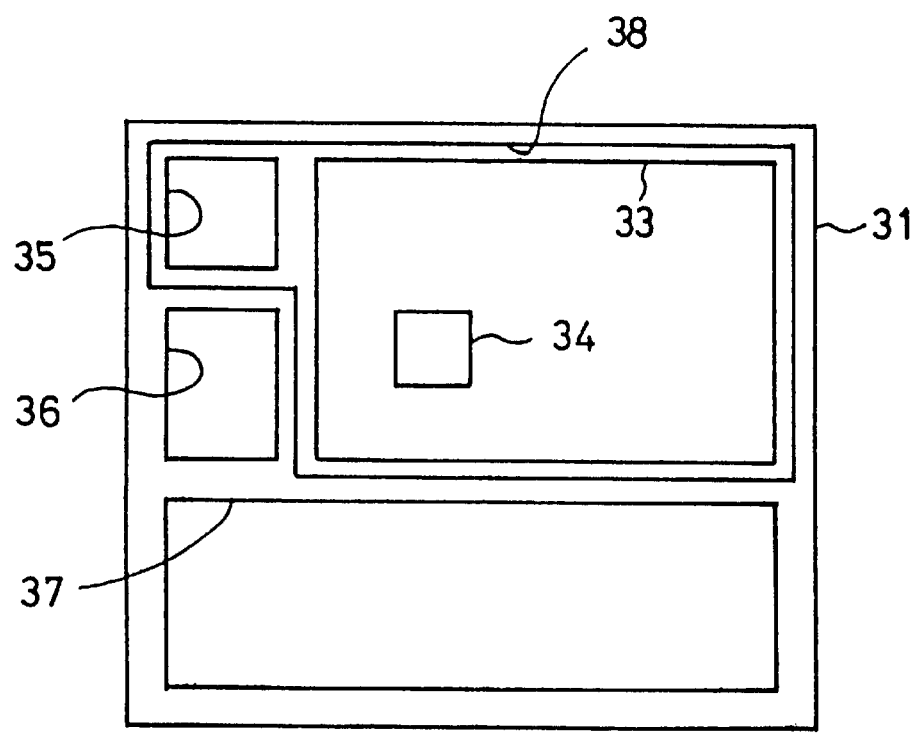
FIG. 12 is a plan view of a photosensor at the end of the inventive image sensor IC in the scanning direction thereof.

On the other hand, the base region is placed as shown in FIG. 12, differing from that shown in FIG. 9, in the reading block on the scan ending side. That is, the switch transistor 36 is provided on the scanning starting side with respect to the base region 33. By placing the base region and the switch transistor as shown in FIG. 11, the scan starting side and the scan ending side may be formed respectively within the base region. Such placement allows a difference of the sensor outputs on the both sides of the connecting portion to be reduced in the sensor head in which a plurality of image sensor ICs are connected in series as shown in FIG. 10.

Figure 13:
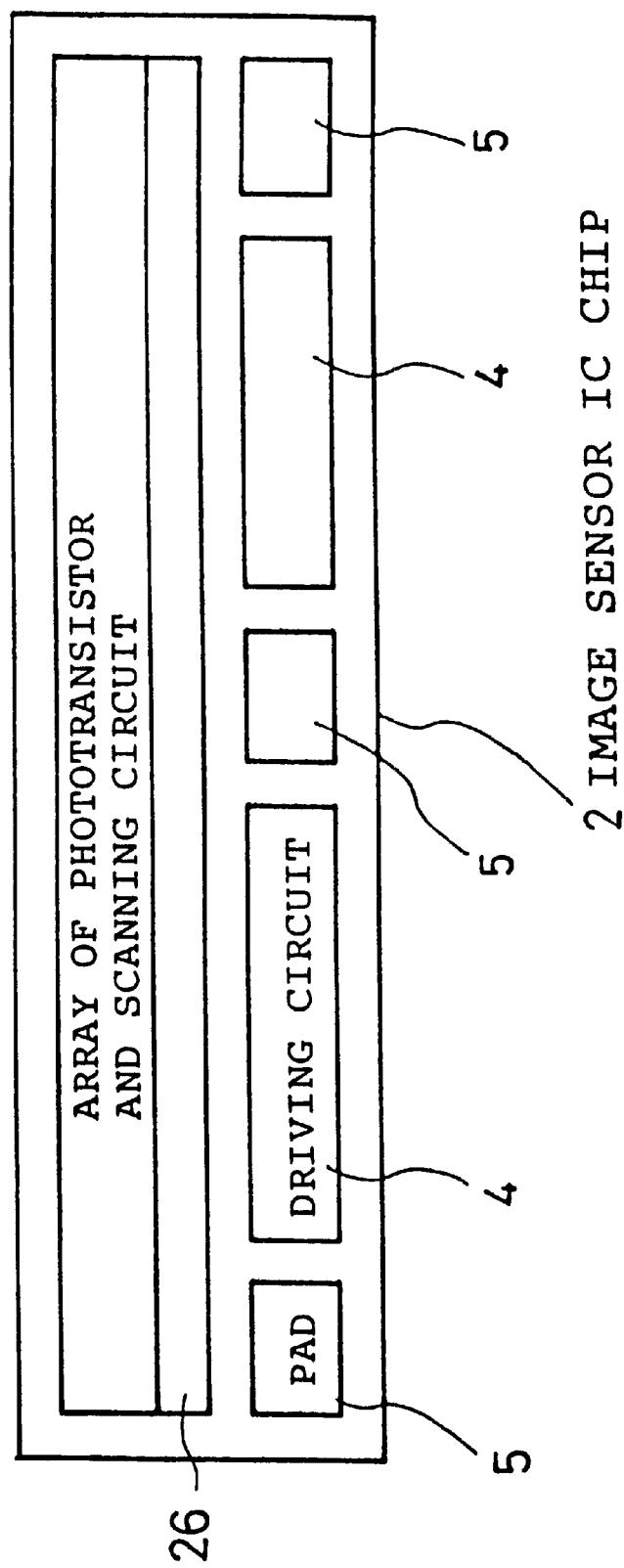
FIG. 13 is a plan view of circuit blocks of the inventive image sensor IC.

A second embodiment of the present invention will be explained below with reference to the drawings. FIG. 13 is a circuit block diagram of an inventive image sensor IC. The image sensor IC 2 comprises an array 24 composed of phototransistors and scanning circuits for sequentially switching switch transistors electrically connected with the phototransistors in series, are placed alternately in a line with a period of reading pitch in the scanning direction, a switch transistor array 26 placed directly next the phototransistor in parallel with respect to the scanning direction, pads 5 which are terminals for taking out current externally and driving circuits 4 for driving the scanning circuits placed along the switch transistor array 26. The switch transistor array 26 may be placed on the opposite side from the pads 5 and the driving circuits 4 for driving the scanning circuit so as to pinch the array 24 therebetween.

Electrical circuit diagrams and operations thereof are the same with those described in the first embodiment.

Figure 14A:
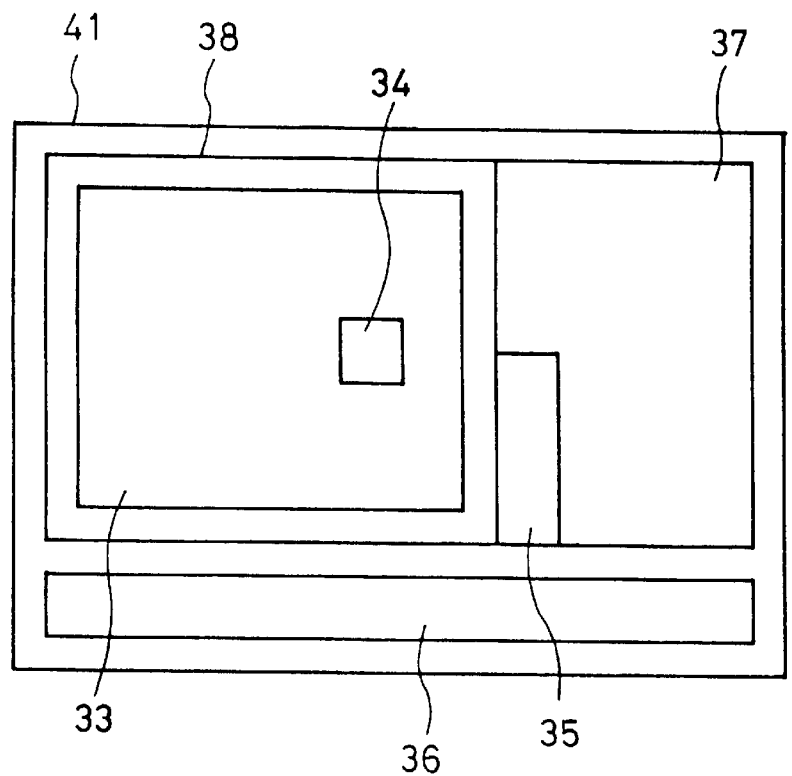
FIG. 14 is a plan view of one reading periodic circuit block of the inventive image sensor IC.
Figure 14B:
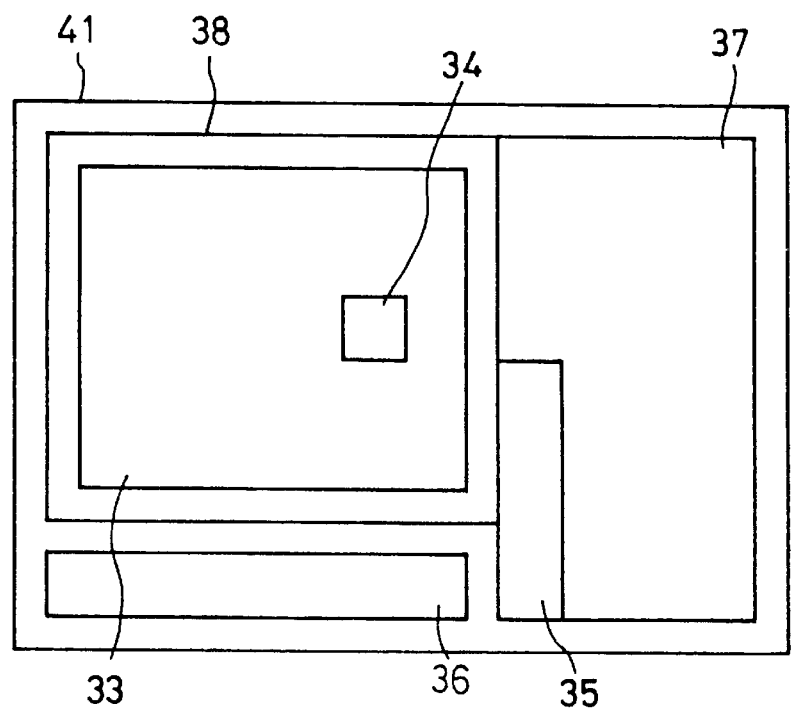

FIGS. 14a and 14b are plan views of one reading circuit block of the inventive image sensor IC according to the second embodiment of the present invention. One of reading circuit blocks 41 which are placed periodically comprises the phototransistor 38, the switch transistor 36 and the shift register 37. The emitter region 34 is placed within the base region 33 which is a photoelectric conversion region. The collector region is placed around the base region 33. The collector electrode 35 is provided next the base region 33 with respect to the scanning direction. The scanning circuit 37 is also placed next to the base region 33 with respect to the scanning direction. The collector electrode 35 and the scanning circuit 37 are placed next to each other, the collector electrode 35 is shared with an electrode for the power supply of the scanning circuit 37 and they are placed respectively on the same scanning direction side with respect to the base region 33. The scanning circuit 37 may have a width equal to that of the phototransistor 38 as shown in FIG. 14a or have a width slightly larger than that of the phototransistor as shown in FIG. 14b and at least part thereof is mounted. Accordingly, a width of the reading block (length in the direction vertical to the scanning direction) may be thinned by the width of the scanning circuit as compared to conventional one. Further, the base region 33 is created to be thin in the scanning direction as shown in FIG. 14A. The switch transistor 36 is placed in parallel with the phototransistor 38. By constructing the image sensor IC as shown in FIG. 14, the width thereof may be reduced to 0.2 to 0.35 mm.

Accordingly, the sensor head may be also created to be very thin as shown in FIG. 10 similarly to the first embodiment.

Figure 15:
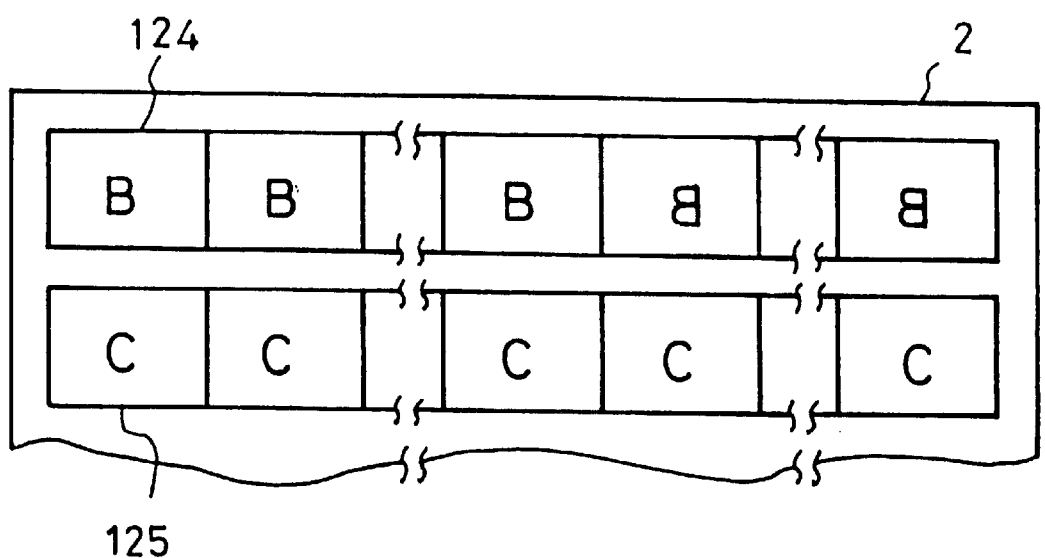
FIG. 15 is a plan view illustrating a placement of the reading periodic circuit block of the inventive image sensor IC.

FIG. 15 is a plan view illustrating a placement of one reading block of the inventive image sensor IC of the second embodiment in the scanning direction which corresponds to an image of an original. An scanning circuit array 124 of the phototransistors and the shift register and a switch transistor array 125 are placed in parallel from each other in the scanning direction. One reading block of the phototransistor and the scanning circuit is indicated by B. The switch transistor of one reading block is indicated by C. As shown in FIG. 15, the switch transistors C are all placed in the same direction in the scanning direction. However, one reading block of the phototransistor and the scanning circuit is different at the both ends of the scanning direction of the IC. That is, in the reading block on the scan starting side, the base region is placed on the scan starting side and the scanning circuit is placed on the scan side as shown in FIG. 14.

Figure 16A:
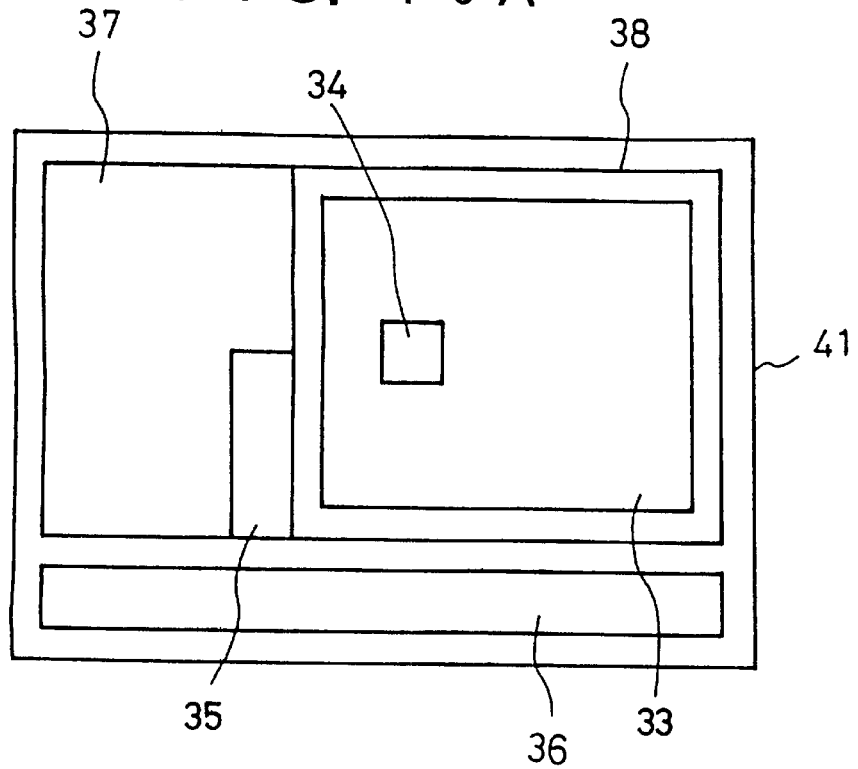
FIG. 16 is a plan view of a photosensor at the end of the inventive image sensor IC in the scanning direction thereof.
Figure 16B:
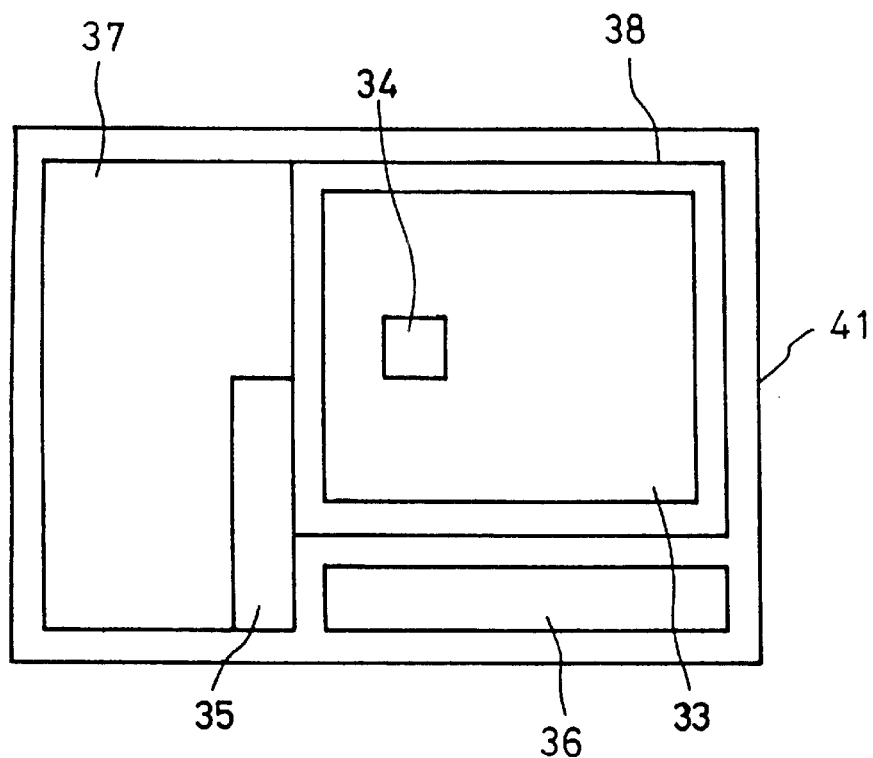

On the other hand, the base region is placed as shown in FIG. 16, differing from that shown in FIG. 14, in the reading block on the scan ending side. That is, the scanning circuit 37 is provided on the scanning starting side with respect to the base region 33. By placing the base region and the scanning circuit as shown in FIG. 15, the scan starting side and the scan ending side may be formed respectively within the base region. Such placement allows a difference of the sensor outputs on the both sides of the connecting portion to be reduced in the sensor head in which a plurality of image sensor ICs are connected in series as shown in FIG. 10. They may be placed in the same manner even when the light receiving element is a photodiode.

A third embodiment of the present invention will now be explained with reference to the drawings. FIG. 17 is a circuit block diagram of an inventive image sensor IC. The image sensor IC 2 comprises an array 126 composed of phototransistors, switch transistors electrically connected with the phototransistors in series and scanning circuits for sequentially switching the switch transistors are placed alternately in a line with a period of reading pitch in the scanning direction, pads 5 which are terminals for taking out current externally and driving circuits 4 for driving the scanning circuits placed along the array 126 of the phototransistors, switch transistors and scanning circuits.

Electrical circuit diagrams and operations thereof are the same with those described in the first embodiment.

Figure 18A:
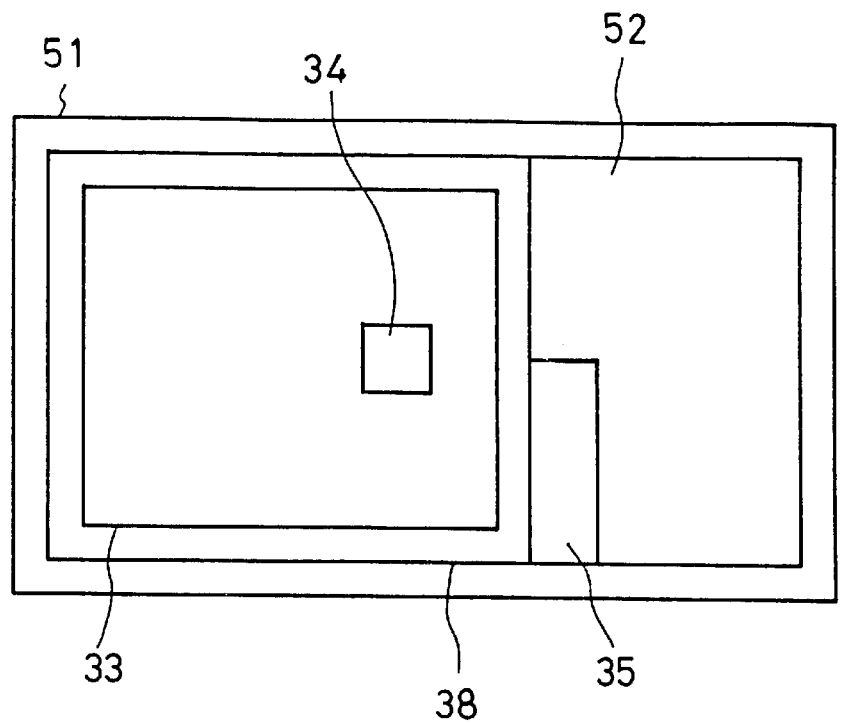
FIG. 18 is a plan view of one reading periodic circuit block of the inventive image sensor IC.
Figure 18B:
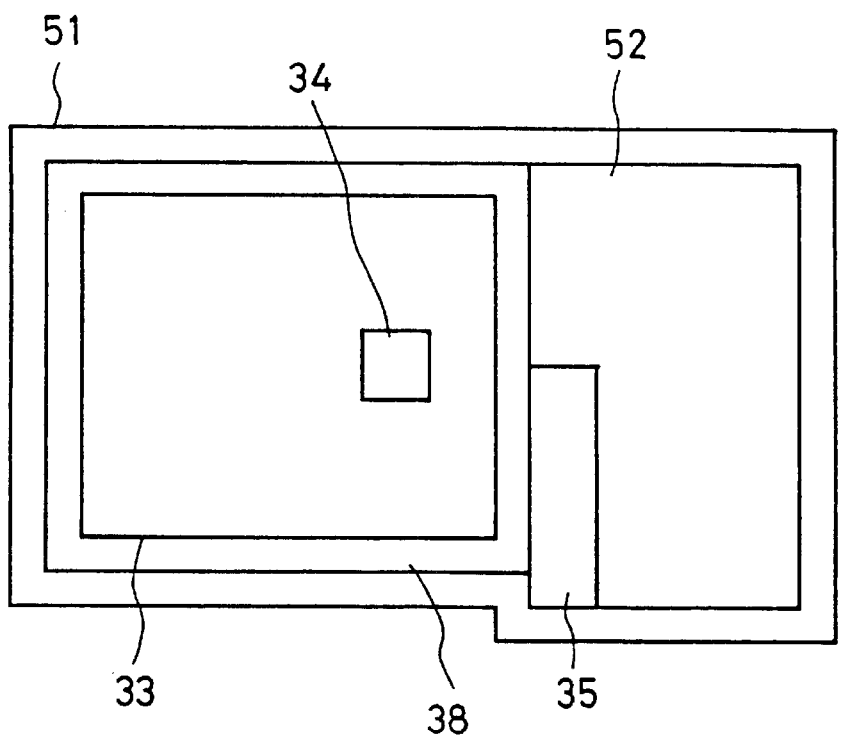

FIGS. 18a and 18b are plan views of one reading circuit block of the inventive image sensor IC according to the third embodiment of the present invention. One of reading circuit blocks 51 which are placed periodically comprises the phototransistor 38 and a switch transistor-and-scanning circuit 52 such as a shift register. The emitter region 34 is placed within the base region 33 which is a photoelectric conversion region. The collector region is placed around the base region 33. The collector electrode 35 is provided next the base region 33 with respect to the scanning direction. The switch transistor-and-scanning circuit 52 is also placed next to the base region 33 with respect to the scanning direction. The collector electrode 35 and the switch transistor-and-scanning circuit 52 are placed next to each other, the collector electrode 35 is shared with an electrode for the power supply of the switch transistor-and-scanning circuit 52 and they are placed respectively on the same scanning direction side with respect to the base region 33. The switch transistor-and-scanning circuit 52 may have a width equal to that of the phototransistor 38 as shown in FIG. 18a or have a width slightly larger than that of the phototransistor as shown in FIG. 18b and at least a part thereof is mounted. Accordingly, a width of the reading block (length in the direction perpendicular to the scanning direction) may be narrowed by the width of the switch transistor-and-scanning circuit as compared to conventional one. Further, the base region 33 is created to be thin in the scanning direction as shown in FIG. 18. Accordingly, by constructing the image sensor IC as shown in FIG. 18, the width thereof may be reduced to 0.2 to 0.35 mm.

Accordingly, the sensor head may be also created to be very thin as shown in FIG. 10 similarly to the first embodiment.

Figure 19:
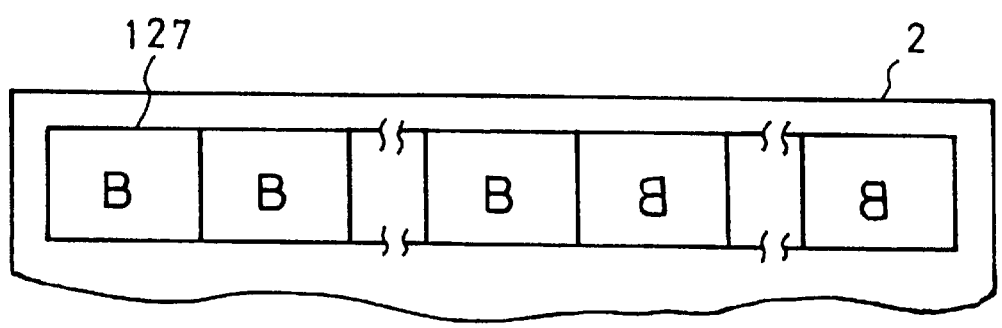
FIG. 19 is a plan view illustrating a placement of the reading periodic circuit block of the inventive image sensor IC.

FIG. 19 is a plan view illustrating a placement of one reading block of the inventive image sensor IC of the third embodiment in the scanning direction which corresponds to an image of an original. An array 127 composed of the phototransistors, the shift registers and switch transistors is placed in parallel from each other in the scanning direction. One reading block of the phototransistor, the switch transistor and the shift register is indicated by B. As shown in FIG. 19, one reading block of the phototransistor, the switch transistor-and-scanning circuit is different at the both ends of the IC in the scanning direction. That is, in the reading block on the scan starting side, the base region is placed on the scan starting side and the switch transistor-and-scanning circuit is placed on the scan side as shown in FIG. 18.

Figure 20A:
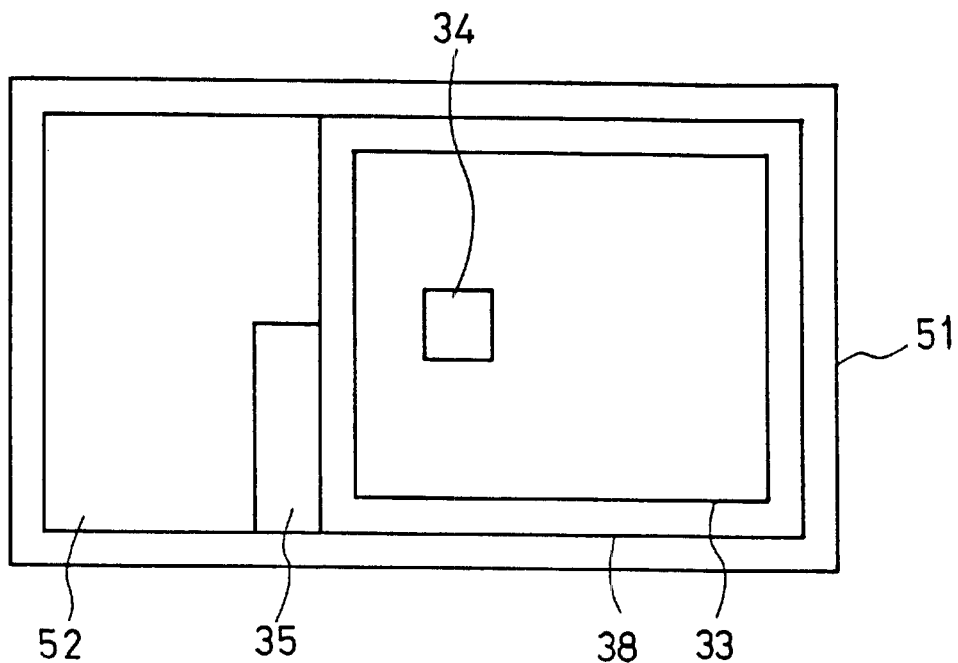
FIG. 20 is a plan view of a photosensor at the end of the inventive image sensor IC in the scanning direction thereof.
Figure 20B:
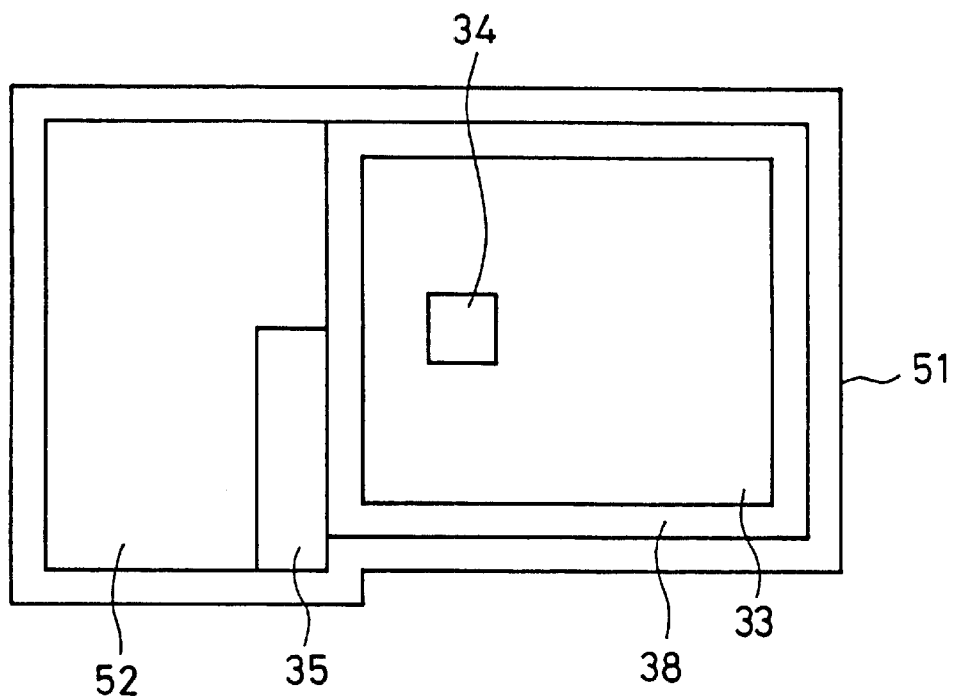

On the other hand, the base region is placed as shown in FIG. 20, differing from that shown in FIG. 18, in the reading block on the scan ending side. That is, the switch transistor-and-scanning circuit 52 is provided on the scanning starting side with respect to the base region 33. By placing the base region and the switch transistor as shown in FIG. 19, the scan starting side and the scan ending side may be formed respectively within the base region. Such placement allows a difference of the sensor outputs on the both sides of the connecting portion to be reduced in the sensor head in which a plurality of image sensor ICs are connected in series as shown in FIG. 10. They may be placed in the same manner even when the light receiving element is a photodiode.

A fourth embodiment of the present invention will now be explained with reference to the drawings. FIG. 17 is a circuit block diagram of an inventive image sensor IC. The image sensor IC 2 comprises an array 126 composed of phototransistors, switch transistors electrically connected with the phototransistors in series and scanning circuits for sequentially switching the switch transistors are placed alternately in a line with a period of reading pitch in the scanning direction, pads 5 which are terminals for taking out current externally and driving circuits 4 for driving the scanning circuits placed along the array 126 of the phototransistors, switch transistors and scanning circuits.

Electrical circuit diagrams and operations thereof are the same with those described in the first embodiment.

Figure 21A:
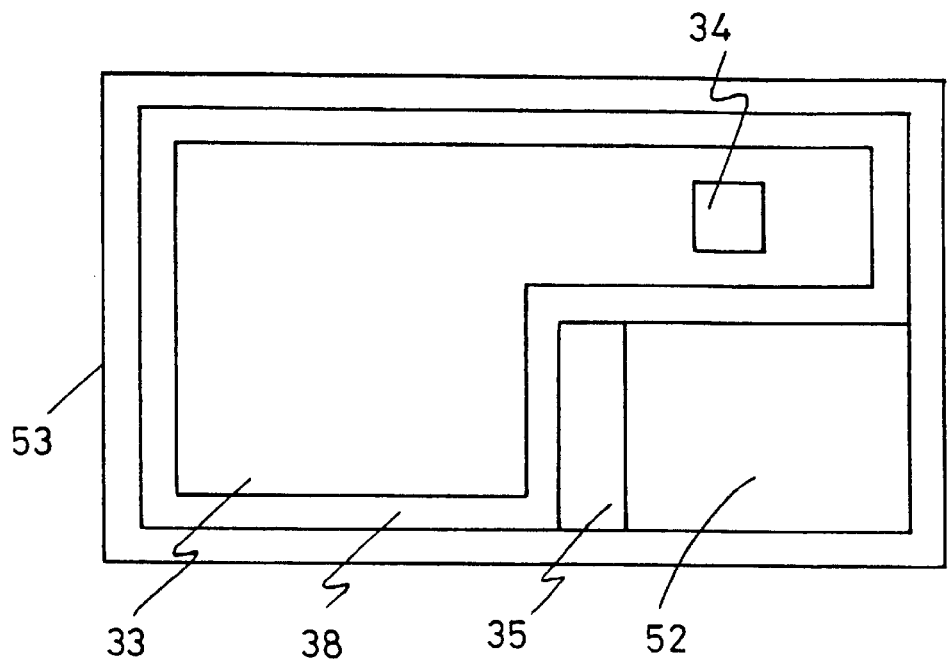
FIG. 21 is a plan view of one reading periodic circuit block of the inventive image sensor IC.
Figure 21B:
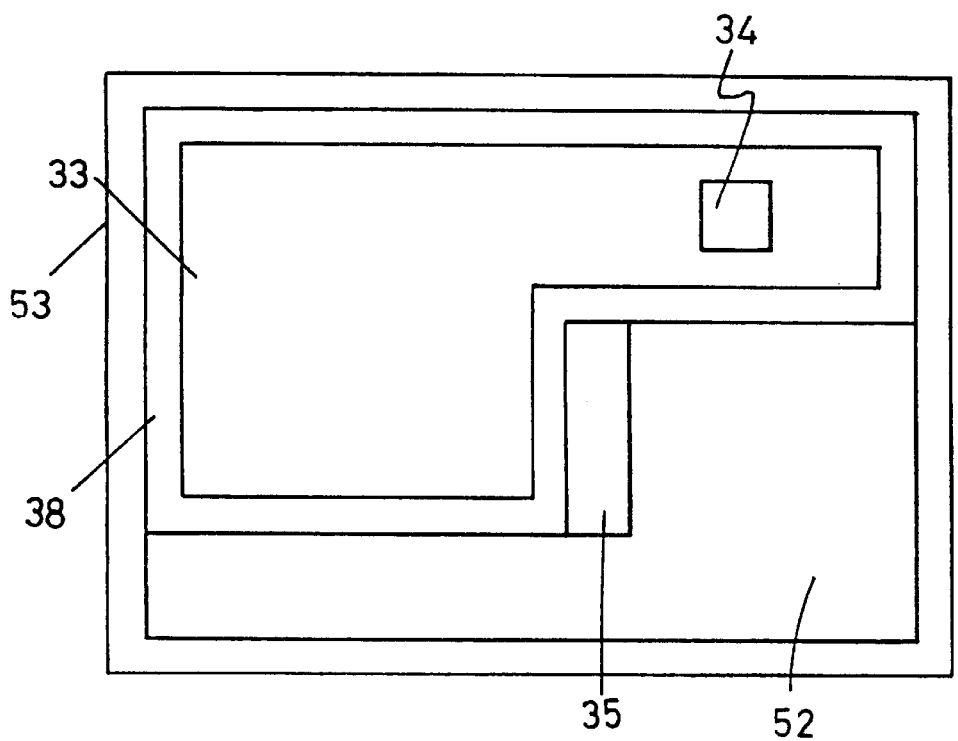

FIGS. 21a and 21b are plan views of one reading circuit block of the inventive image sensor IC according to the fourth embodiment of the present invention. One of reading circuit blocks 53 which are placed periodically comprises the phototransistor 38 and a switch transistor-and-scanning circuit 52. The base region which is a photoelectric conversion region is formed in an inverted L-shape. The emitter region 34 is placed within the base region 33. The collector region is placed around the base region 33. The collector electrode 35 is provided so that at least two sides thereof contact with the base region 33. The switch transistor-and-scanning circuit 52 is also placed next the base region 33. The collector electrode 35 and the switch transistor-and-scanning circuit 52 are placed next to each other, the collector electrode 35 is shared with an electrode for the power supply of the switch transistor-and-scanning circuit 52 and the switch transistor-and-scanning circuit 52 is placed so that at least two sides thereof contact with the phototransistor 38 within the width thereof as shown in FIG. 21a. Or, the switch transistor-and-scanning circuit 52 is placed so that at least three sides thereof contact with the phototransistor 38 while having a width equal to or slightly larger than that of the phototransistor 38 as shown in FIG. 21b. Accordingly, a width of the reading block (length in the direction vertical to the scanning direction) may be narrowed by the width of the switch transistor-and-scanning circuit as compared to conventional one. Accordingly, by constructing the image sensor IC as shown in FIG. 21, the width thereof may be reduced to 0.2 to 0.35 mm. Further, a range in which light is irradiated may be widened in the scanning direction, thus averaging information within the area, by thinning the width of the base region 33 as much as possible in the scanning direction of the one of the reading circuit block 53 and by bringing it closer to a pitch width of one phototransistor, i.e., the resolution of the image sensor IC.

Accordingly, the sensor head may be also created to be very thin as shown in FIG. 10 similarly to the first embodiment.

FIG. 19 is a plan view illustrating a placement of one reading block of the inventive image sensor IC of the fourth embodiment in the scanning direction which corresponds to an image of an original. An array 127 composed of the phototransistors, the switch transistors and the scanning circuits composed of shift registers is placed in the scanning direction. One reading block of the phototransistor, the switch transistor-and-scanning circuit is indicated by B. As shown in FIG. 19, one reading block of the phototransistor, the switch transistor-and-scanning circuit is different at the both ends of the IC in the scanning direction. That is, in the reading block on the scan starting side, the base region is placed on the scan starting side and the switch transistor-and-scanning circuit 52 is placed on the scan side as shown in FIG. 21.

Figure 22A:
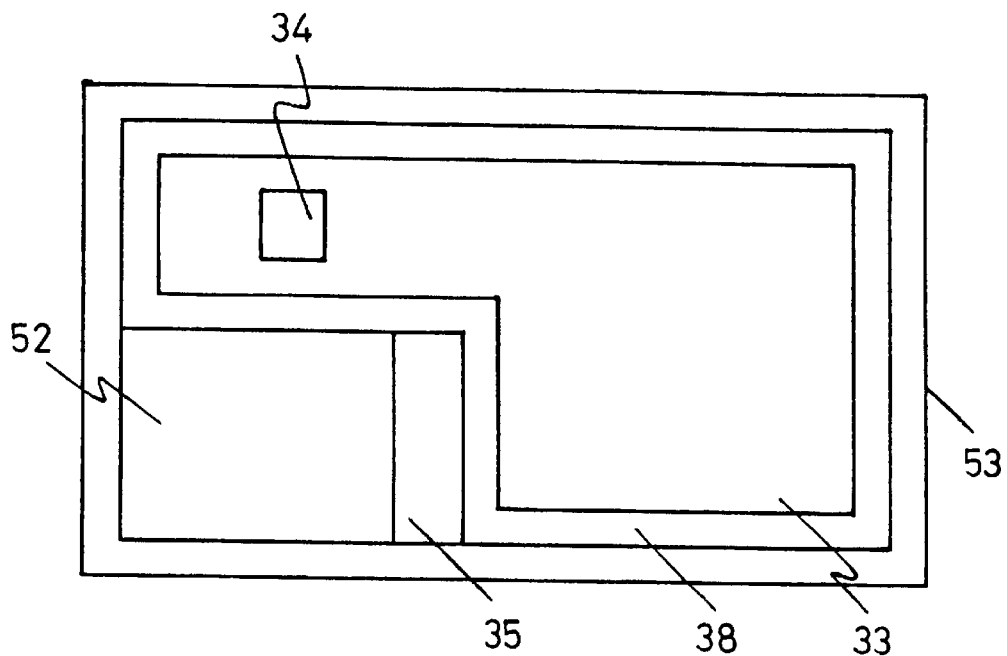
FIG. 22 is a plan view of a photosensor at the inventive image sensor IC in the scanning direction thereof.
Figure 22B:
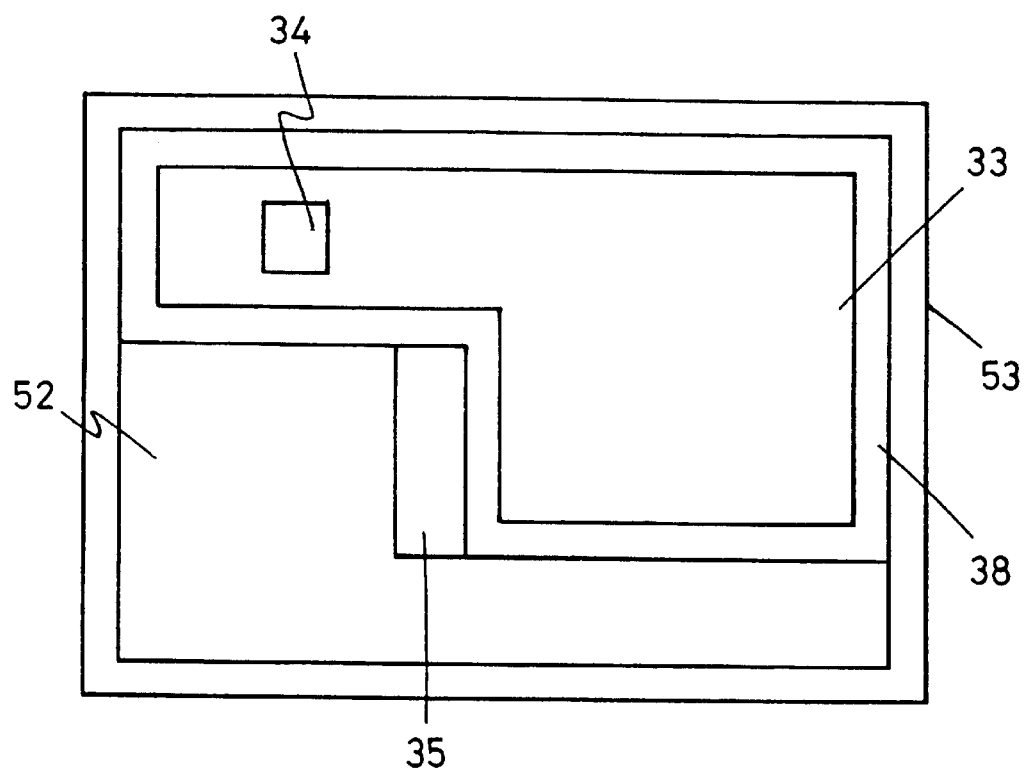

On the other hand, the base region is placed as shown in FIG. 22A, differing from that shown in FIG. 21A, in the reading block on the scan ending side. That is, the switch transistor-and-scanning circuit 52 is provided on the scanning starting side with respect to the base region 33. By placing the base region and the switch transistor as shown in FIG. 19, the scan starting side and the scan ending side may be formed respectively within the base region. Further, because the base region 33 is placed close to the pitch width of one phototransistor, i.e., a resolution, in the scanning direction at the part where the circuit block shown in FIG. 21 and that shown in FIG. 22 adjoin each other, the base regions adjoin each other. Accordingly, a difference of sensor outputs of the circuit block in FIG. 21 and that in FIG. 22 may be reduced. Further, it allows a difference of the sensor outputs on the both sides of the connecting portion to be reduced in the sensor head in which a plurality of image sensor ICs are connected in series as shown in FIG. 10. They may be placed in the same manner even when the light receiving element is a photodiode.

A fifth embodiment of the present invention will now be explained with reference to the drawings. The placement of the circuit block and the electrical circuit are the same with those described in the fourth embodiment.

Figure 23A:
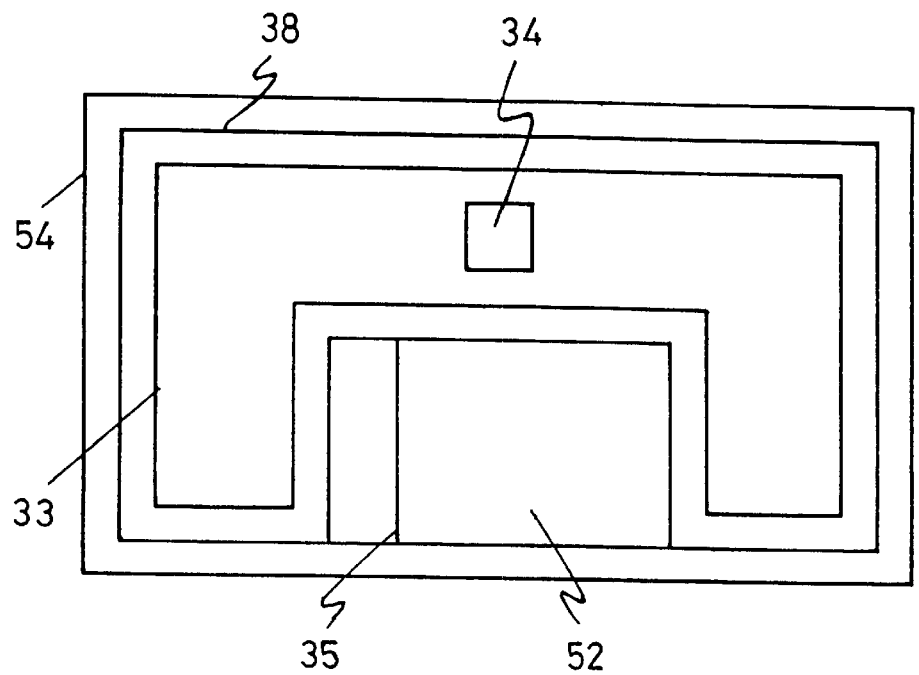
FIG. 23 is a plan view of one reading periodic circuit block of the inventive image sensor IC.
Figure 23B:
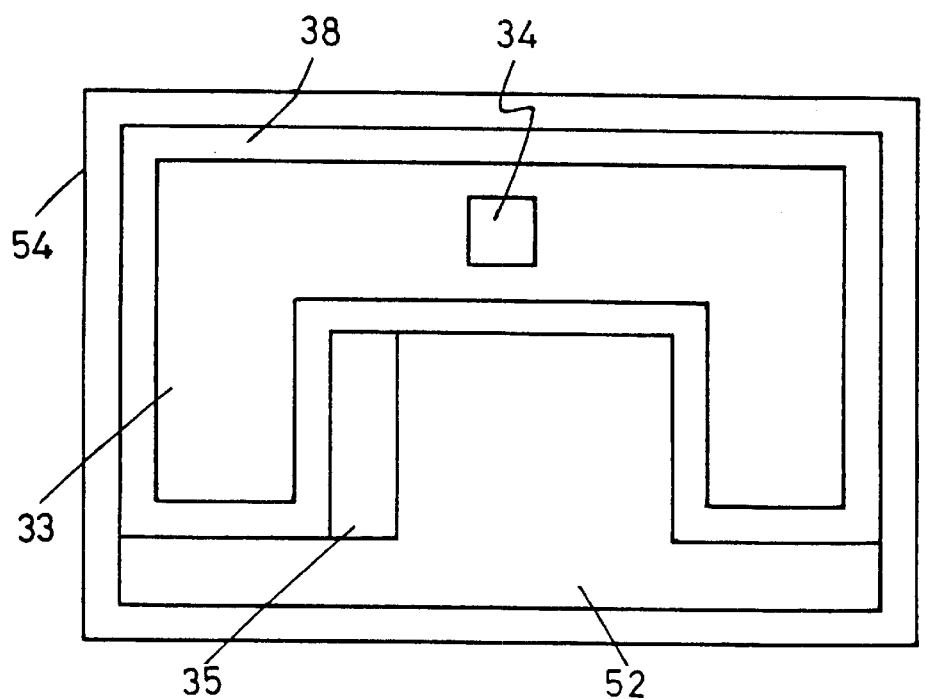

FIGS. 23a and 23b are plan views of one reading circuit block of the inventive image sensor IC according to the fifth embodiment of the present invention. One of reading circuit blocks 54 which are placed periodically comprises the phototransistor 38 and the switch transistor-and-scanning circuit 52. The base region which is a photoelectric conversion region is formed in U-shape. The emitter region 34 is placed within the base region 33. The collector region is placed around the base region 33. The collector electrode 35 is provided so that at least two sides thereof contact with the base region 33. The switch transistor-and-scanning circuit 52 is also placed next the base region 33. The collector electrode 35 and the switch transistor-and-scanning circuit 52 are placed next to each other, the collector electrode 35 is shared with an electrode for the power supply of the switch transistor-and-scanning circuit 52 and they are placed in the same scanning direction with respect to the base region 33.

The switch transistor-and-scanning circuit 52 is placed so that at least two sides thereof contact with the phototransistor 38 within the width thereof as shown in FIG. 23a. Or, the switch transistor-and-scanning circuit 52 is placed so that at least three sides thereof contact with the phototransistor 38 while having a width equal to or slightly larger than that of the phototransistor 38 as shown in FIG. 23b. Accordingly, a width of the reading block (length in the direction vertical to the scanning direction) may be narrowed by the width of the switch transistor-and-scanning circuit as compared to conventional one. Accordingly, by constructing the image sensor IC as shown in FIG. 21, the width thereof may be reduced to 0.2 to 0.35 mm. Further, the base region 33 is created to be thin as much as possible in the scanning direction of one reading circuit block 54. A range to which light is irradiated may be widened in the scanning direction, thus averaging information within the area, by narrowing the width of the base region 33 as much as possible in the scanning direction of the one of the reading circuit block 53 and by bringing it closer to a pitch width of one phototransistor, i.e., the resolution of the image sensor IC.

Accordingly, the sensor head may be also created to be very thin as shown in FIG. 10 similarly to the first embodiment.

Figure 24:
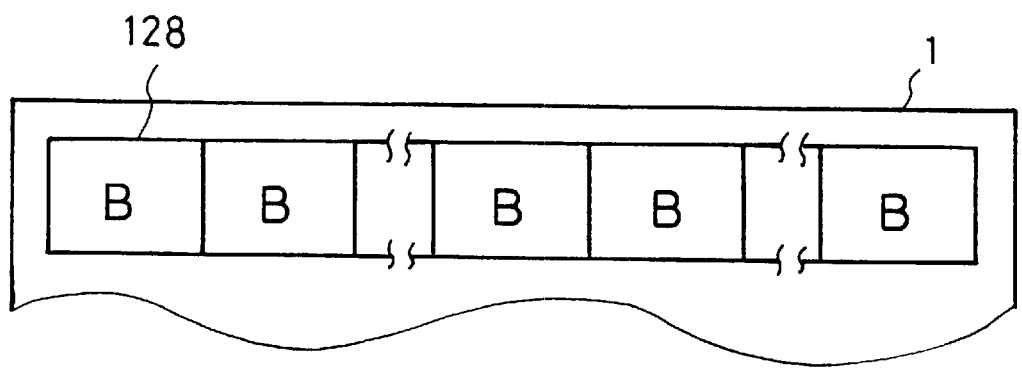
FIG. 24 is a plan view illustrating a placement of the reading periodic circuit block of the inventive image sensor IC.

FIG. 24 is a plan view illustrating a placement of one reading block of the inventive image sensor IC of the fifth embodiment in the scanning direction which corresponds to an image of an original. An array 128 composed of the phototransistors, the switch transistors and the scanning circuits composed of shift registers is placed in the scanning direction. One reading block of the phototransistor, the switch transistor-and-scanning circuit is indicated by B. As shown in FIG. 24, the reading blocks of the phototransistor and the switch transistor-and-scanning circuit are all placed in the same scanning direction. That is, because the base region 33 is placed so as to pinch the switch transistor-and-scanning circuit 52 and is placed on the both sides of the scan starting side and the scan ending side as shown in FIG. 23 in one reading block, the scan starting side and the scan ending side may be formed respectively in the base region by placing the base region and the switch transistor-and-scanning circuit as shown in FIG. 24. By placing them as such, a difference of the sensor outputs on the both sides of the connecting portion may be reduced in the sensor head in which a plurality of image sensor ICs are connected in series as shown in FIG. 10. They may be placed in the same manner even when the light receiving element is a photodiode.

Next, a sixth embodiment of the present invention will be explained with reference to the drawings. The present invention may be applied in combination with all the embodiments described above or may be practiced independently.

Figure 25:
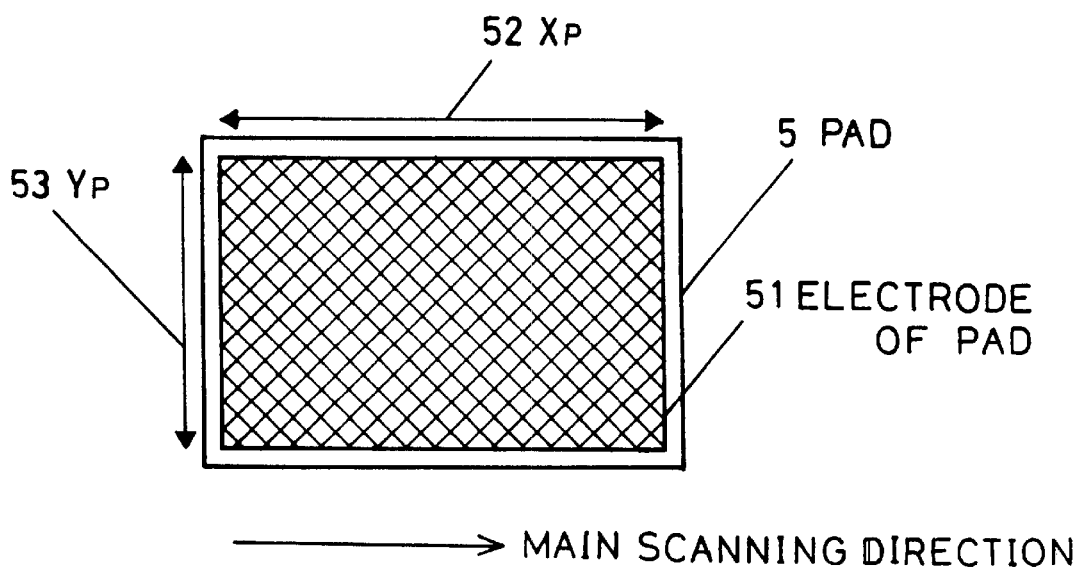
FIG. 25 is a plan view illustrating a shape of a pad of the inventive image sensor IC.
Figure 26:
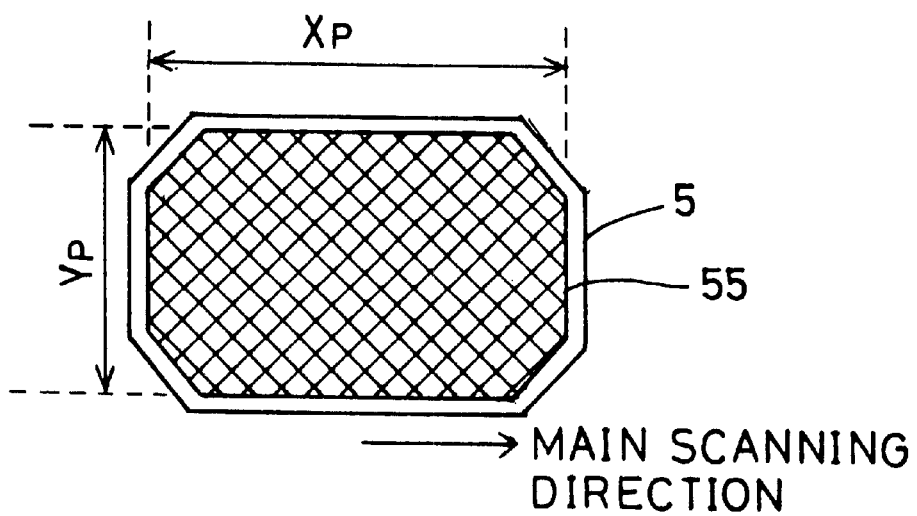
FIG. 26 is a plan view illustrating a shape of a pad of the inventive image sensor IC.
Figure 27:
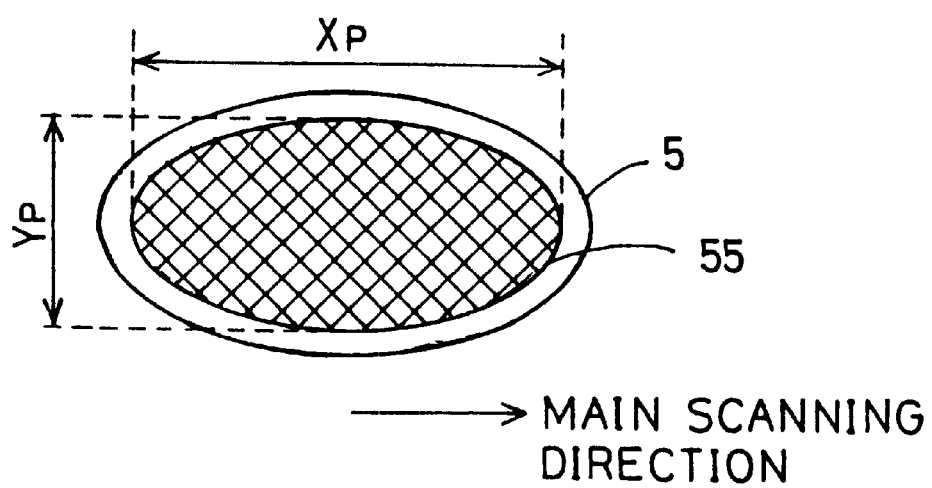
FIG. 27 is a plan view illustrating a shape of a pad of the inventive image sensor IC.

FIG. 25 is a plan view illustrating a shape of a pad of the inventive image sensor IC. The pad 5 is made of Al or the like. An electrode 55 of the pad is a part thereof from which a protection film on the pad such as Al is removed by means of etching or the like and which may be electrically contacted. Xp 52 is a length of the electrode 55 in the main scanning direction whose size is 100 $\mu$m. Yp 53 is a length of the electrode 55 in the sub-scanning direction whose size is 80 $\mu$m. Accordingly, the pad is thin in the main scanning direction. FIG. 26 shows a case when the pad electrode is octagonal and FIG. 27 shows a case when it is oval. In either of them, the length Xp of the electrode 55 in the main scanning direction is longer than the length Yp thereof in the sub-scanning direction. Yp is set at 80 $\mu$m or less.

FIG. 28 is a plan view illustrating when the inventive image sensor IC is inspected. It shows a state in which tips of 1–3 pin probe 44 and a 4–6 pin probe 55 for measuring electrical characteristics of the image sensor IC contact with the pads 5 which are terminals for taking out external electricity along the array 20 of the phototransistor and switch transistor and the scanning circuit array 3.

The 1–3 pin probe 44 and the 4–6 pin probe 55 are each three-layered, are all parallel in the longitudinal direction of the image sensor IC and all overlap from each other in the vertical direction. Due to that, the array 20 of the phototransistor and switch transistor will not be shaded by the probes even if light is irradiated from the top.

FIG. 29 is a section view illustrating when the inventive image sensor IC is inspected. As shown in the figure, the 1–3 pin probe 44 and the 4–6 pin probe 55 are each three-layered, are all parallel in the vertical direction of the image sensor IC and all overlap from each other in the vertical direction. A first direction 56 is a direction into which the probe is driven and moves in the vertical direction. A second direction is an advancing direction of the 1–3 pin probe 44 when the tips thereof contact with the pads 5 and are overdriven and moves in the right direction almost in parallel with the longitudinal direction of the image sensor IC 2. A third direction 58 is an advancing direction of the 4–6 pin probe 55 when the tips thereof contact with the pads 5 and are overdriven and moves in the left direction almost in parallel with the longitudinal direction of the image sensor IC 2.

Figure 30:
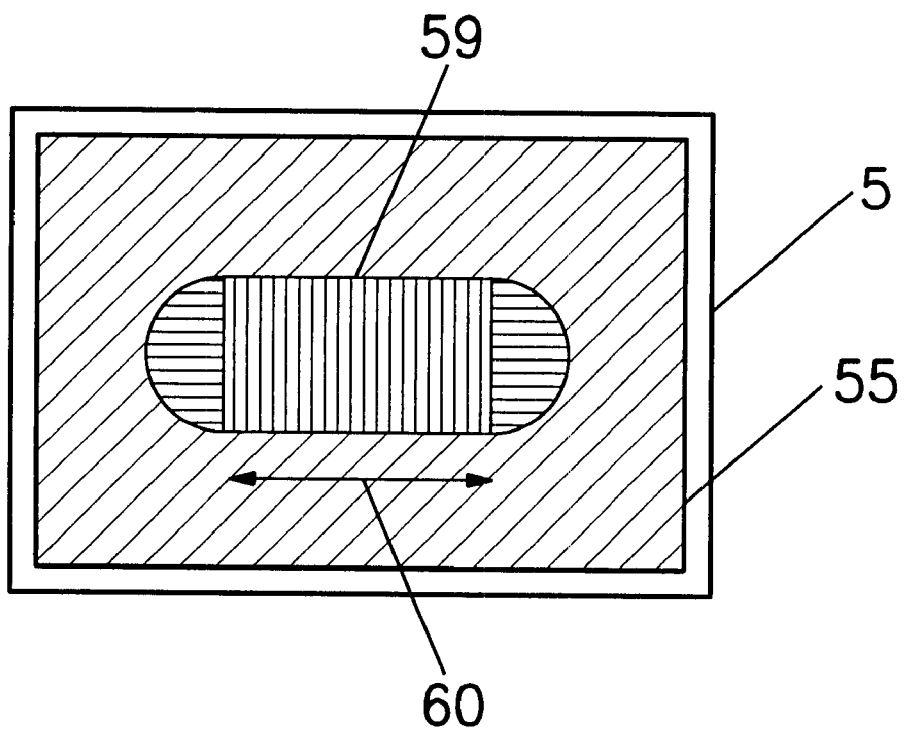
FIG. 30 is a plan view showing a trace of probe of the pad when the inventive image sensor IC is inspected.

FIG. 30 is a plan view showing a trace of probe of the pad when the inventive image sensor IC is inspected. A fourth direction 60 is an advancing direction of the tip of the probe and is almost in parallel with the longitudinal direction of the pad 5.

A damaged trace of probe is created when the tip of the probe contacts with and advances into the electrode 55. Due to that, it is created almost in parallel with the longitudinal direction of the pad 5 and thinly having a width equal to a diameter of tip face of the probe.

Accordingly, Yp may be reduced to a size equal to or slightly larger than the diameter of the tip face of the probe. Meanwhile, the Xp needs to be a size which allows a deviation of the tip of the probe. As it is apparent in FIG. 28, if the width Yp of the pad electrode is reduced, the width of the image sensor IC may be reduced that much. For example, if Yp which has been 100 μm in the past is reduced to 80 μm, the width of the image sensor IC may be reduced by 20 μm.

Thus, the width of the image sensor IC may be reduced to 0.2 to 0.35 mm by reducing the width of the pad.

When the advancing direction of the tip is not parallel with the longitudinal direction of the pad, the length of the damaged trace may be prolonged and the width of the pad may be reduced by advancing the tip almost in parallel with a diagonal direction of the pad.

The circuit of the present invention will now be explained.

While the circuit of the present invention has been shown in FIGS. 3, 4 and 5, it has a drawback that because an output terminal of the photoelectric conversion element is reset only during HIGH period of one period of clock pulse CLK, the reset period is shortened, thus increasing a residual quantity of charge, if a DUTY width of the clock pulse CLK changes and the HIGH period becomes short.

Then, another circuit will be explained as a seventh embodiment of the present invention. This circuit can reduce the residual quantity of charge because the reset period is constant regardless of the DUTY of the clock pulse and is long. Further, because it does not require so many devices, it can be realized in a chip size almost equal to that of the circuit shown in FIGS. 3, 4 and 5.

Figure 31:
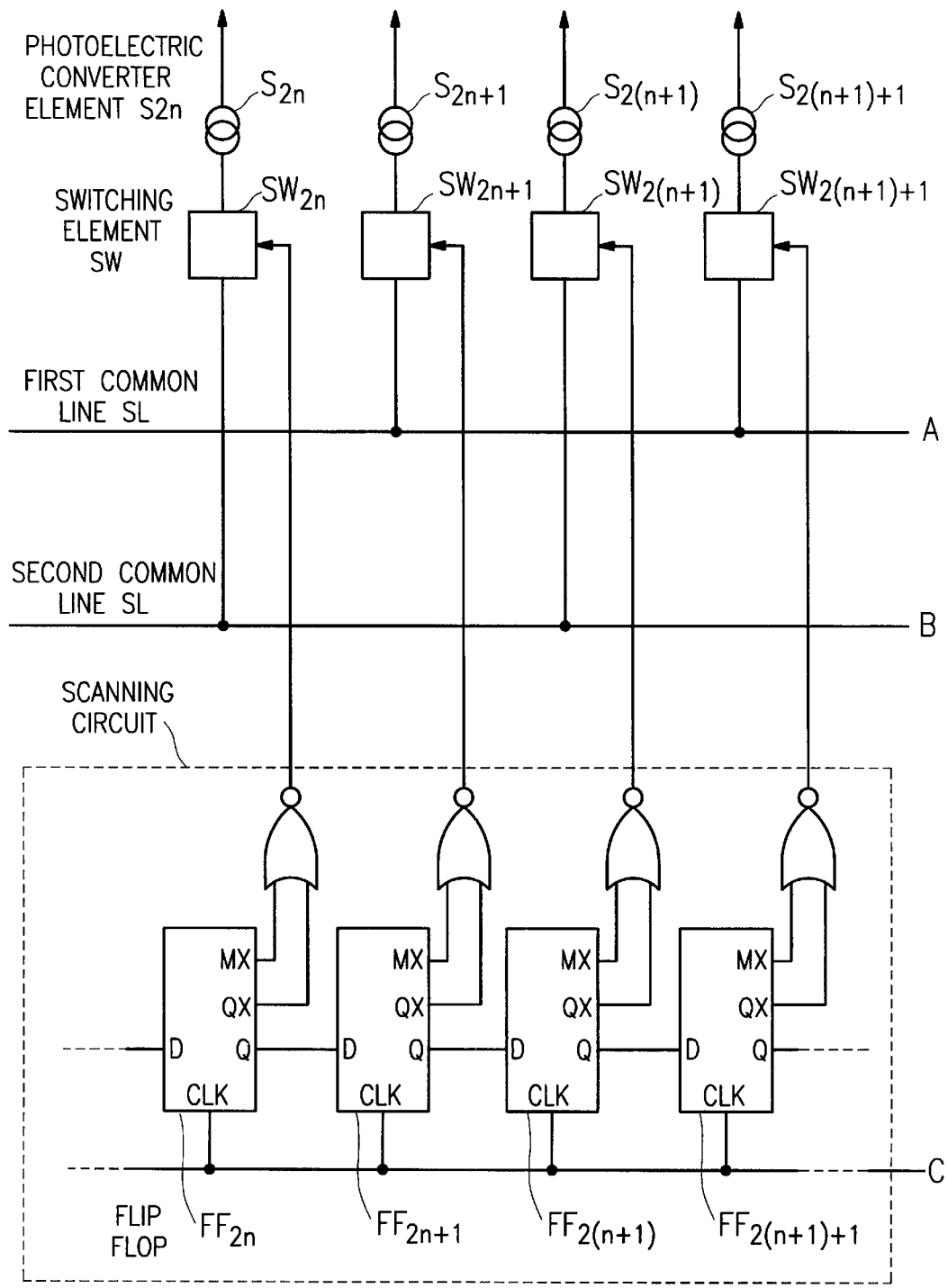
FIG. 31 is a schematic diagram of the circuit of the inventive image sensor IC.
Figure 32:
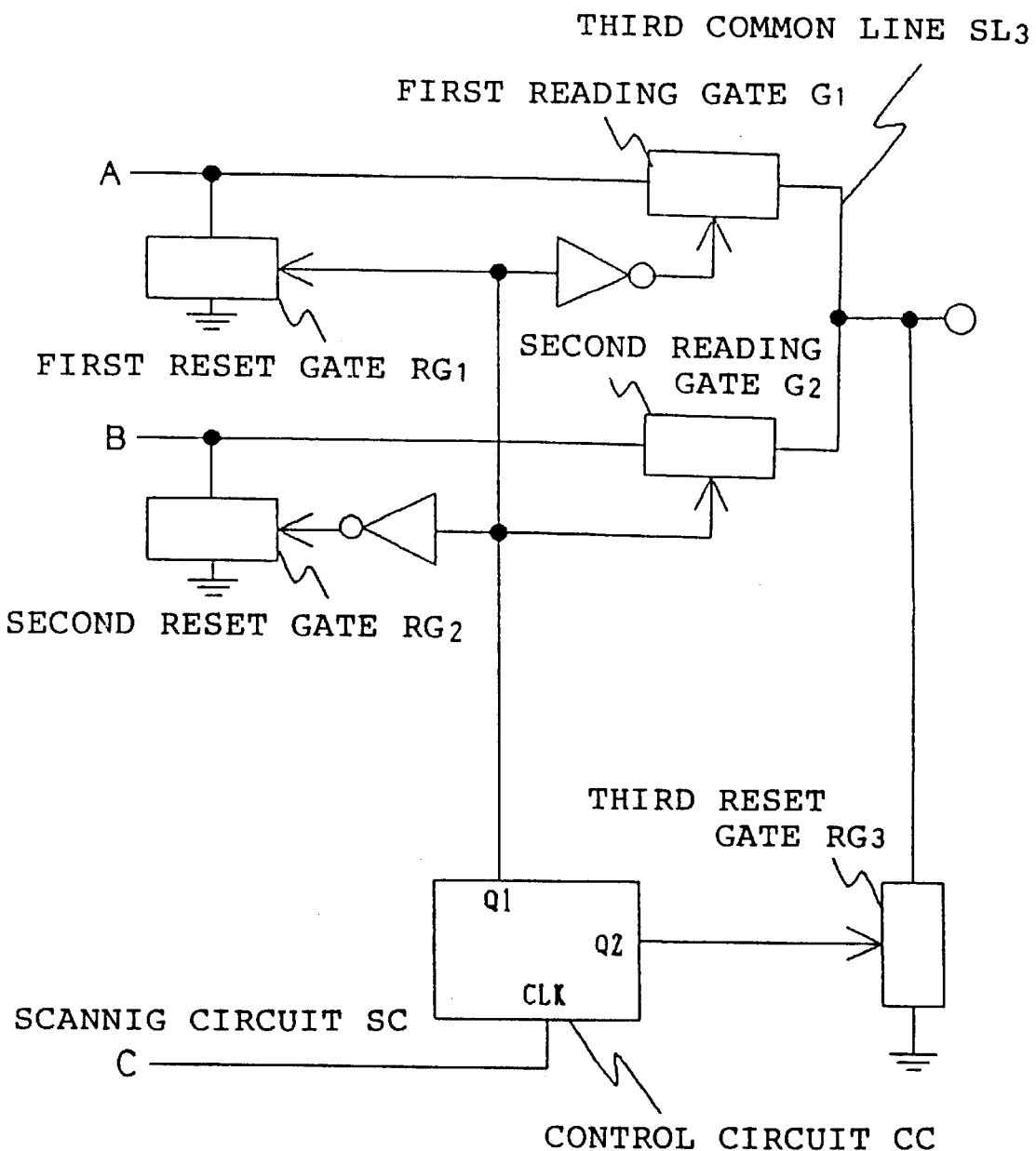
FIG. 32 is a schematic diagram of the circuit of the inventive image sensor IC.

FIGS. 31 and 32 are schematic diagrams of the circuit of the linear image sensor according to the seventh embodiment of the present invention. Output terminals of photoelectric converter elements S $2n$, S $2n+1$ . . . are connected with input terminals of switching elements SW $2n$, SW $2n+1$, . . . and output terminals of the switching elements SW $2n$, SW $2n+1$, . . . are connected with a first common line SL1 when the switching element is an odd number switching element and with a second common line SL2 when it is an even number switching element. The first common line SL1 is connected with an input terminal of a first reading gate G1 and an input terminal of a first reset gate RG1 and the second common line SL2 is connected with an input terminal of a second reading gate G2 and an input terminal of a second reset gate RG2. Output terminals of the first and second reading gates G1 and G2 are short-circuited each other and are connected to a third common line SL3.

The third common line SL3 is connected with a terminal SIG for outputting signals to the outside and an input terminal of a third reset gate RG3. The output terminals of the first, second and third reset gates described above are connected to a reset power supply which supplies a reset potential (for convenience, it is assumed to be GND in this circuit). Signals for controlling the switching elements SW $2n$, SW $2n+1$, . . . are provided by NOR output of an inversion output of an output terminal M and an inversion output of an output terminal Q in each stage of flip-flops FF $2n$, FF $2n+1$, . . . in the scanning circuit SC of the shift register. That is, NOR output of the inversion output of the output terminal M and that of the output terminal Q of the n-th stage flip-flop FFn is connected to a control terminal of a n-th switching element SWn.

Figure 33:
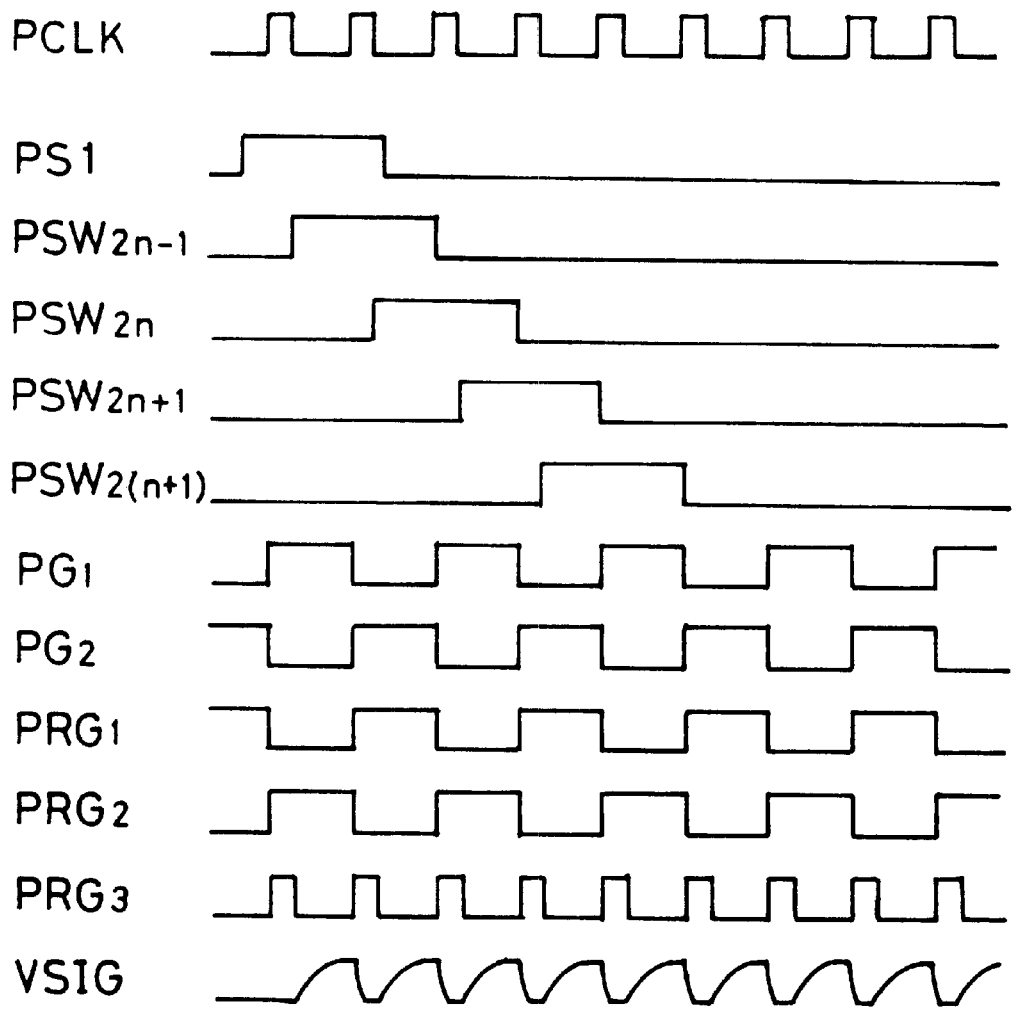
FIG. 33 is a time chart of the circuits of the inventive image sensor IC.

An operation of the circuit described above will be explained based on a time chart shown in FIG. 33. In the figure, PCLK represents a clock pulse having a period of 1/f CK second and is input to the flip-flops FF $2n$, FF $2n+1$, . . . and to a clock terminal CLK of a control circuit. PSI represents a start pulse and is input to a data terminal D of the flip-flop FF $2n-1$ of the scanning circuit SC of the shift register. It causes a change of state in the shift register at the trailing edge of the clock pulse PCLK and transfers data of two periods of the clock pulse. PSWi represents a pulse for controlling an i-th (i=$2n$, $2n+1$, . . . ) switching element, PGj represents a pulse for controlling a j-th (j=1, 2) reading gate Gj and PRGk (k=1, 2, 3) represents a pulse for controlling a k-th reset gate RGk. Here, the circuit is designed so that the switching element SWi, the reading gate Gj and the reset gate RGj are energized among the input terminals thereof when the above-mentioned control pulses PSWi, PGj and PRGk are on High level and are de-energized when those pulses are on Low level. That is, the first and second reading gates G1 and G2 are energized/de-energized by the pulses having phases opposite each other.

The first reading gate G1 and the first reset gate RG1 are also energized/de-energized by the pulses having phases opposite each other. Similarly, the first and second reset gates RG1 and RG2 are energized/de-energized by the pulses having phases opposite each other and the second reading gate G2 and the second reset gate RG2 are energized/de-energized by the pulses having phases opposite each other.

The third reset gate RG3 is repeatedly energized/de-energized almost with the same timing with the clock pulse PCLK. The timing of causing the change of state is caused when the switching element SWi is in the trailing edge of the clock pulse PCLK and one period during which the energized state is kept is equivalent to one and half period of the clock pulse PCLK. Further, the states of the reading gate Gj and the reset gate RGk change at the leading edge of the clock pulse PCLK and one period thereof in which the energized state is kept is equivalent to one period of the clock pulse PCLK.

Next, an operation for sequentially reading signals obtained by the plurality of photoelectric converter elements S1 (1=..., 2n, 2n+1, ...) to the outside and a signal resetting operation will be explained. At first, data PSI having a period greater than BIT number of the shift register composed of the flip-flops FF 2n, FF 2n+1, ... is input to the scanning circuit SC and is transferred in synchronism with the trailing edge of the clock to generate scanning signals so that the plurality of switching elements SWi are sequentially energized one by one. Here, with regard to a signal obtained by the (2n+1)-th photoelectric converter element S 2n+1 for example, the first reading gate G1 and the third reset gate RG3 are energized at the leading edge of the clock pulse PCLK. However, because the (2n+1)-th switching element SW 2n+1 is de-energized at this time, the signal obtained by the (2n+1)-th photoelectric converter element S 2n+1 is not read out to the first common line. Accordingly, a reset voltage is output from the signal output terminal SIG because the third reset gate RG3 is energized.

Next, when the clock pulse PCLK falls, the third reset gate RG3 is de-energized and the (2n+1)-th switching element SW 2n+1 is energized slightly behind it. Then, the signal obtained by the (2n+1)-th photoelectric converter element 2n+1 is read out to the outside via the signal output terminal SIG through the switching element SW 2n+1 and the first common line SL1 and through the first reset gate RG1 and the third common line SL3. At this time, the second reading gate G2, the first reset gate RG1 and the third reset gate RG3 are de-energized. It is noted that the second reset gate RG2 is energized and the second common line SL2 is fixed to the reset voltage.

Next, when the first reading gate G1 is de-energized at the leading edge of the clock pulse PCLK, the first reset gate RG1, the second reading gate G2 and the third reset gate RG3 are energized. Because the (2n+1)-th switching element SW 2n+1 is energized at this time, the (2n+1)-th photoelectric converter element 2n+1 is connected to the reset power supply via the switching element SW 2n+1, the first common line SL1 and the first reset gate RG1 and is then reset. Further, because the 2(n+1)-th switching element SW 2(n+1) is de-energized at this time, a signal obtained by the 2(n+1)-th photoelectric converter element 2n+1 is not read out to the second common line yet. Accordingly, a reset voltage is output from the signal output terminal SIG because the third reset gate RG3 is energized.

Next, when the clock pulse PCLK falls, the third reset gate RG3 is de-energized and the 2(n+1)-th switching element SW 2(n+1) is energized slightly behind it. Then, the signal obtained by the 2(n+1)-th photoelectric converter element 2(n+1) is read out to the outside via the signal output terminal SIG through the switching element SW 2(n+1) and the second common line SL2 and through the second reading gate G2 and the third common line SL3. The first reading gate G1 is de-energized, so that the signal of the (2n+1)-th photoelectric converter element S 2n+1 will not overlap with it. It is noted that the first reset gate RG1 is energized and the first common line SL1 is fixed to the reset voltage. Due to that, the (2n+1)-th switching element SW 2n+1 is energized and the reset state of the (2n+1)-th photoelectric converter element 2n+1 is continued.

Next, when the second reading gate G2 is de-energized at the leading edge of the clock pulse PCLK, the (2n+1)-th switching element SW 2n+1 is de-energized and the (2n+ 1)-th photoelectric converter element 2n+1 is released from the reset state and enters a charge storing state, i.e., a photoelectric conversion state. Further, the second reset gate RG2, the first reading gate G1 and the third reset gate RG3 are energized. Because the 2(n+1)-th switching element SW 2(n+1) is energized at this time, the 2(n+1)-th photoelectric converter element 2n+1 is connected to the reset power supply via the switching element SW 2(n+1), the second common line SL2 and the second reset gate RG2 and is then reset. Further, because the 2(n+1)+1-th switching element SW 2(n+1) +1 is de-energized at this time, a signal obtained by the 2(n+1) +1-th photoelectric converter element 2(n+1) +1 is not read out to the second common line yet. Accordingly, a reset voltage is output from the signal output terminal SIG because the third reset gate RG3 is energized.

Next, when the clock pulse PCLK falls, the third reset gate RG3 is de-energized and the (2n+1)+1-th switching element SW 2n+1+1 is energized slightly behind it. Then, the signal obtained by the (2n+1)+1-th photoelectric converter element (2n+1) +1 is read out to the outside via the signal output terminal SIG through the switching element SW (2n+1) +1 and the first common line SL1 and through the first reading gate G1 and the third common line SL3. The second reading gate G2 is de-energized at this time. It is noted that the second reset gate RG2 is energized and the second common line SL2 is fixed to the reset voltage. Due to that, the (2n+1)-th switching element SW 2n+1 is energized and the reset state of the (2n+1)-th photoelectric converter element 2n+1 is continued.

Next, when the first reading gate G1 is de-energized at the leading edge of the clock pulse PCLK, the 2(n+1)-th switching element SW 2(n+1) is de-energized and the 2(n+1)-th photoelectric converter element 2(n+1) is released from the reset state and enters the charge storing state, i.e., the photoelectric conversion state. Further, the first reset gate RG1, the second reading gate G2 and the third reset gate RG3 are energized. Because the 2(n+1)+1-th switching element SW 2(n+1) +1 is energized at this time, the 2(n+1)+ 1-th photoelectric converter element 2(n+1) +1 is connected to the reset power supply via the switching element SW 2(n+1)+1, the first common line SL1 and the first reset gate RG1 and is then reset.

The signals obtained by the plurality of photoelectric converter elements are read out sequentially to the outside by repeating the procedure described above and the reset state is one period of the clock pulse PCLK. Further, even if the DUTY width of the clock pulse changes, the period of the reset operation will not be changed.

Further, because the reading gate Gk has been already in a stationary state when the signals are read out to the outside as any of the switching elements or the reading gates is turned from the de-energized state to the energized state, no fixed pattern noise nor gate switching noise will be overlapped with the photoelectric conversion signals and thus the S/N ratio will not be lowered. Thus, the operation of the linear image sensor is achieved.

Figure 34:
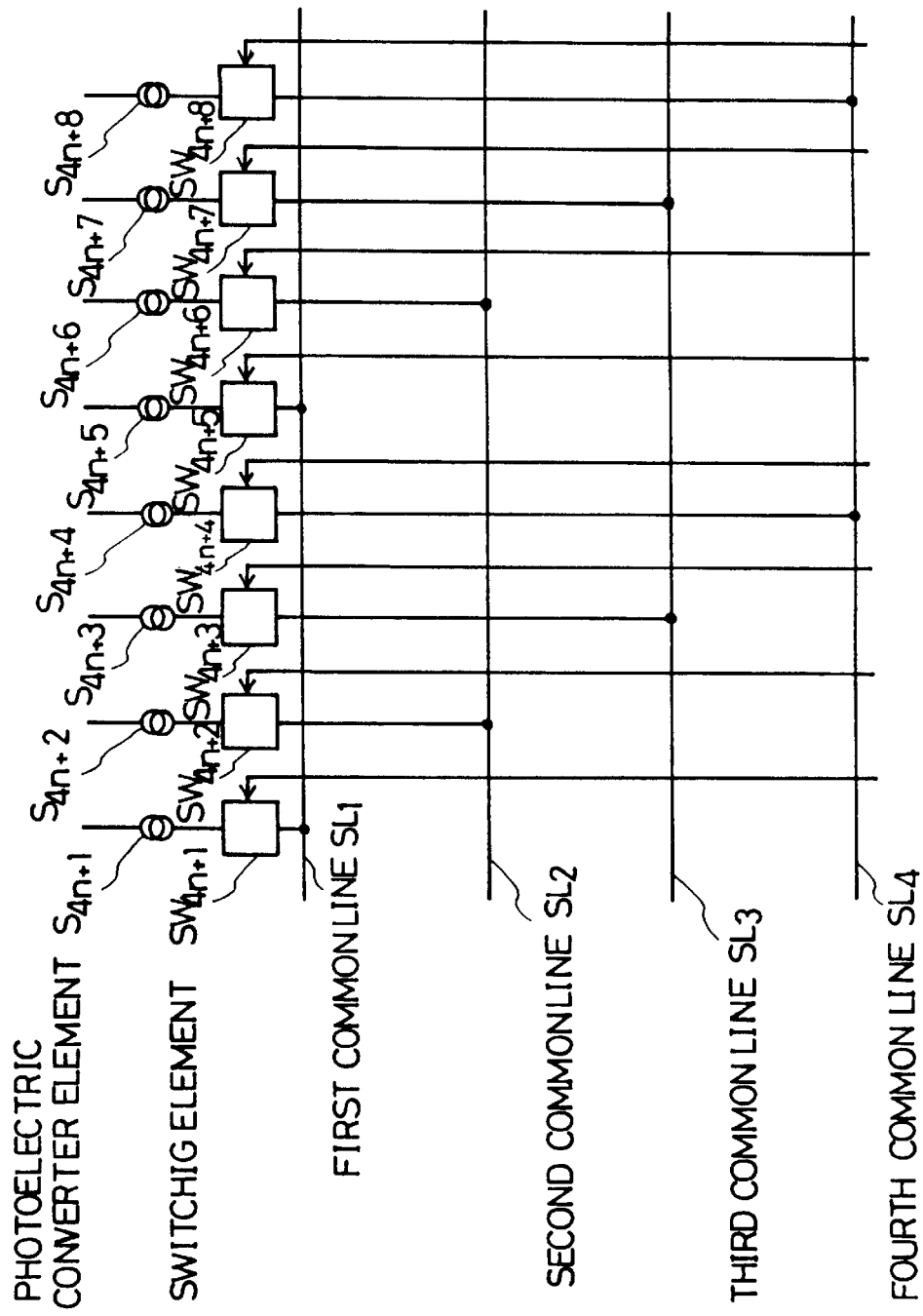
FIG. 34 is a schematic diagram of the circuit of the inventive image sensor IC.
Figure 35:
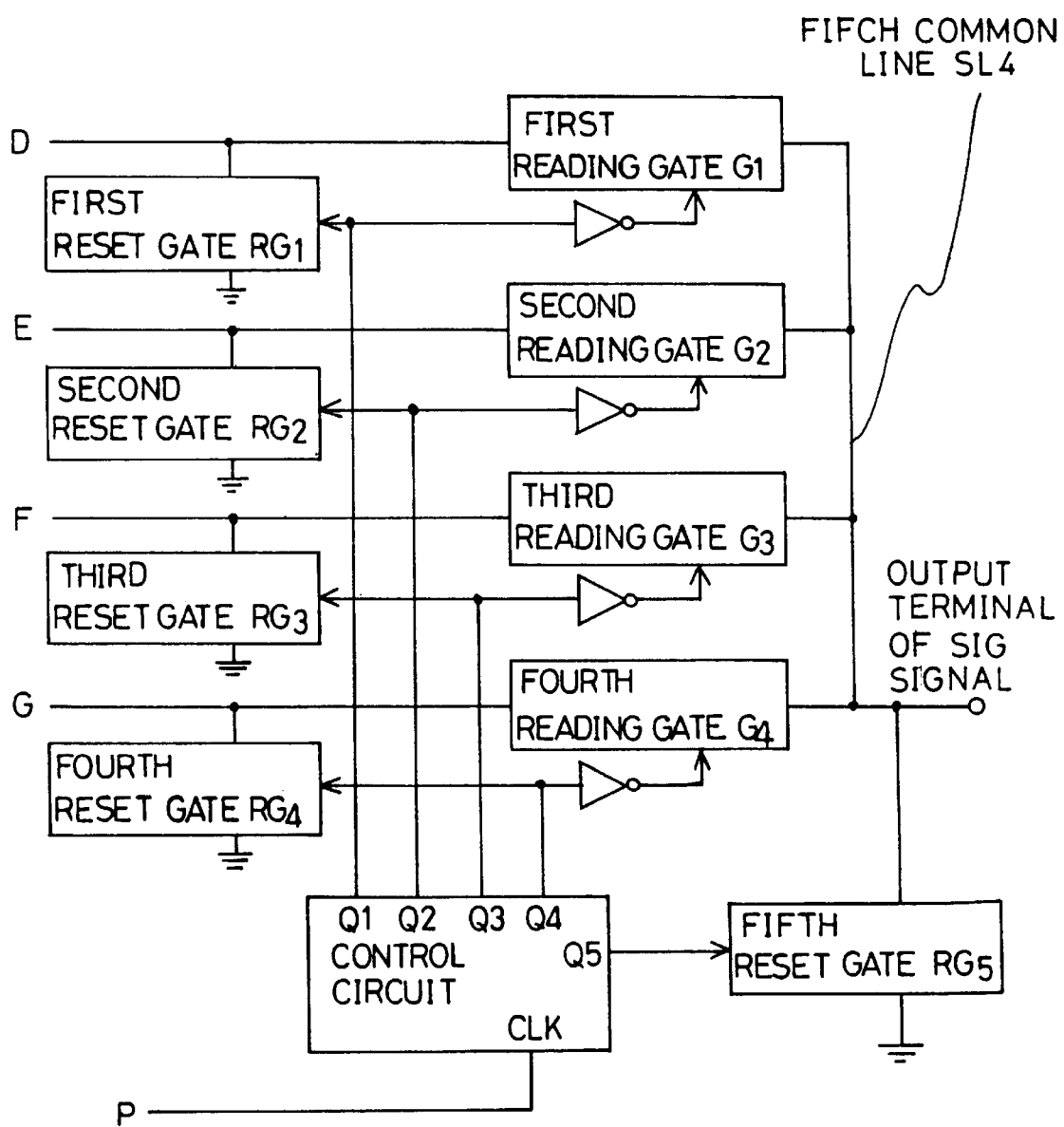
FIG. 35 is a schematic diagram of the circuit of the inventive image sensor IC.
Figure 36:
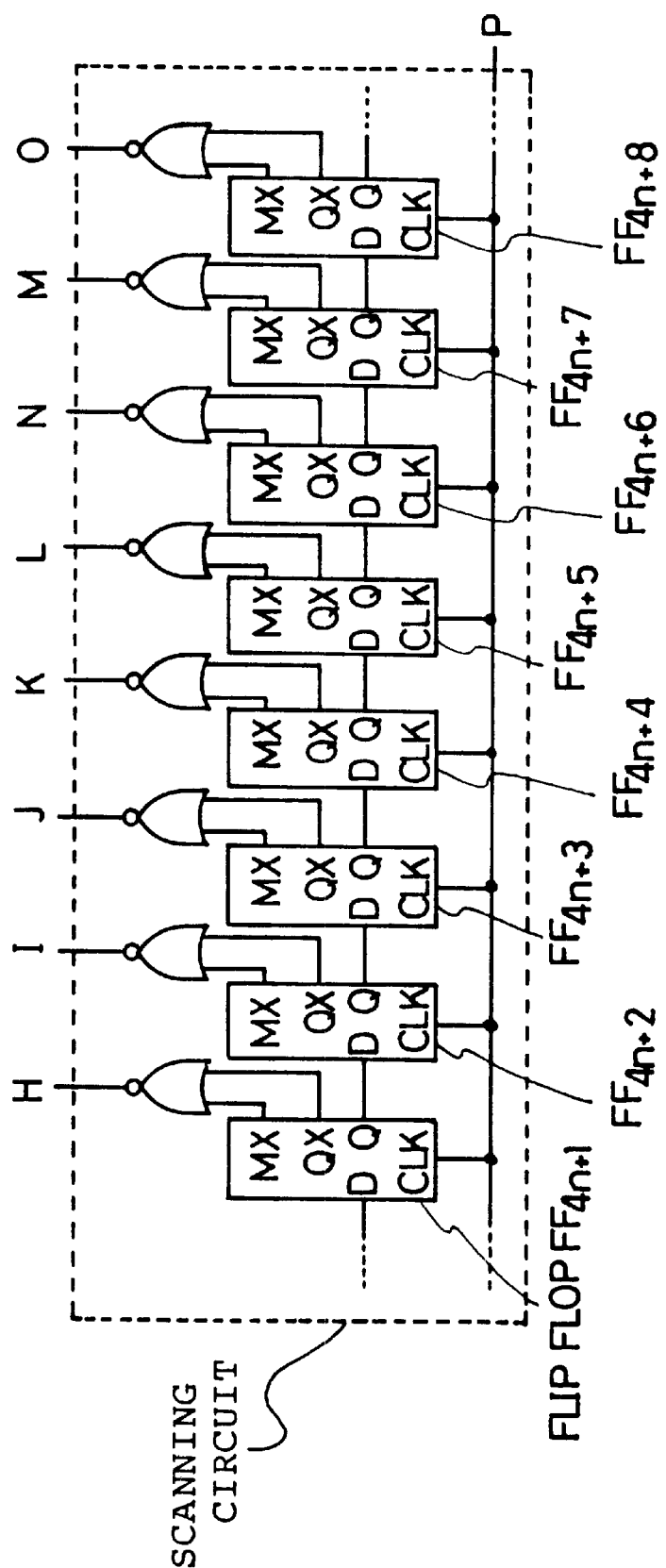
FIG. 36 is a schematic diagram of the circuit of the inventive image sensor IC.

FIGS. 34, 35 and 36 are schematic diagrams of the circuit of the linear image sensor according to an eighth embodiment of the present invention. The present embodiment is what a number of common lines connected to the output terminals of the switching elements of the inventive image sensor is increased.

Output terminals of photoelectric converter elements S 4n+1, S 4n+2 ... are connected with input terminals of switching elements SW 4n+1, SW 4n+2, ... and output terminals of the switching elements SW $4n+1$, SW $4n+2$, . . . are connected with a first common line SL1 when the switching element is a first switching element, with a second common line SL2 when it is a second switching element, with a third common line SL3 when it is a third switching element and a fourth common line SL4 when it is a fourth switching element.

The first common line SL1 is connected with an input terminal of a first reading gate G1 and an input terminal of a first reset gate RG1, the second common line SL2 is connected with an input terminal of a second reading gate G2 and an input terminal of a second reset gate RG2 the third common line SL3 is connected with an input terminal of a third reading gate G3 and an input terminal of a third reset gate RG3 and the fourth common line SL4 is connected to an input terminal of a fourth reading gate G4 and an input terminal of a fourth reset gate RG4.

Output terminals of the first, second, third and fourth reading gates G1, G2, G3 and G4 are short-circuited each other and are connected to a fifth common line SL5. The fifth common line SL5 is connected with a terminal SIG for outputting signals to the outside and an input terminal of a fifth reset gate RG5. The output terminals of the first, second, third, fourth and fifth reset gates described above are connected to a reset power supply which supplies a reset potential (for convenience, it is assumed to be GND in this circuit). Signals for controlling the switching elements SW $4n+1$, SW $4n+2$, . . . are provided by NOR output of an inversion output of an output terminal M and an inversion output of an output terminal Q in each stage of flip-flops FF $4n+1$, FF $4n+2$, . . . in the scanning circuit SC of the shift register. That is, NOR output of the inversion output of the output terminal M and that of the output terminal Q of the n-th stage flip-flop FFn is connected to a control terminal of a n-th switching element SWn.

Figure 37:
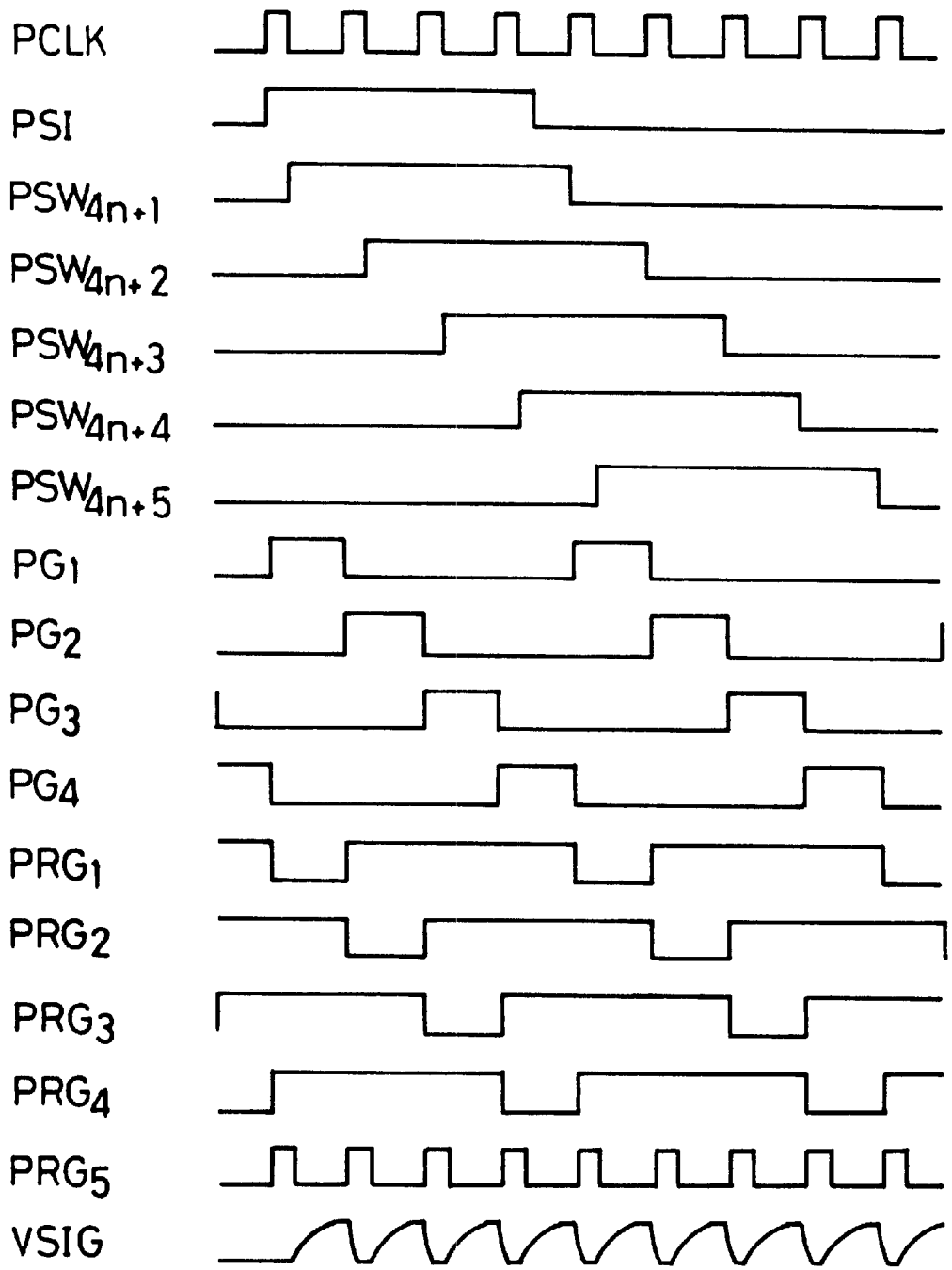
FIG. 37 is a time chart of the circuits of the inventive image sensor IC.
Figure 38A:
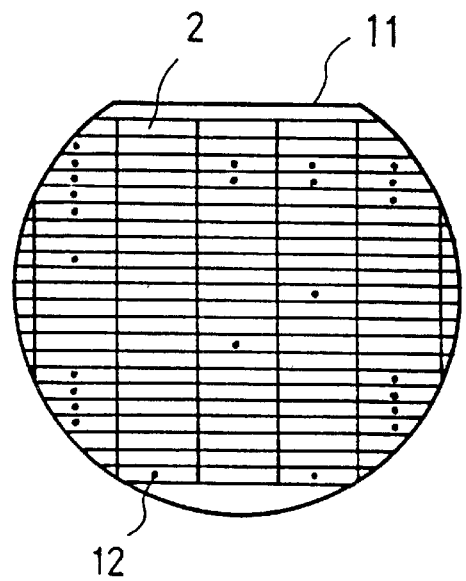
Figure 38B:
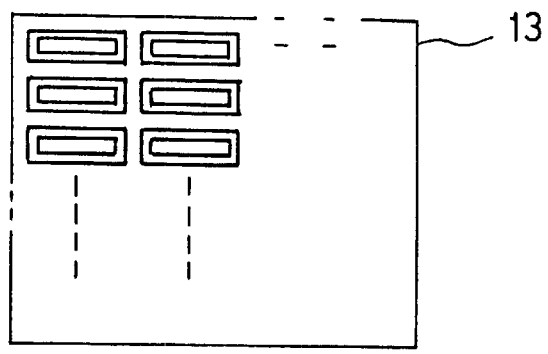
Figure 38C:
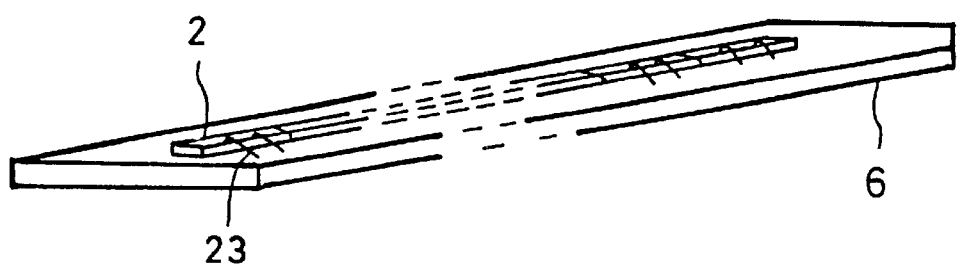

An operation of the circuit described above will be explained based on a time chart shown in FIG. 37. In the figure, PCLK represents a clock pulse having a period of 1/f CK second and is input to the flip-flops FF $4n+1$, FF $4n+2$, . . . and to a clock terminal CLK of a control circuit. PSI represents a start pulse and is input to a data terminal D of the flip-flop FF $4n+1$ of the scanning circuit SC of the shift register. It causes a change of state in the shift register at the trailing edge of the clock pulse PCLK and transfers data of two periods of the clock pulse. PSWi represents a pulse for controlling an i-th (i=$4n+1$, $4n+2$, . . . ) switching element, PGj represents a pulse for controlling a j-th (j=1, 2, 3, 4) reading gate Gj and PRGk (k=1, 2, 3, 4, 5) represents a pulse for controlling a k-th reset gate RGk.

Here, the circuit is designed so that the switching element SWi, the reading gate Gj and the reset gate RGj are energized among the input terminals thereof when the above-mentioned control pulses PSWi, PGj and PRGk are on High level and are de-energized when those pulses are on Low level. That is, the j-th reading gate Gj and the kth reset gate RGk are energized/de-energized by the pulses having phases opposite each other (j=k=1, 2, 3, 4). The fifth reset gate RG5 is repeatedly energized/de-energized almost with the same timing with the clock pulse PCLK. The timing of causing the change of state is caused when the switching element SWi is in the trailing edge of the clock pulse PCLK and one period during which the energized state is kept is equivalent to three and half periods of the clock pulse PCLK. Further, the states of the reading gate Gj and the reset gate RGk change at the leading edge of the clock pulse PCLK and one period thereof in which the energized state is kept is equivalent to one period of the clock pulse PCLK. That of the reset gate RGk is designed so as to be equivalent to three periods of the clock pulse PCLK.

Next, an operation for sequentially reading signals obtained by the plurality of photoelectric converter elements S1 (1=. . . , $4n+1$, $4n+2$, . . . ) to the outside and a signal resetting operation will be explained. At first, data PSI having a period greater than BIT number of the shift register composed of the flip-flops FF $4n+1$, FF $4n+2$, . . . is input to the scanning circuit SC and is transferred in synchronism with the trailing edge of the clock to generate scanning signals so that the plurality of switching elements SWi are sequentially energized one by one. Here, with regard to a signal obtained by the ($4n+1$)-th photoelectric converter element S $4n+1$ for example, the first reading gate G1 and the fifth reset gate RG5 are energized at the leading edge of the clock pulse PCLK. However, because the ($4n+1$)-th switching element SW $4n+1$ is de-energized at this time, the signal obtained by the ($4n+1$)-th photoelectric converter element S $4n+1$ is not read out to the first common line. Accordingly, a reset voltage is output from the signal output terminal SIG because the fifth reset gate RG5 is energized.

Next, when the clock pulse PCLK falls, the fifth reset gate RG5 is de-energized and the ($4n+1$)-th switching element SW $4n+1$ is energized slightly behind it. Then, the signal obtained by the ($4n+1$)-th photoelectric converter element $4n+1$ is read out to the outside via the signal output terminal SIG through the switching element SW $4n+1$ and the first common line SL1 and through the first reading gate G1 and the fifth common line SL5. At this time, the second, third and fourth reading gates G2, G3 and G4 are de-energized. It is noted that the second, third and fourth reset gates RG2 RG3 and RG4 are energized and the second, third and fourth common lines SL2, SL3 and SL4 are fixed to the reset voltage.

Next, when the first reading gate G1 is de-energized at the leading edge of the clock pulse PCLK, the first reset gate RG1, the second reading gate G2 and the fifth reset gate RG5 are energized. Because the ($4n+1$)-th switching element SW $4n+1$ is energized at this time, the ($4n+1$)-th photoelectric converter element $4n+1$ is connected to the reset power supply via the switching element SW $4n+1$, the first common line SL1 and the first reset gate RG1 and is then reset. Further, because the ($4n+2$)-th switching element SW $4n+2$ is de-energized at this time, a signal obtained by the ($4n+2$)-th photoelectric converter element $4n+2$ is not read out to the second common line yet. Accordingly, a reset voltage is output from the signal output terminal SIG because the fifth reset gate RG5 is energized.

Next, when the clock pulse PCLK falls, the fifth reset gate RG5 is de-energized and the ($4n+2$)-th switching element SW $4n+2$ is energized slightly behind it. Then, the signal obtained by the ($4n+2$)-th photoelectric converter element $4n+2$ is read out to the outside via the signal output terminal SIG through the switching element SW $4n+2$ and the second common line SL2 and through the second reading gate G2 and the fifth common line SL5. At this time, the first, third and fourth reading gates G1, G3 and G4 are de-energized. It is noted that the first, third and fourth reset gates RG1 RG3 and RG4 are energized and the first, third and fourth common lines SL1, SL3 and SL4 are fixed to the reset voltage. Due to that, the ($4n+1$)-th switching element SW $4n+1$ is energized and the reset state of the ($4n+1$)-th photoelectric converter element S $4n+1$ is continued.

Next, when the second reading gate G2 is de-energized at the leading edge of the clock pulse PCLK, the second reset gate RG2 the third reading gate G3 and the fifth reset gate RG5 are energized. Because the (4n+2)-th switching element SW 4n+2 is energized at this time, the (4n+2)-th photoelectric converter element 4n+2 is connected to the reset power supply via the switching element SW 4n+2, the second common line SL2 and the second reset gate RG2 and is then reset. Further, because the (4n+3)-th switching element SW 4n+3 is de-energized at this time, a signal obtained by the (4n+3)-th photoelectric converter element 4n+3 is not read out to the third common line yet. Accordingly, a reset voltage is output from the signal output terminal SIG because the fifth reset gate RG5 is energized.

Next, when the clock pulse PCLK falls, the fifth reset gate RG5 is de-energized and the (4n+3)-th switching element SW 4n+3 is energized slightly behind it. Then, the signal obtained by the (4n+3)-th photoelectric converter element 4n+3 is read out to the outside via the signal output terminal SIG through the switching element SW 4n+3 and the third common line SL3 and through the third reading gate G3 and the fifth common line SL5. At this time, the first, second and fourth reading gates G1, G2 and G4 are de-energized. It is noted that the first, second and fourth reset gates RG1, RG2 and RG4 are energized and the first, second and fourth common lines SL1, SL2 and SL4 are fixed to the reset voltage. Due to that, the (4n+1)-th switching element SW 4n+1 and the (4n+2)-th switching element SW 4n+2 are energized and the reset state of the photoelectric converter elements S 4n+1 and S 4n+2 is continued.

Next, when the third reading gate G3 is de-energized at the leading edge of the clock pulse PCLK, the third reset gate RG3, the fourth reading gate G4 and the fifth reset gate RG5 are energized. Because the (4n+3)-th switching element SW 4n+3 is energized at this time, the (4n+3)-th photoelectric converter element 4n+3 is connected to the reset power supply via the switching element SW 4n+3, the third common line SL3 and the third reset gate RG3 and is then reset. Further, because the (4n+4)-th switching element SW 4n+4 is de-energized at this time, a signal obtained by the (4n+4)-th photoelectric converter element 4n+4 is not read out to the fourth common line yet. Accordingly, a reset voltage is output from the signal output terminal SIG because the fifth reset gate RG5 is energized.

Next, when the clock pulse PCLK falls, the fifth reset gate RG5 is de-energized and the (4n+4)-th switching element SW 4n+4 is energized slightly behind it. Then, the signal obtained by the (4n+4)-th photoelectric converter element 4n+4 is read out to the outside via the signal output terminal SIG through the switching element SW 4n+4 and the fourth common line SL4 and through the fourth reading gate G4 and the fifth common line SL5. At this time, the first, second and third reading gates G1, G2 and G3 are de-energized. It is noted that the first, second and third reset gates RG1, RG2 and RG3 are energized and the first, second and third common lines SL1, SL2 and SL3 are fixed to the reset voltage. Due to that, the (4n+1)-th switching element SW 4n+1, the (4n+2) switching element SW 4n+2 and the (4n+3) switching element SW 4n+3 are energized respectively and the reset state of the photoelectric converter elements S 4n+1, S 4n+2 and S4n+3 is continued.

Next, when the fourth reading gate G4 is de-energized at the leading edge of the clock pulse PCLK, the (4n+1)-th switching element SW 4n+1 is de-energized and the (4n+1)-th photoelectric converter element S 4n+1 is released from the reset state and enters the charge storing state, i.e., the photoelectric conversion state. Further, the fourth reset gate RG4, the first reading gate G1 and the fifth reset gate RG5 are energized. Because the (4n+4)-th switching element SW 4n+4 is energized at this time, the (4n+4)-th photoelectric converter element 4n+4 is connected to the reset power supply via the switching element SW 4n+4, the fourth common line SL4 and the fourth reset gate RG4 and is then reset. Further, because the (4n+5)-th switching element SW 4n+5 is de-energized at this time, a signal obtained by the (4n+5)-th photoelectric converter element 4n+5 is not read out to the first common line yet. Accordingly, a reset voltage is output from the signal output terminal SIG because the fifth reset gate RG5 is energized.

Next, when the clock pulse PCLK falls, the fifth reset gate RG5 is de-energized and the (4n+5)-th switching element SW 4n+5 is energized slightly behind it. Then, the signal obtained by the (4n+5)-th photoelectric converter element 4n+5 is read out to the outside via the signal output terminal SIG through again the switching element SW 4n+5 and the first common line SL1 and through the first reading gate G1 and the fifth common line SL5.

The signals obtained by the plurality of photoelectric converter elements are read out sequentially to the outside by repeating the procedure described above and the reset state is three periods of the clock pulse PCLK. It is three times as compared to that in the first embodiment, so that even when the circuit is driven by clock pulse having a period of 1/(3×fCK) second, the reset state lasts for the equal period and a reduction of a quantity of residual charge is also equalized. Further, even if the DUTY width of the clock pulse changes, the period of the reset state will not be changed.

Further, because the reading gate Gk has been already in a stationary state when the signals are read out to the outside as any of the switching elements or the reading gates is turned from the de-energized state to the energized state, no fixed pattern noise nor gate switching noise will be overlapped with the photoelectric conversion signals and thus the S/N ratio will not be lowered. Thus, the operation of the linear image sensor in which the period of the reset state turns out to be 1/((m−1)×fck) when the number of common lines connected to the output terminals of the switching elements are increased to m is achieved.

As described above, according to the seventh and eighth embodiments, the change of the period for resetting each photoelectric converter element may be realized by the minimum transistor size just by adding the circuits within the flip-flop for the scanning circuit. Due to that, the period of the reset operation may be prolonged without increasing a number of devices so much and while keeping the chip size thin and small. Even more, the quantity of residual charge may be reduced and a residual image characteristic may be improved without depending on the DUTY of the clock pulse. Still more, good image signals may be obtained without having any gate and reset gate switching noise for switching the plurality of common lines or fixed pattern noise.

An inventive IC assembling substrate and an assembling method of the same will now be explained as a ninth embodiment with reference to the drawings.

Figure 39A:
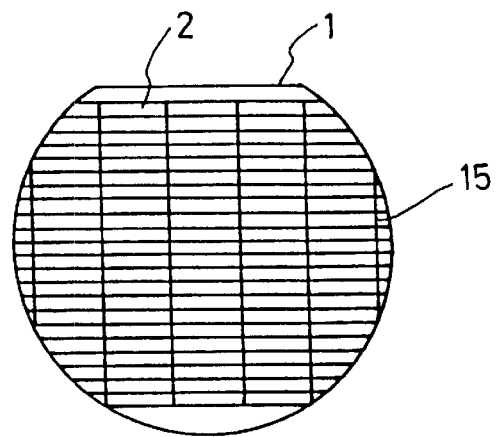

FIG. 39a is a plan view of a silicon wafer for obtaining ICs used in the inventive IC assembling substrate.

A plurality of ICs 2 having the same pattern is printed in a matrix on the surface of the silicon wafer 1 by using a common photolithography. Each IC is separated by scribe lines 15 provided perpendicularly in the horizontal and vertical directions. The ICs used in the inventive IC assembling substrate have a shape whose width is longer at least than that of the pad (normally 50 to 100 μm) and thinner than 400 μm. The length of the IC is prolonged to 5 mm to 15 mm in order to reduce a number of chips used in assembling. A stepper is used to thin the width of the IC to 400 μm or less. Accordingly, the length of the IC is within a maximum transfer length of the stepper of 15 mm. Further, the length is kept within 15 mm to keep a mechanical strength because the chip is very thin and long. The silicon wafer 1 has a thickness of 600 μm in a case of a 6-inch wafer when it is processed by oxidation and etching for example in the IC process. Because the IC is thin and long, the ICs may be printed efficiently by using a large wafer of more than 6 inches. When the diameter of the wafer is large, the ICs are printed and worked by keeping the thickness of the wafer to 400 μm or more in order to maintain the mechanical strength of the wafer.

Because the width of the IC used in the present invention is so thin as 400 μm or less, it is necessary to lower the gravity thereof to stably place it when mounting on the assembling substrate. Accordingly, the back of the silicon wafer 1 is cut and thinned to about 350 μm by polishing after printing the ICs on the surface of the silicon wafer 1.

Next, electrical characteristics of all the ICs on the silicon wafer 1 are measured by a tester. The result of the measurement of all the ICs is stored in a floppy disk 9 which is an electrically readable storage means. Data discriminating good items from defective items of all the ICs is stored in correspondence with the coordinate of the ICs 2 in a matrix on the silicon wafer 1. Next, an ultraviolet adhesive tape 16 is adhered on the back of the silicon wafer 1. This tape is easily elastically deformed and the adhesive strength may be controlled by irradiating ultraviolet. It is adhered on the silicon wafer 1 fully so that it is not peeled off when the silicon wafer 1 is scribed. The ultraviolet adhesive tape may be adhered along the surface homogeneously without creating any bubble between the silicon wafer 1 and the tape and without having any irregularity by irradiating ultraviolet.

Next, the surface of the silicon wafer 1 is scribed by repeating vertical and horizontal reciprocal movements along the scribe line 15. The ICs mechanically connected each other on the silicon wafer 1 are separated spatially by the scribe.

Figure 39B:
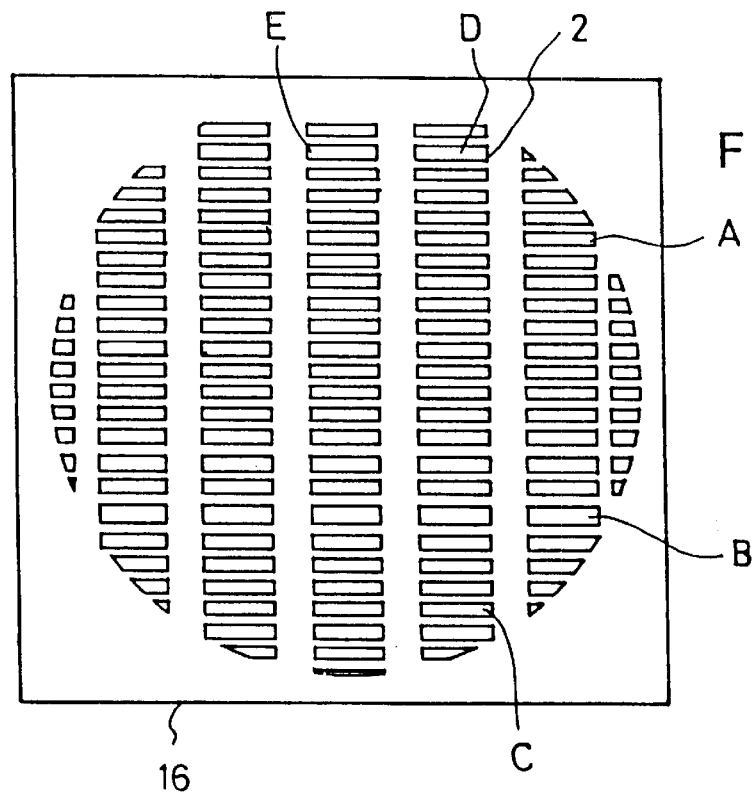

Next, the adhesive tape 16 is stretched two-dimensionally along the tape surface as shown in FIG. 39b. Then, each of the ICs separated by the scribe is separated further more than a width of the scribe line.

Figure 39C:
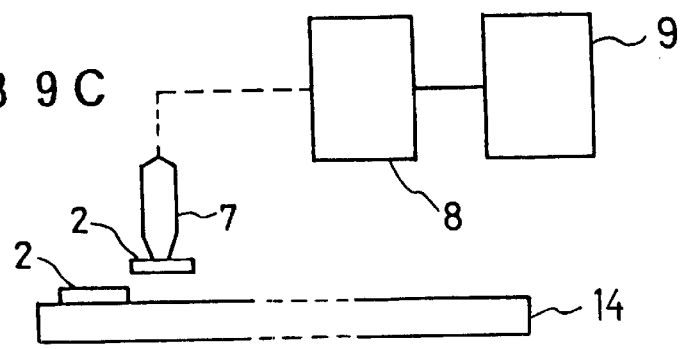

Next, the ICs 2 each separated are picked up by a robot 7 and are placed on a head substrate 14 as shown in FIG. 39c. The robot 7 is controlled by a computer 8. The computer 8 reads the data of electrical characteristics of the ICs within the silicon wafer 1 given by the probing test to select only good items and to control the robot 7 so as to place them. In the case of the image sensor ICs, sensor sensitivity differs within the silicon wafer. The use of the inventive assembling method allows the ICs whose characteristic is close to be mounted readily. The fluctuation among the sensors after the assembly may be reduced considerably by programming the computer 8 so as to place the ICs sequentially from ones whose characteristic is close.

The inventive IC assembling substrate provides a function spatially long such as an image sensor or a current driver by placing a plurality of ICs in a line. Accordingly, it is important to reduce a difference of sensor sensitivity at the both ends of the assembling substrate in the image sensor. In the current driver, it is important to reduce a difference of current values at the both ends of the assembling substrate so that a color on a thermosensible paper is kept uniform.

The difference of characteristics of the ICs within the assembling substrate may be reduced considerably by selecting each IC sequentially corresponding to the characteristic data of the ICs within the floppy disk and by placing them on the assembling substrate.

Figure 40:
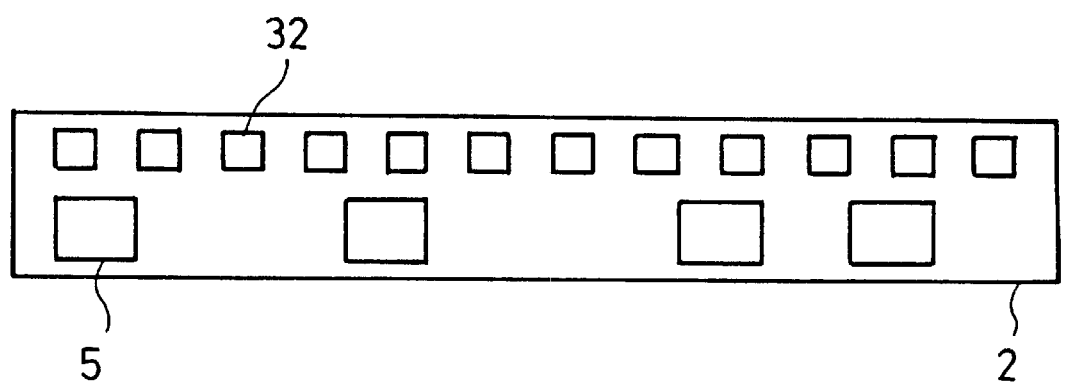
FIG. 40 is a plan view of the IC used in the IC assembling substrate.
Figure 41:
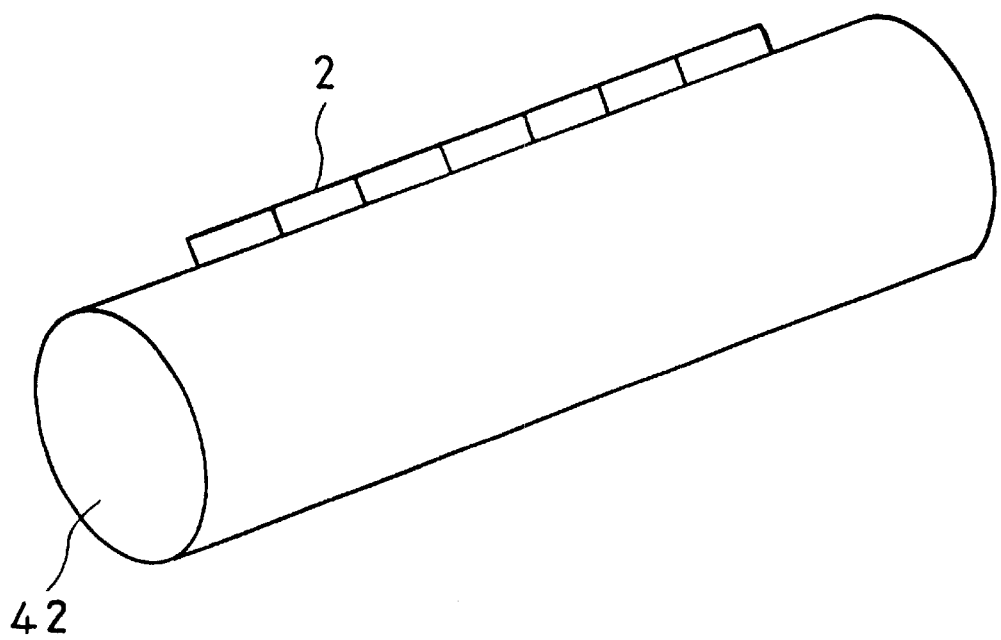
FIG. 41 is a perspective view of the inventive IC assembling substrate.

FIG. 40 is a plan view of the IC used in the inventive IC assembling substrate. Formed on the IC chip 2 are four or more pads 5 for a power supply, a signal supply and output terminals. Further, a plurality of transistors 32 having the identical shape are placed periodically along the longitudinal direction of the chip. For example, photodiodes or phototransistors are provided on an image sensor IC linearly with a period of reading pitch along the scanning direction. On an IC for thermal head for flowing current to resistors of a thermosensible paper, driver transistors are linearly and periodically placed in correspondence with resistors provided with respect to the pitch of each thermosensible paper. The chip is created so that its width is thicker than 50 to 100 μm which is the width of the pad and thinner than 400 μm. The image sensor IC which the inventors et al. have developed this time have a width of 330 μm after the scribe which is thinner than 350 μm, the thickness of the chip. By thinning the IC as such, it may be mounted on a cylindrical assembling substrate 42 as shown in FIG. 41. The adhesive strength between the assembling substrate and the ICs may be fully kept even if the section of the assembling substrate 42 is circular so long as the assembling substrate 42 is linear in the direction of the placement of the ICs because the chip is very thin.

An inventive image sensor IC, an IC assembling substrate and an assembling method of the same will now be explained as a tenth embodiment with reference to the drawings.

FIG. 39a is a plan view of a silicon wafer for obtaining ICs used in the inventive IC assembling substrate.

The plurality of ICs 2 having the same pattern is printed in a matrix on the surface of the silicon wafer 1 by using a common photolithography. Each IC is separated by scribe lines 15 provided perpendicularly in the horizontal and vertical directions. The ICs used in the inventive IC assembling substrate have a thin shape whose width is 400 μm for example. The length of the IC is prolonged to 5 mm to 15 mm in order to reduce a number of chips used in assembling. A stepper is used to thin the width of the IC. Accordingly, the length of the IC is within a maximum transfer length of the stepper of 15 mm. Further, the length is kept within 15 mm to keep a mechanical strength because the chip is very thin and long. The silicon wafer 1 has a thickness of 600 μm in a case of a 6-inch wafer when it is processed by oxidation and etching for example in the IC process. Because the IC is thin and long, the ICs may be efficiently printed by using a large wafer of more than 6 inches. When the diameter of the wafer is large, the ICs are printed and worked by keeping the thickness of the wafer to 400 μm or more in order to maintain the mechanical strength of the wafer.

FIG. 40 is a plan view of the IC mounted on the inventive IC assembling substrate. Formed on the IC 2 are four or more pads 5 for a power supply, signal supply and output terminal. Further, a plurality of light receiving elements 32 having an identical shape and composed of a phototransistor or a photodiode are placed periodically along the longitudinal direction of the chip. The light receiving elements 32 are provided linearly with a period of reading pitch along the scanning direction. Charge stored in the light receiving element is output from the output terminal in order from the leftmost light receiving element. The chip is thin and long considerably as it has 400 μm of width and 8 mm of length for example.

FIG. 42 is an enlarged view of part of the surface of the silicon wafer 1. In the figure, the ICs adjoining in the direction vertical to the direction in which the light receiving elements of the IC are arranged are formed so that they have a relationship of point symmetry each other. For example, an IC 2A has a pattern equivalent to an IC 2B which is turned over by 180 degrees. That is, patterns of one set of two chips which are placed in the relationship of point symmetry are repeatedly placed on the wafer. Scribe lines 15 are provided between each of the ICs as space for cutting and separating them afterward. Such patterns may be formed by surfacing a plurality of sets of patterns, in which two chips placed in the relationship of point symmetry are set as one set, on a reticle set on the stepper.

Because the width of the IC is so thin as about 400 μm, it is necessary to lower the gravity thereof to stably place it when mounting on the assembling substrate. Accordingly, the back of the silicon wafer 1 is cut and thinned to about 350 μm by polishing after printing the ICs on the surface of the silicon wafer 1.

Next, electrical characteristics of all the ICs on the silicon wafer 1 are measured by a tester by placing the silicon wafer 1 on a wafer stage. FIG. 43 is an enlarged view of a center part of a probe card attached to a prober in order to test the ICs 2 within the silicon wafer 1. The IC 2 is tested by contacting the tips of probes 45 attached to the probe card to the pads 5 of the IC 2. The probes 45 serve to electrically contact the IC tester with the IC 2. The IC tester discriminates the IC 2 whether it is good or defective. According to the present invention, the downward probes 45 are positioned so as to contact with pads of the IC 2A in FIG. 42 and the upward probes 45 to contact with pads of the IC 2B. That is, two chips may be tested in the same time. Then, the wafer stage is moved with a pitch twice of that of the short side of the IC to test next two chips. This method allows a testing time of one wafer to be cut into about half as compared to the conventional method of testing chips one by one.

While light needs to be irradiated to the light receiving element of the IC in the test of image sensor IC, light is irradiated to the ICs 2A and 2B through an opening window 46 of the probe card according to the present invention. Because the light receiving element arrays of the ICs 2A and 2B face each other and the pads are positioned respectively on the opposite sides from the light receiving element arrays that face each other at this time, the probes will not block the light entering the light receiving elements during the probe test. When the ICs are all placed in the same direction in contrary, light receiving elements of either one IC among two chips would be shaded by the probes 45 and light might not be irradiated uniformly on the light receiving element array. Accordingly, it would be difficult to test two chips in the same time because they cannot be discriminated accurately whether they are good or defective. That is, two chips may be tested accurately according to the present invention because the ICs that adjoin in the direction vertical to the direction in which the IC pixels are arranged are formed so that they have a relationship of point symmetry.

Next, fail marks are marked on ICs determined to be defective based on the test result. Or, the discrimination result is recorded in a floppy disk or the like together with coordinate data of the ICs.

Next, an ultraviolet adhesive tape 16 is adhered on the back of the silicon wafer 1. This tape is easily elastically deformed and the adhesive strength may be controlled by irradiating ultraviolet. It is adhered on the silicon wafer 1 fully so that it will not be peeled off when the silicon wafer 1 is scribed.

Next, the surface of the silicon wafer 1 is scribed by repeating vertical and horizontal reciprocal movements along the scribe lines 15. The ICs mechanically connected each other on the silicon wafer 1 are separated spatially by the scribe.

Next, the adhesive tape 16 is stretched two-dimensionally along the tape surface as shown in FIG. 39b. Then, each of the ICs separated by the scribe is separated further more than a width of the scribe line.

Next, the ICs 2 each separated are picked up by a robot 7 and are placed on a head substrate 14 as shown in FIG. 39c. The robot 7 is controlled by a computer 8. The computer 8 reads the data of electrical characteristics of the ICs within the silicon wafer 1 given by the probing test to select only good items and to control the robot 7 so as to place them. Or, the fail marks marked on the defective IC chips are recognized image-wise to select only good chips.

According to the present invention, the robot 7 picks up the ICs 2 and places them sequentially on the assembling substrate 14 as described above. At this time, chips which have been adjoined each other on the wafer may be adjoined also on the assembling substrate 14 by placing the chips sequentially so that they are connected. For example, when the chips are placed sequentially downward from a good chip A at the top of the right edge row shown in FIG. 39b and then a chip B is placed, a good chip C at the bottom of the next row is placed. Next, chips are placed sequentially upward from the chip C. Chips D and E are then placed in the same manner. When the chips have been placed on the 6 on the way, they are placed on the next assembling substrate. Since the orientations of the IC chips 2 in even number rows and in odd number rows are opposite on the wafer, they need to be placed by alternately changing the orientation by 180 degrees.

In the case of the image sensor ICs, sensitivity of light receiving elements fluctuates within the silicon wafer. It is considered to be caused by an uneven thermal distribution within the wafer surface and by an uneven thickness of various insulating films in the IC manufacturing process, and the sensitivity tends to change continuously within the wafer. Accordingly, the closer the distance between the light receiving elements on the wafer, the smaller the difference of sensitivity may be and the farther the distance, the larger the difference of sensitivity may be.

For example, if the right chips have higher sensitivity in FIG. 39b and when uniform light is irradiated to the assembling substrate 14 on which the IC chips are placed as described above, its output turns out as shown in FIG. 45. FIG. 45 is an output waveform of the inventive image sensor head, showing a case when a number of IC chips is six. Because the adjoining IC chips have had opposite orientations on the wafer, directions of inclination of the outputs are opposite alternately. Accordingly, there is almost no difference of outputs between the adjoining IC chips, because the adjoining light receiving elements between the adjoining chips placed on the assembling substrate have been placed very closely on the wafer. For example, in a case of an IC having 8 mm of length and 0.4 mm of width, adjoining light receiving elements between adjoining chips are separated on the wafer only 0.8 mm in maximum which is ⅟10 as compared to about 8 mm of distance between the light receiving elements at the both ends within one chip.

If the ICs are all placed in the same orientation on the wafer in contrary and when uniform light is irradiated to the assembling substrate on which the ICs are placed in the same manner, its output turns out as shown in FIG. 44. FIG. 44 shows an output waveform of the prior art image sensor head. There is a difference of level in the outputs at the connecting portion of the chip. That is, the sensitivity is sharply changing and the output must be corrected per each bit. In FIG. 45, however, no output needs to be corrected or it may be corrected by an average value per several bits because there is no portion where the sensitivity sharply changes. Accordingly, it requires less memory of the external circuit and simplifies the calculation of the correction.

In case when there is a defective chip in the process of the present invention described above, only the defective chip is treated as defective when an inclination of output of chips adjoining the defective chip is small within the chip. In concrete, it is marked with a fail mark or its determination result is recorded in a floppy disk or the like together with coordinate data of the IC. When an inclination of an output of the chips adjoining the defective chip is large within the chip, however, either one chip among the two chips adjoining the defective chip is also treated as defective. By doing so, no portion in which the sensitivity sharply change is brought about between adjoining chips.

There is another method of treating one chip among the two chips as defective unconditionally when there is a defective chip. There is also another method of treating only the defective chip as defective and of mounting by skipping the next chip when there is a defective chip in mounting by a robot. Either of the methods described above allows the image sensor head having less difference of levels of outputs at the connecting portion of the IC chips to be obtained.

As described above, according to the tenth embodiment, the ICs adjoining in the direction vertical to the direction in which the light receiving elements of the IC are arranged are formed so that they have the relationship of point symmetry each other, so that two chips can be tested accurately in the same time and thus the manufacturing cost may be reduced. Further, the difference of levels of the outputs may be reduced between adjoining chips, so that the IC assembling substrate having less fluctuation between the ICs may be manufactured.

An inventive image sensor IC, an IC assembling substrate and an assembling method of the same will now be explained as an eleventh embodiment with reference to the drawings.

FIG. 46a is a plan view of a silicon wafer for obtaining ICs placed in the inventive IC assembling substrate.

The plurality of ICs 2 having the same pattern is printed in a matrix on the surface of the silicon wafer 1 by using a common photolithography. Each IC is separated by scribe lines 15 provided perpendicularly in the horizontal and vertical directions. The ICs used in the inventive IC assembling substrate have a thin shape whose width is 400 μm for example. The length of the IC is prolonged to 5 mm to 15 mm in order to reduce a number of chips used in assembling. A stepper is used to thin the width of the IC. Accordingly, the length of the IC is within a maximum transfer length of the stepper of 15 mm. Further, the length is kept within 15 mm to keep a mechanical strength because the chip is very thin and long. The silicon wafer 1 has a thickness of 600 μm in a case of a 6-inch wafer when it is processed by oxidation and etching for example in the IC process. Because the IC is thin and long, the ICs may be printed efficiently by using a large wafer of more than 6 inches. When the diameter of the wafer is large, the ICs are printed and worked by keeping the thickness of the wafer to 400 μm or more in order to maintain the mechanical strength of the wafer.

Figure 47:
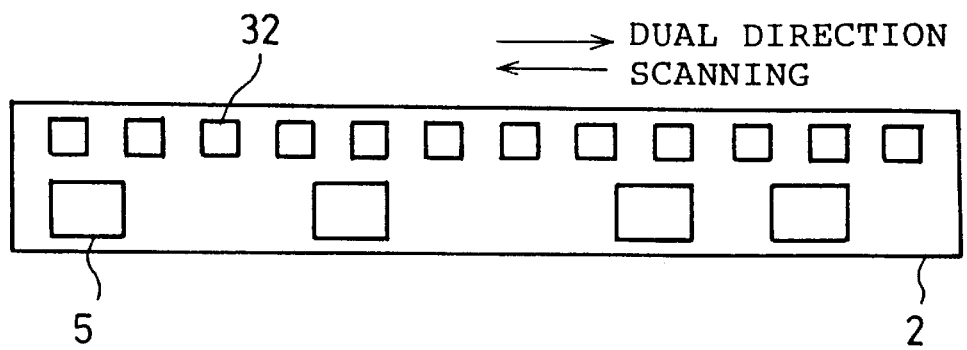
FIG. 47 is a plan view of the IC used in the IC assembling substrate.

FIG. 47 is a plan view of the IC mounted on the inventive IC assembling substrate. Formed normally on the IC 2 are six or more pads 5 for a power supply, input/output terminals for control and image signal output terminal. Further, a plurality of light receiving elements 32 having an identical shape and composed of a phototransistor or a photodiode are placed periodically along the longitudinal direction of the chip. The light receiving elements 32 are provided linearly with a period of reading pitch along the scanning direction. Charge stored in the light receiving element is output from the image signal output terminal by scanning sequentially from the leftmost light receiving element toward the right direction or reversely from the rightmost light receiving element toward the left direction. That is, it has a dual-directional scanning function. The chip is thin and long considerably as it has 400 μm of width and 8 mm of length for example.

Figure 48:
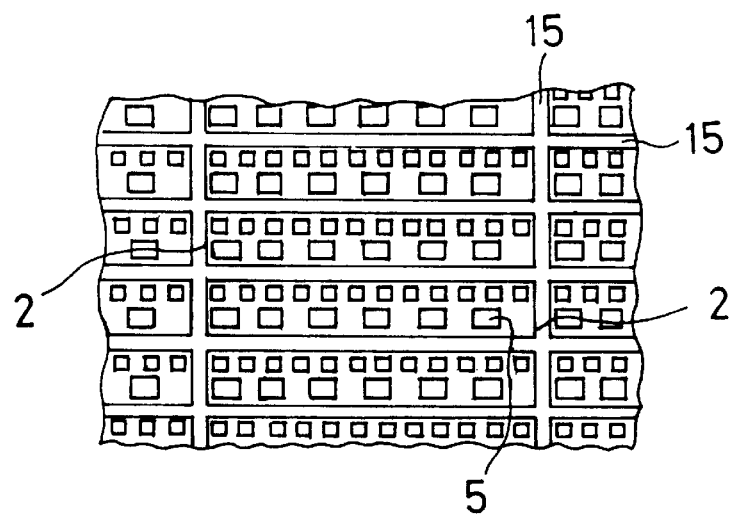
FIG. 48 is an enlarged view of part of the surface of the inventive silicon wafer.

FIG. 48 is an enlarged view of part of the surface of the silicon wafer 1.

Because the width of the IC is so thin as about 400 μm, it is necessary to lower the gravity thereof to stably place it when mounting on the assembling substrate. Accordingly, the back of the silicon wafer 1 is cut and thinned to about 350 μm by polishing after printing the ICs on the surface of the silicon wafer 1.

Figure 49:
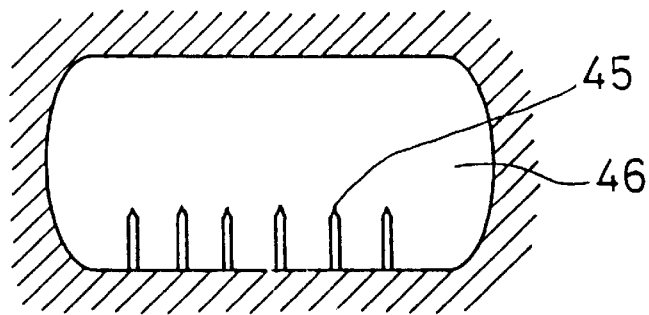
FIG. 49 is an enlarged view of a center part of an inventive probe card.

Next, electrical characteristics of all the ICs on the silicon wafer 1 are measured by a tester by placing the silicon wafer 1 on a wafer stage. FIG. 49 is an enlarged view of a center part of a probe card attached to a prober in order to test the IC 2 within the silicon wafer 1. The IC 2 is tested by contacting the tips of probes 45 attached to the probe card to the pads 5 of the IC 2. The probes 45 serve to electrically contact the IC tester with the IC 2. The IC tester discriminates the IC 2 whether it is good or defective.

Next, fail marks are marked on ICs determined to be defective based on the test result. Or, the discrimination result is recorded in a floppy disk or the like together with coordinate data of the ICs.

Next, the ultraviolet adhesive tape 16 is adhered on the back of the silicon wafer 1. This tape is easily elastically deformed and its adhesive strength may be controlled by irradiating ultraviolet. It is adhered on the silicon wafer 1 fully so that it will not be peeled off when the silicon wafer 1 is scribed.

Next, the surface of the silicon wafer 1 is scribed by repeating vertical and horizontal reciprocal movements along the scribe lines 15. The ICs mechanically connected each other on the silicon wafer 1 are separated spatially by the scribe.

Next, the adhesive tape 16 is stretched two-dimensionally along the tape surface as shown in FIG. 46b. Then, each of the ICs separated by the scribe is separated further more than a width of the scribe line.

Next, the ICs 2 each separated are picked up by the robot 7 and are placed on the head substrate 14 as shown in FIG. 46c. The robot 7 is controlled by the computer 8. The computer 8 reads the data of electrical characteristics of the ICs within the silicon wafer 1 given by the probing test to select only good chips and to control the robot 7 so that it places them. Or, the fail marks marked on the defective IC chips are recognized image-wise to select only good chips.

According to the present invention, the robot 7 picks up the ICs 2 after dicing them adjoining on the wafer and places them sequentially on the assembling substrate 14 as described above. If the adjoining IC chip is defective, normal IC chips in the vicinity thereof are placed. At this time, chips which have been adjoined each other on the wafer may be adjoined also on the assembling substrate 14 by placing the chips sequentially so that they are connected. For example, when the chips are placed sequentially downward from a good chip A at the top of the left edge row shown in FIG. 46b and then a chip B is placed, a good chip C at the bottom of the next row is placed. Next, chips are placed sequentially upward from the chip C. Chips D and E are then placed in the same manner. When the chips have been placed on the assembling substrate on the way, they are placed on the next assembling substrate.

In the case of the image sensor ICs, sensitivity of light receiving elements fluctuates within the silicon wafer. It is considered to be caused by an uneven thermal distribution within the wafer surface and by an uneven thickness of various insulating films in the IC manufacturing process, and the sensitivity tends to change continuously within the wafer. Accordingly, the closer the distance between the light receiving elements on the wafer, the smaller the difference of sensitivity may be and the farther the distance, the larger the difference of sensitivity may be.

For example, assume here that the right chips have higher sensitivity in FIG. 46b. Here, a case when six IC chips are mounted on the assembling substrate by three ways of pickup sequence of d1, d2 and d3 in FIG. 50 will be explained. When uniform light is irradiated to the assembling substrate on which the IC chips are placed so that they are oriented in the same direction, their outputs turn out as shown in FIGS. 51d1 through 51d3, respectively. Numerals (1) through (6) in the figures represent the ICs and show the pickup sequence. As it is apparent from any of the figures, a sharp difference of sensitivity is brought about between the neighboring IC chips at several places. FIGS. 52d1 through 52d3 show output waveforms of the inventive image sensor head and show results obtained when the present invention is applied to FIGS. 51d1 through 51d3. FIG. 52d1 shows the result when the IC chips (2), (4) and (6) are placed by turning by 180 degrees on the plane of the assembling substrate to reverse the scanning direction of the light receiving elements within the IC chips. FIG. 52d2 shows the result when the IC chips (2) and (5) are placed by turning by 180 degrees on the plane of the assembling substrate to reverse the scanning direction of the light receiving elements within the IC chips. FIG. 52d3 shows the result when the IC chips (5) and (6) are placed by turning by 180 degrees on the plane of the assembling substrate to reverse the scanning direction of the light receiving elements within the IC chips. By this way, the linear image sensor in which the difference of outputs between the neighboring IC chips is extremely small may be realized because the adjoining light receiving elements between the adjoining chips placed on the assembling substrate have been placed very closely on the wafer. For example, in a case of an IC having 8 mm of length and 0.4 mm of width, adjoining light receiving elements between adjoining chips are separated on the wafer only 0.8 mm in maximum which is 1/20 as compared to about 8 mm of distance between the light receiving elements at the both ends within one chip.

Figure 53A:
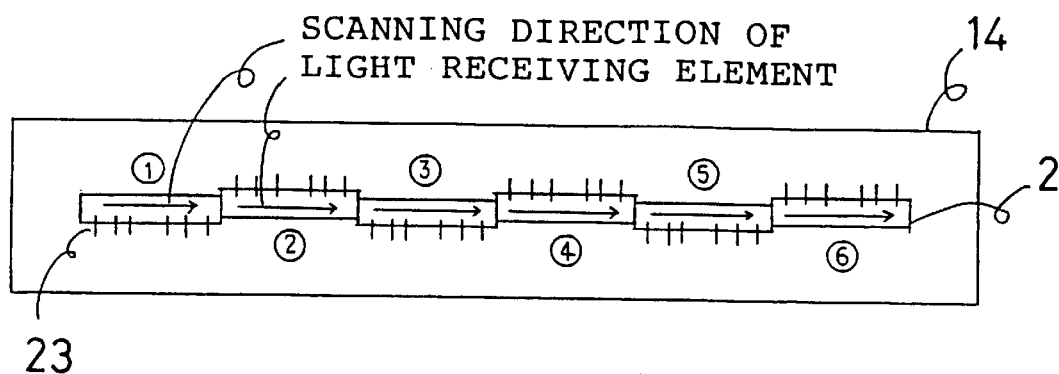
FIGS. 53a and 53b are plan views of another inventive image sensor IC.
Figure 53B:
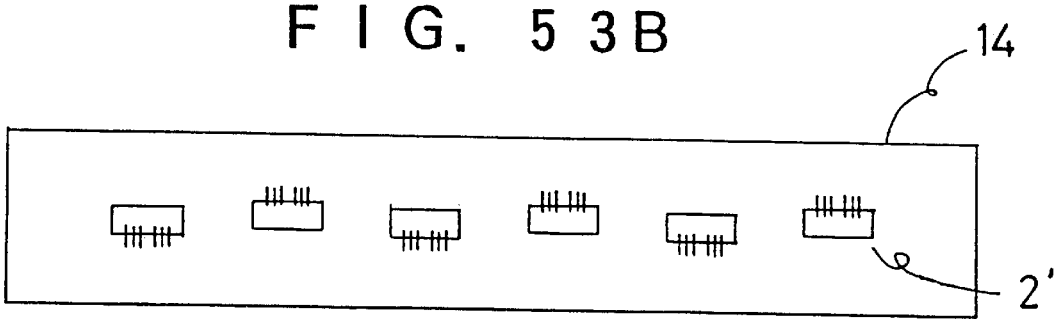
Figure 54A:
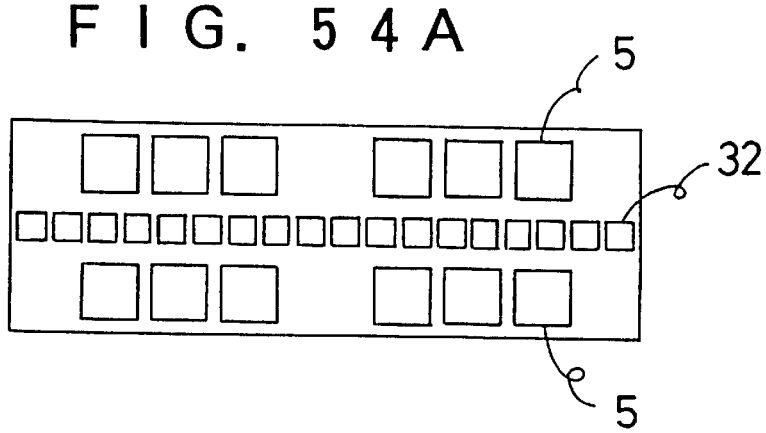
FIG. 54a is a plan view of another inventive image sensor IC.
Figure 54B:
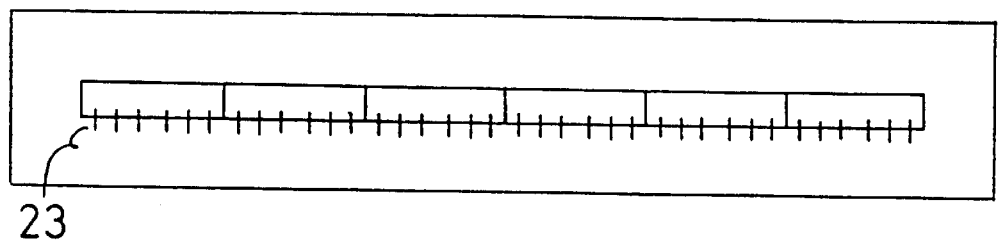

Further, as it can be seen when FIGS. 52d1 through 52d3 are compared, the way shown in FIG. 52d1 in which the ICs placed in the direction vertical to the direction of array of the light receiving element within the IC chip is likely to reduce the an uneven sensitivity as the linear image sensor after they are placed on the assembling substrate. FIG. 53a is a plan view showing the linear image sensor head after placing the IC chips showing the output state shown in FIG. 52d1. The scanning direction within the IC chips is also shown in the figure. The image sensor IC in FIG. 53a has a configuration in reading image data of an original via an equal magnification lens (e.g., SLA). A gap between the adjoining IC chips is reduced. When the image data is read by using each individual reduction lens for each IC chip, not using the equal magnification lens, IC chips 2' in which a distance between light receiving elements is reduced are placed as shown in FIG. 53b. In the case of FIG. 53a, wires 23 extend from the pads to the both sides of the light receiving element array and an optical condition differs among the IC chips. The pads 5 are placed on the both sides so as to sandwich the light receiving element array as shown in FIG. 54a to be able to drive the IC chip from either side to obtain a high image quality. The use of such IC chips allows the linear image sensor to be realized by providing wires only one side of the light receiving element array as shown in FIG. 54b when the present invention is applied.

Because there is no portion where the sensitivity sharply changes in the output waveforms shown in FIGS. 52d1 through 52d3, the output needs not be corrected or may be corrected by an average value per several bits. Thereby, it requires less memory for the external circuit and simplifies the calculation of the correction.

Figure 55A:
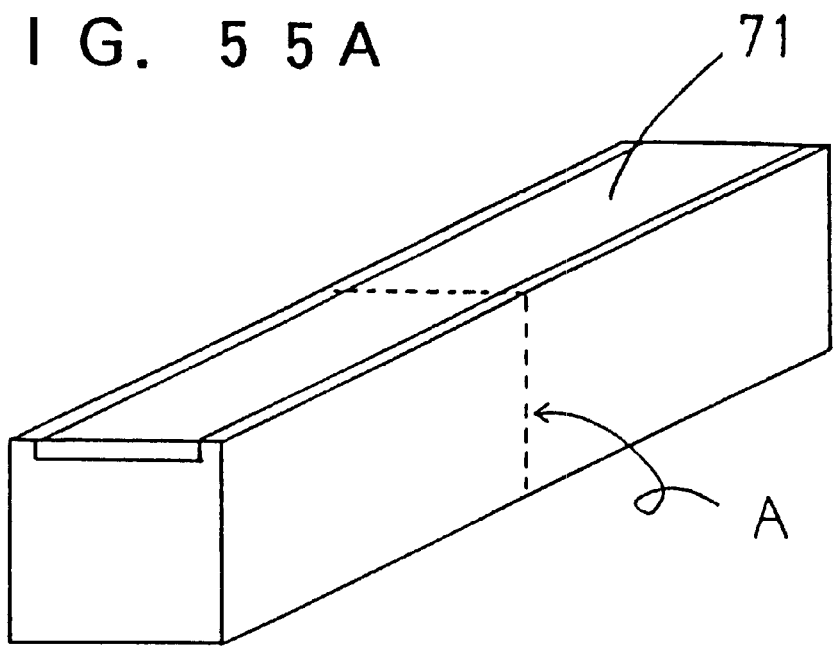
FIG. 55a is a perspective view of the inventive linear image sensor.
Figure 55B:
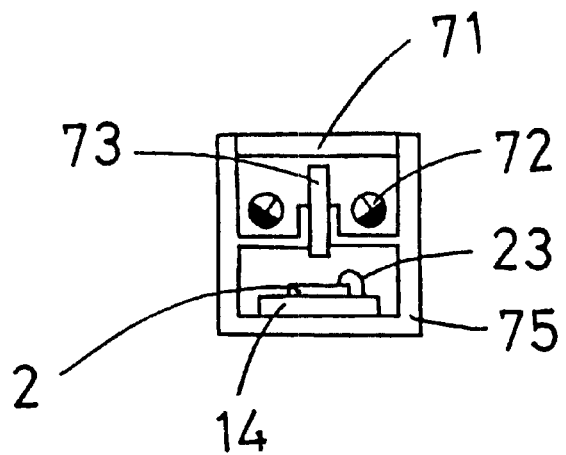

FIG. 55a is a perspective view of the inventive linear image sensor and FIG. 55b is a section view at portion A of the linear image sensor in FIG. 55a. Light from a light source 72 is irradiated via a transparent glass 71 to an original face and light reflected therefrom enters the linear image sensor IC 2 for reading image data via the transparent lens 71 and a lens 73 having one time magnification. A case 75 serves to block external light as well as to fix other parts.

As described above, according to the eleventh embodiment, the difference of levels of outputs between adjoining chips may be reduced, the IC assembling substrate having less fluctuation of sensitivity between adjoining light receiving elements may be assembled and a low cost applied product which requires no complicated correction circuit can be realized.

Further, the present invention is more effective for a contact type linear image sensor having a wide reading width. While 27 IC chips having 8 mm of reading length described above have to be mounted to read an original of A4 size, the present invention contributes considerably in reducing the nonuniformity.

An inventive color image sensor IC, a color image sensor IC assembling substrate and an assembling method of the same will now be explained as a twelfth embodiment with reference to the drawings.

Figure 56A:
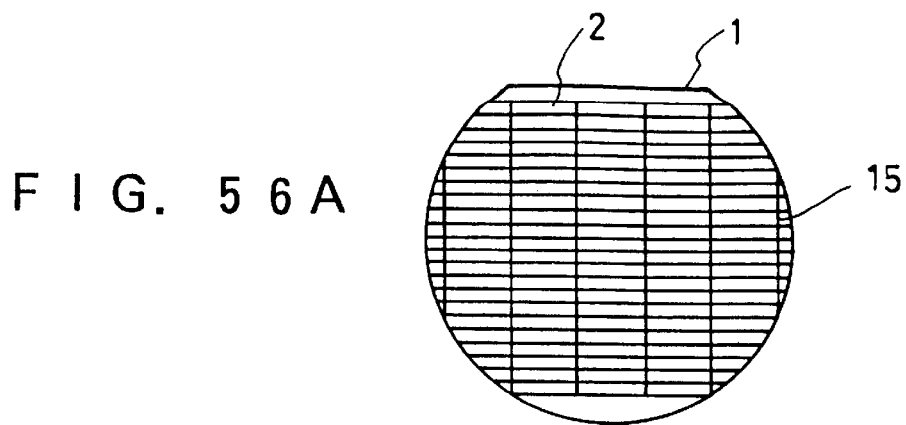

FIG. 56a is a plan view of a silicon wafer for obtaining ICs mounted in the inventive IC assembling substrate.

A plurality of ICs 2 and color filters having the same pattern are printed in a matrix on the surface of the silicon wafer 1 by using a common photolithography. Each IC is separated by scribe lines 15 provided perpendicularly in the horizontal and vertical directions. The ICs used in the inventive IC assembling substrate have a thin shape whose width is 400 $\mu$m for example. The length of the IC is prolonged to 5 mm to 15 mm in order to reduce a number of chips used in assembling. A stepper is used to thin the width of the IC. Accordingly, the length of the IC is within a maximum transfer length of the stepper of 15 mm. Further, the length is kept within 15 mm to keep a mechanical strength because the chip is very thin and long. The silicon wafer 1 has a thickness of 600 $\mu$m in a case of a 6-inch wafer when it is processed by oxidation and etching for example in the IC process. Because the IC is thin and long, the ICs may be printed efficiently by using a large wafer of more than 6 inches. When the diameter of the wafer is large, the ICs are printed and worked by keeping the thickness of the wafer to 400 μm or more in order to maintain the mechanical strength of the wafer.

Figure 57:
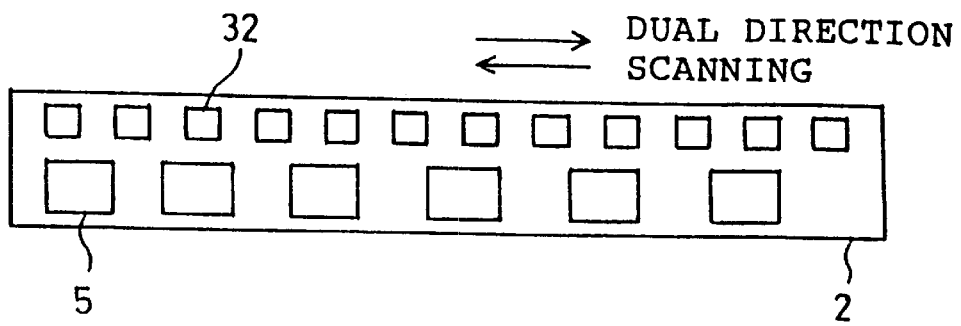
FIG. 57 is a plan view of the IC used in the IC assembling substrate.

FIG. 57 is a plan view of the IC mounted on the inventive IC assembling substrate. Formed normally on the IC 2 are six or more pads 5 for a power supply, input/output terminals for control and image signal output terminal. Further, a plurality of light receiving elements 32 having an identical shape and composed of a phototransistor or a photodiode are placed periodically along the longitudinal direction of the chip. The light receiving elements 32 are provided linearly with a period of reading pitch along the scanning direction. Charge stored in the light receiving element is output from the image signal output terminal by scanning sequentially from the leftmost light receiving element toward the right direction or reversely from the rightmost light receiving element toward the left direction. That is, it has a dual-directional scanning function. The chip is thin and long considerably as it has 400 μm of width and 8 mm of length for example.

Figure 58:
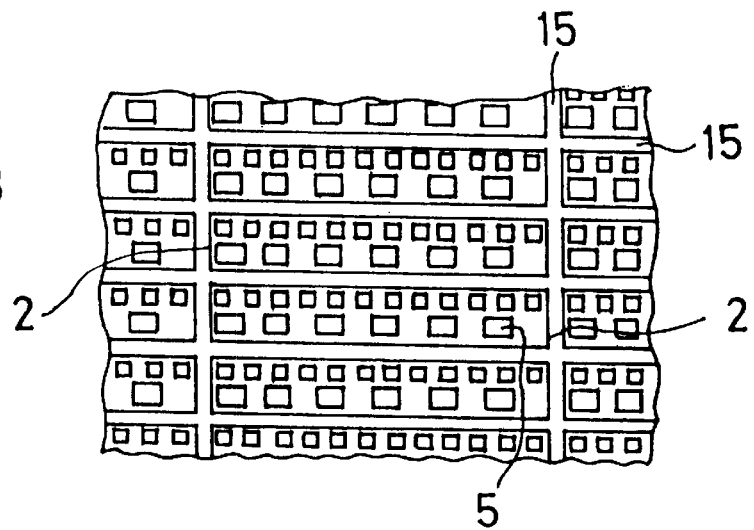
FIG. 58 is an enlarged view of part of the surface of the inventive silicon wafer.

FIG. 58 is an enlarged view of part of the surface of the silicon wafer 1.

Because the width of the IC is so thin as about 400 μm, it is necessary to lower the gravity thereof to stably place it when mounting on the assembling substrate. Accordingly, the back of the silicon wafer 1 is cut and thinned to about 350 μm by polishing after printing the ICs on the surface of the silicon wafer 1.

Figure 59:
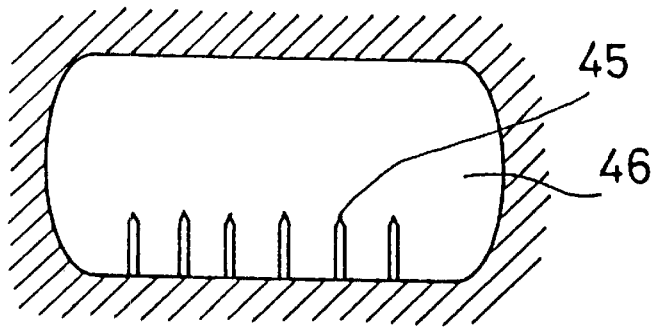
FIG. 59 is an enlarged view of a center part of an inventive probe card.

Next, electrical characteristics of all the ICs on the silicon wafer 1 are measured by a tester by placing the silicon wafer 1 on a wafer stage. FIG. 59 is an enlarged view of a center part of a probe card attached to a prober in order to test the IC 2 on the silicon wafer 1. The IC 2 is tested by contacting the tips of probes 45 attached to the probe card to the pads 5 of the IC 2. The probes 45 serve to electrically contact the IC tester with the IC 2. The IC tester discriminates the IC 2 whether it is good or defective.

Next, fail marks are marked on ICs determined to be defective based on the test result. Or, the discrimination result is recorded in a floppy disk or the like together with coordinate data of the ICs.

Next, the ultraviolet adhesive tape 16 is adhered on the back of the silicon wafer 1. This tape is easily elastically deformed and its adhesive strength may be controlled by irradiating ultraviolet. It is adhered on the silicon wafer 1 fully so that it will not be peeled off when the silicon wafer 1 is scribed.

Next, the surface of the silicon wafer 1 is scribed by repeating vertical and horizontal reciprocal movements along the scribe lines 15. The ICs mechanically connected each other on the silicon wafer 1 are separated spatially by the scribe.

Figure 56B:
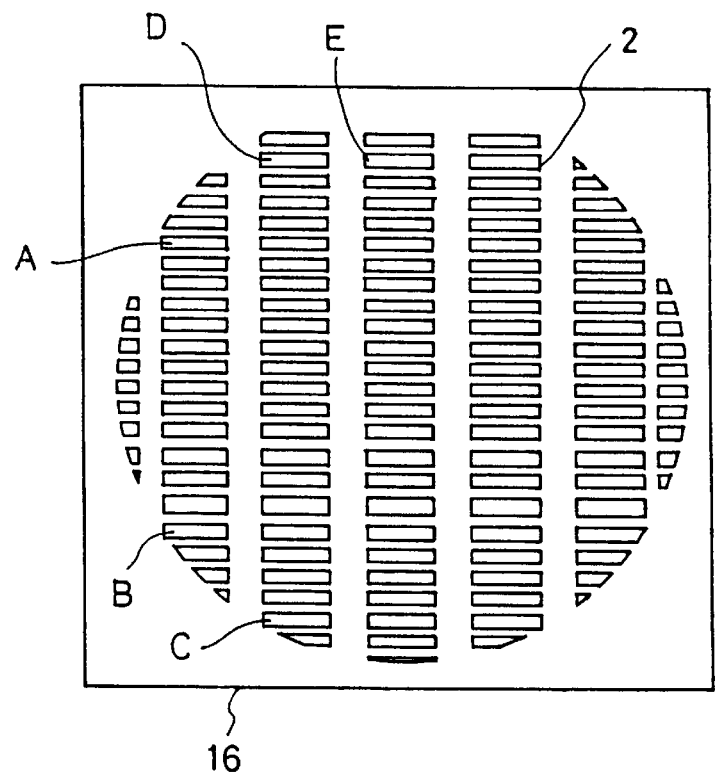

Next, the adhesive tape 16 is stretched two-dimensionally along the tape surface as shown in FIG. 56*b*. Then, each of the ICs separated by the scribe is separated further more than a width of the scribe line.

Figure 56C:
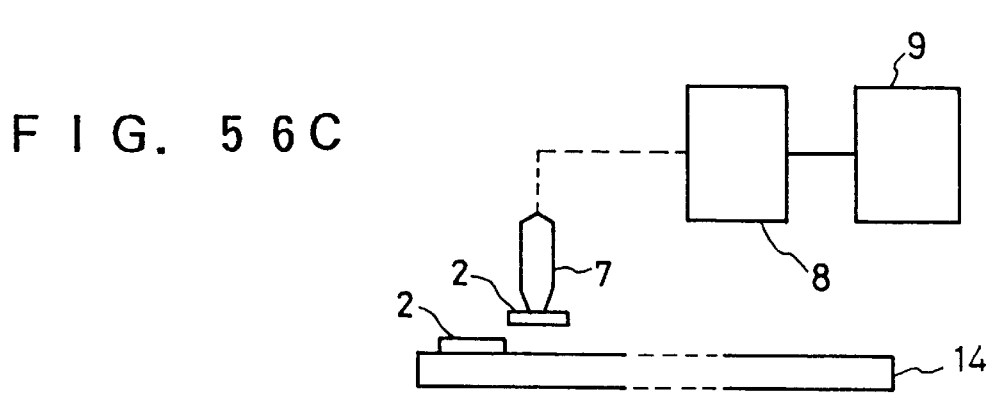

Next, the ICs 2 each separated are picked up by the robot 7 and are placed on the head substrate 14 as shown in FIG. 56*c*. The robot 7 is controlled by the computer 8. The computer 8 reads the data of electrical characteristics of the ICs within the silicon wafer 1 given by the probing test to select only good chips and to control the robot 7 so that it places them. Or, the fail marks marked on the defective IC chips are recognized image-wise to select only good chips.

According to the present invention, the robot 7 picks up the ICs 2 after dicing them adjoining on the wafer and places them sequentially on the assembling substrate 14 as described above. If the adjoining IC chip is defective, normal IC chips in the vicinity thereof are placed. At this time, chips which have been adjoined each other on the wafer may be adjoined also on the assembling substrate 14 by placing the chips sequentially so that they are connected. For example, when the chips are placed sequentially downward from a good chip A at the top of the left edge row shown in FIG. 56*b* and then a chip B is placed, a good chip C at the bottom of the next row is placed. Next, chips are placed sequentially upward from the chip C. Chips D and E are then placed in the same manner. When the chips have been placed on the assembling substrate on the way, they are placed on the next assembling substrate.

In the case of the image sensor ICs, sensitivity of light receiving elements fluctuates within the silicon wafer. It is considered to be caused by an uneven thermal distribution within the wafer surface and by an uneven thickness of various insulating films in the IC manufacturing process, and the sensitivity tends to change continuously within the wafer. Accordingly, the closer the distance between the light receiving elements on the wafer, the smaller the difference of sensitivity may be and the farther the distance, the larger the difference of sensitivity may be.

For example, assume here that the right chips have higher sensitivity in FIG. 56*b*. Here, a case when six IC chips are mounted on the assembling substrate by three ways of pickup sequence of d1, d2 and d3 in FIG. 60 will be explained. When uniform light is irradiated to the assembling substrate on which the IC chips are placed so that they are oriented in the same direction, their outputs turn out as shown in FIGS. 61*d*1 through 61*d*3, respectively. Numerals (1) through (6) in the figures represent the ICs and show the pickup sequence. As it is apparent from any of the figures, a sharp difference of sensitivity is brought about between the neighboring IC chips at several places. FIGS. 62*d*1 through 62*d*3 show output waveforms of the inventive image sensor head and show results obtained when the present invention is applied to FIGS. 61*d*1 through 61*d*3. FIG. 62*d*1 shows the result when the IC chips (2), (4) and (6) are placed by turning by 180 degrees on the plane of the assembling substrate to reverse the scanning direction of the light receiving elements within the IC chips. FIG. 62*d*2 shows the result when the IC chips (2) and (5) are placed by turning by 180 degrees on the plane of the assembling substrate to reverse the scanning direction of the light receiving elements within the IC chips. FIG. 62*d*3 shows the result when the IC chips (5) and (6) are placed by turning by 180 degrees on the plane of the assembling substrate to reverse the scanning direction of the light receiving elements within the IC chips. By this way, the linear image sensor in which the difference of outputs between the neighboring IC chips is extremely small may be realized because the adjoining light receiving elements between the adjoining chips placed on the assembling substrate have been placed very closely on the wafer. For example, in a case of an IC having 8 mm of length and 0.4 mm of width, adjoining light receiving elements between adjoining chips are separated on the wafer only 0.8 mm in maximum which is 1/20 as compared to about 8 mm of distance between the light receiving elements at the both ends within one chip.

Figure 63A:
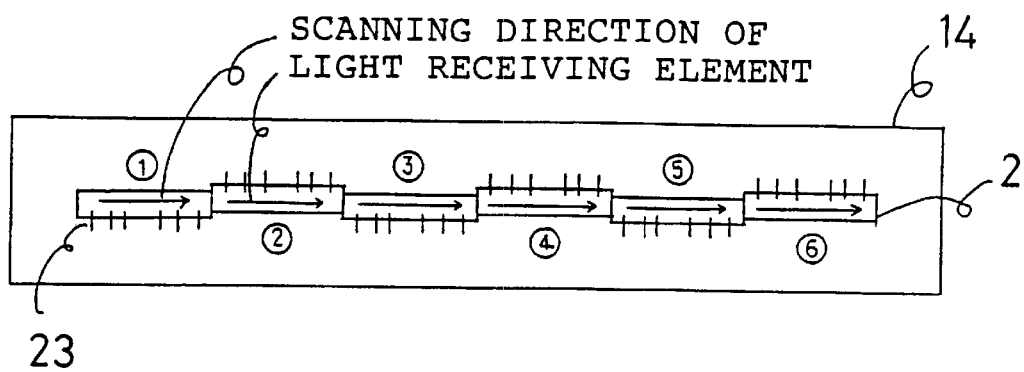
FIGS. 63a and 63b are plan views of the prior art image sensor IC.
Figure 63B:
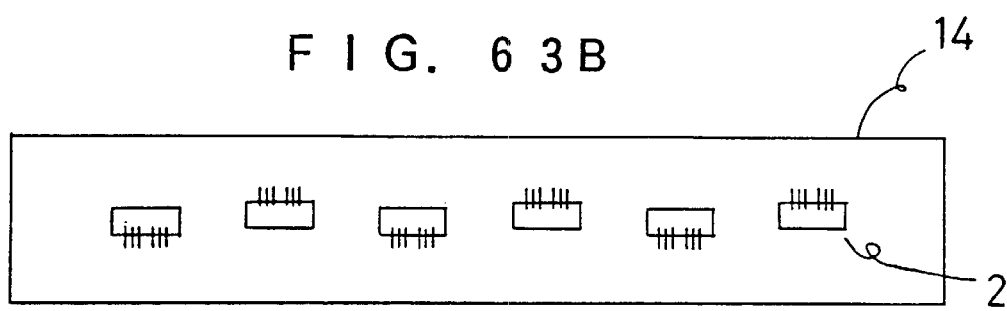
Figure 64A:
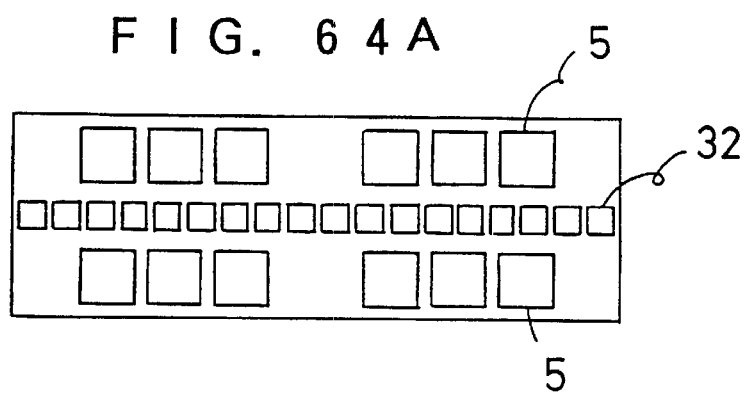
FIG. 64a is a plan view of another inventive image sensor IC.
Figure 64B:
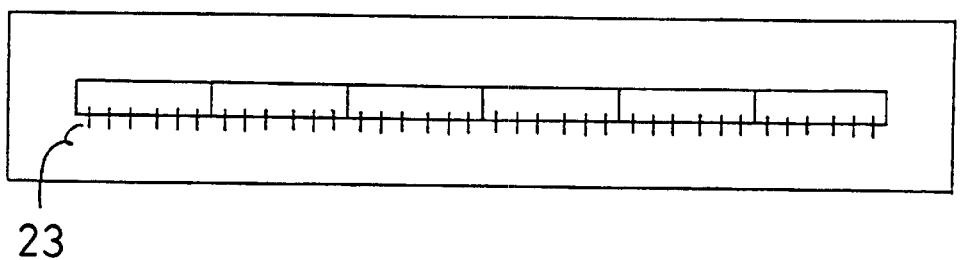

Further, as it can be seen when FIGS. 62*d*1 through 62*d*3 are compared, the way shown in FIG. 62*d*1 in which the ICs placed in the direction vertical to the direction of array of the light receiving element within the IC chip is likely to reduce the uneven sensitivity as the linear image sensor after they are placed on the assembling substrate. FIG. 63*a* is a plan view showing the linear image sensor head after placing the IC chips showing the output state shown in FIG. 62*d*1. The scanning direction within the IC chips is also shown in the figure. The image sensor IC in FIG. 63*a* has a configuration in reading image data of an original via an equal magnification lens (e.g., SLA) and a gap between the adjoining IC chips is reduced. When the image data is read by using each individual reduction lens for each IC chip, not using the equal magnification lens, IC chips 2' in which a distance between light receiving elements is reduced are placed as shown in FIG. 63*b*. In the case of FIG. 63*a*, wires 23 extend from the pads to the both sides of the light receiving element array and an optical condition differs among the IC chips. The pads 5 are placed on the both sides so as to sandwich the light receiving element array as shown in FIG. 64*a* to be able to drive the IC chip from either side to obtain a high image quality. The use of such IC chips allows the linear image sensor to be realized by providing wires only one side of the light receiving element array as shown in FIG. 64*b* when the present invention is applied.

Because there is no portion where the sensitivity sharply changes in the output waveforms shown in FIGS. 62*d*1 through 62*d*3, the output needs not be corrected or may be corrected by an average value per several bits. Thereby, it requires less memory for the external circuit and simplifies the calculation of the correction.

Figure 65A:
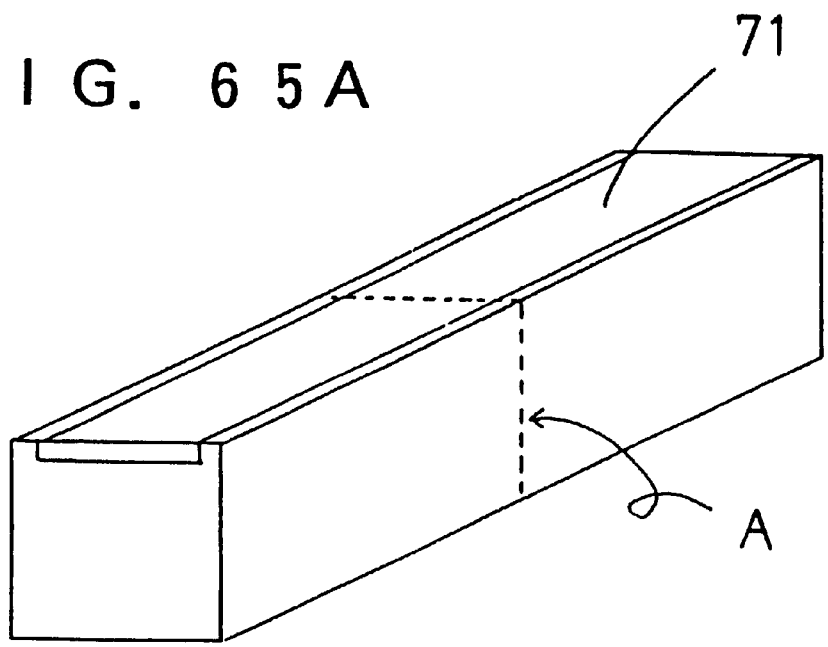
Figure 65B:
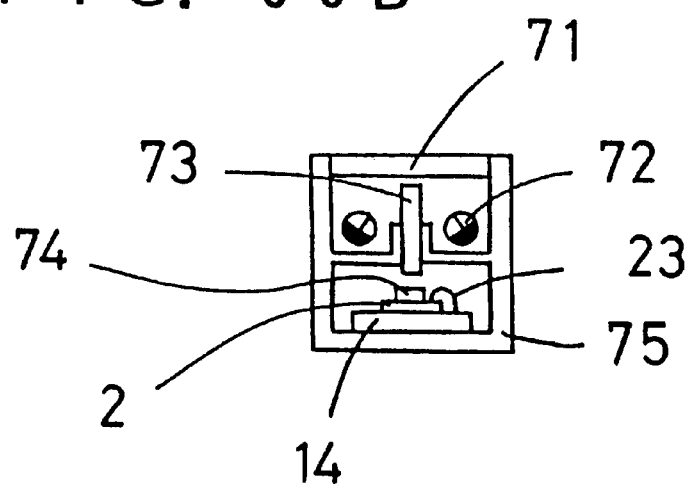

While the case when the color filters which are means for separating colors are formed on the light receiving elements of the image sensor which is reading means has been explained, a color linear image sensor unit at this time are shown in FIGS. 65*a* and 65*b*. FIG. 65*a* is a perspective view of the inventive color linear image sensor unit and FIG. 65*b* is a section view at portion A of the color linear image sensor unit in FIG. 65*a*. Light from a light source 72 is irradiated via a transparent glass 71 to an original face and light reflected therefrom enters the linear image sensor IC 2 for reading color image data via the transparent lens 71 and a lens 73 having one time magnification.

Figure 66A:
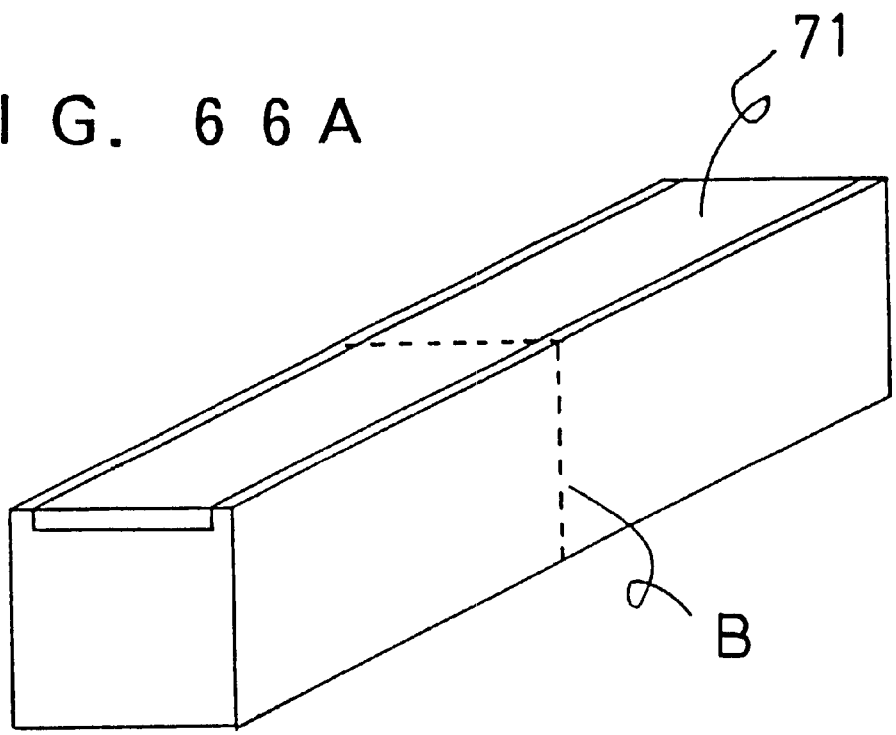
Figure 66B:
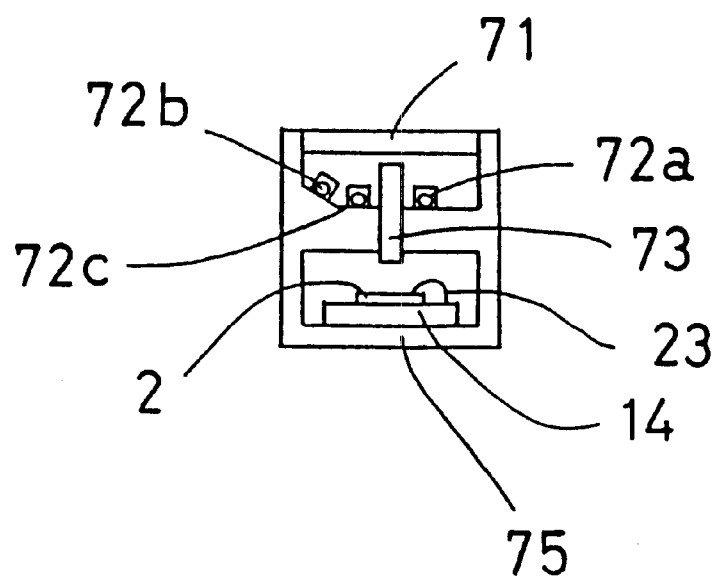

Beside that, there is means for separating colors of an original to be read by switching and flashing three or more types of color sources having different wavelengths as one means for separating colors without using the color filters. The linear image sensor which is the reading means of the present invention is suited also to that case and FIG. 66 shows a color linear image sensor unit of the case. FIG. 66*a* is a perspective view of the inventive color linear image sensor unit and FIG. 66*b* is a section view at portion B of the color linear image sensor unit in FIG. 65*a*. Lights from light sources 72*a*, 72*b* and 72*c* are irradiated via a transparent glass 71 to an original face and lights reflected therefrom enter the linear image sensor IC 2 for reading color image data via the transparent lens 71 and a lens 73 having one time magnification.

As described above, according to the twelfth embodiment, the difference of levels of outputs between adjoining chips may be reduced, the IC assembling substrate having less fluctuation of sensitivity between adjoining light receiving elements may be assembled and a low cost applied product such as a color scanner which requires no complicated correction circuit can be realized.

The present invention is more effective for a contact type linear image sensor having a wide reading width. While 27 IC chips having 8 mm of reading length described above have to be mounted to read an original of A4 size, the present invention contributes considerably in reducing the nonuniformity.

Next, a method for assembling an inventive silicon wafer semi-product will be explained as a thirteenth embodiment with reference to the drawings.

Figure 67:
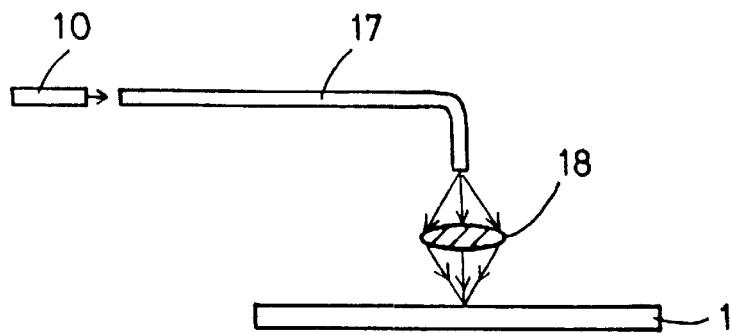
FIG. 67 is a schematic section view showing a method for manufacturing a silicon wafer semi-product according to the present invention.

FIG. 67 is a schematic section view of a fail marking process showing the method for manufacturing a silicon wafer semi-product according to the present invention. Before the fail mark is marked on a defective IC chip as shown in FIG. 67, a plurality of ICs are formed by the normal process by repeatedly scribing the surface of the silicon wafer along the scribe lines. Transistors are placed on the surface of each IC in a line along the longitudinal direction of the chip.

For example, when an IC is an IC for a linear image sensor, phototransistors are provided by a multiple times of 4 bits in the longitudinal direction of the chip. When an IC is an IC for a thermal head, resistance heating high withstand voltage trouble transistors are placed in a line by a multiple times of 4 bits in the longitudinal direction of the chip. A width of the chip is thinned to 400 $\mu$m or less to bring down the cost. The width of the chip is a length between scribe centers. To thin the width of the chip, a width of the scribe line is reduced to 60 $\mu$m or less. Further, a stepper is used in the photolithography of the ICs to reduce the minimum working width to 1.2 $\mu$m or less. Because the stepper is used, it is difficult to provide an necessary alignment mark on the scribe line of less than 60 $\mu$m. Accordingly, the scribe line in the longitudinal direction of the chip is thinned to 60 $\mu$m or less and the scribe line in the width direction of the chip is kept thick to 100 $\mu$m as in the past to provide the alignment mark on the thick scribe line.

By this way, the width of the chip can be thinned to about 280 $\mu$m. The length of the chip is long as compared to the width thereof by more than one digit and is between 4 to 12 mm in general, though it depends on a required bit number.

The back of the silicon wafer is polished to thin the thickness of the wafer after printing the ICs on the surface of the wafer by the stepper. In a case of a 6-inch wafer, a thickness thereof of 600 $\mu$m is thinned to about 300 to 400 $\mu$m.

Next, electrical characteristics of all the ICs on the surface of the wafer are measured by an IC tester. Defective chips are marked with fail marks on the surface thereof by the marking process so as to be discriminated as being defective.

As shown in FIG. 67, a laser beam emitted from a YAG laser 10 is guided to the vicinity of the silicon wafer 1 by a fine optical fiber 17 of less than 100 $\mu$m in diameter. A light focusing lens 18 is provided at the outlet of the optical fiber 17 while keeping a distance of 1 to 2 cm from the surface of the silicon wafer 1. The laser beam output from the optical fiber 17 is irradiated to the defective chip on the silicon wafer 1 by the light focusing lens 18. When the laser beam is irradiated to the defective IC chip, it is heated locally and a thermally damaged area is formed as a fail mark on the surface of the defective chip.

FIG. 28 is a plan view of the defective IC chip which is marked with the fail mark 19. The present invention allows the fail mark 19 whose size is very small as compared to the conventional method of using ink to be formed with a diameter of 100 to 200 $\mu$m. Accordingly, it becomes possible to form a silicon wafer semi-product whose chip width is thinner than 400 $\mu$m. The size of the fail mark may be reduced by thinning the laser beam and by focusing the light by bringing the light focusing lens closer to the optical fiver and the silicon wafer. There has been a problem in marking the fail mark by means of the laser beam that fragments caused by the damage may scatter around the neighboring chips. However, it became possible to prevent the fragments from scattering around the neighboring chips by narrowing down the laser beam into a very small area. In the present embodiment, it was implemented by using the YAG laser whose wavelength is 1.06 μm and by pulse drive of 10 shots/second. Its oscillation time width was 100 μsec and an output energy was 50 mJ.

Figure 68:
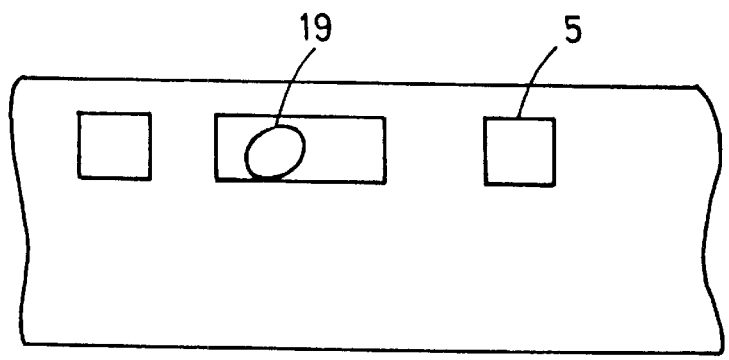
FIG. 68 is a plan view of the inventive silicon wafer semi-product.

It is hard to discriminate the fail mark marked by the laser irradiation as compared to that marked by ink. Accordingly, it is necessary to provide a pattern for discriminating a fail mark having about the same size with a fail mark near the fail mark as shown in FIG. 68 and a pad or a thick aluminum wire is used in general. It becomes possible to determine whether a fail mark exists or not by checking whether the fail mark exists near the pattern for discriminating fail mark.

As described above, the present invention allows the silicon wafer composed of very thin chips to be formed by forming the small fail mark by laser irradiation. Further, the size of the fail mark can be reduced by transmitting a laser beam by the fine optical fiber to a silicon wafer and by providing the light focusing lens near the silicon wafer to form a small spot of the laser beam.

As described above, according to the thirteenth embodiment, the very thin ICs of 400 μm or less could be fabricated by forming the fail mark by thermal damage caused by the irradiation of laser beam condensed to a small spot. And the very thin ICs allowed the cost of the IC to be brought down and the size thereof to be reduced.

An inventive electronic device will now be explained below as a fourteenth embodiment with reference to the drawings.

Figure 69A:
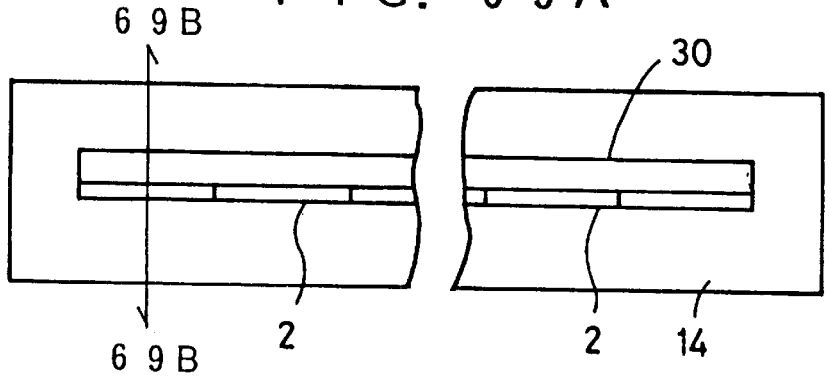
FIGS. 69a and 69b are a plan view and a section view, respectively, of the inventive electronic device.
Figure 69B:
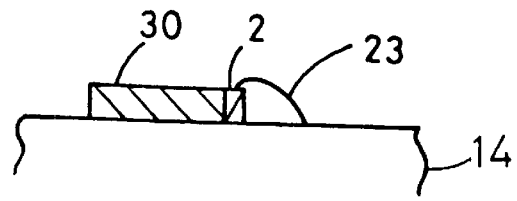
Figure 70A:
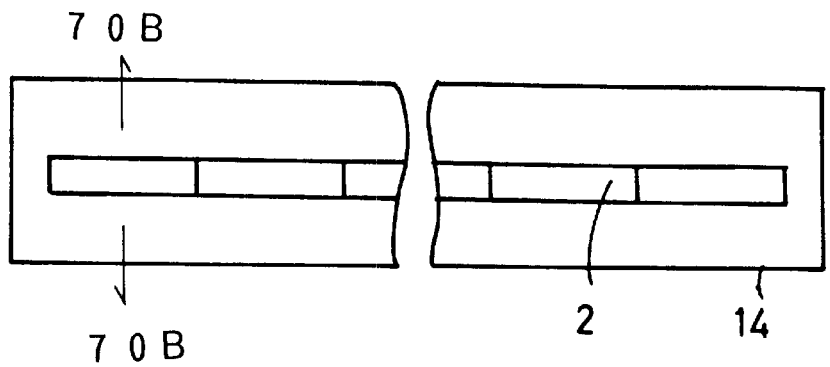
FIGS. 70a and 70b are a plan view and a section view, respectively, of a prior art electronic device.
Figure 70B:
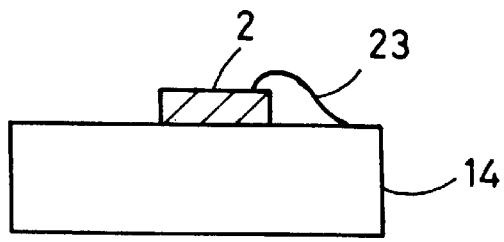

FIGS. 69a and 69b are a plan view and a section view, respectively, of the electronic device in which a plurality of very thin and long ICs 2 are placed in a line on a surface of a substrate 1.

All wires are printed on the surface of the substrate 14 and power and signals are supplied from the outside. The wire of the substrate 14 is connected electrically with each IC 2 by a bonding lead line 23 via each pad terminal. The length of the IC is longer than 7 mm and its width is thinner than 0.35 mm. A thickness of the IC is thinned to 0.35 mm by polishing the back of the wafer. The width of the IC in particular can be thinned to about 100 μm which is equal to a width of the pad by inventing various methods. That is, in the present invention, the width of the IC is 100 to 350 μm and is thinner than the thickness thereof. The length thereof is longer than the width by more than 10 times for application' sake and is 7 mm or more which is 20 times of the width in general. At least three or more ICs 2 or ten or more ICs 2 in general are mounted in a row linearly on the surface of the substrate.

In order to mechanically and stably leave the ICs having such new structure, a supporting base 30 is provided mechanically in the longitudinal direction of each IC in the inventive electronic device. A width of the supporting base 30 is 1 mm or more and a length thereof is at least longer than the length of each IC. The length of the supporting base 30 is desirable to be longer than the sum of the lengths of the plurality of ICs in order to be able to support the plurality of ICs in the same time. The supporting base 30 is supported mechanically at the bottom thereof by the substrate 14. Each IC 2 is supported by the supporting base 30 by the side thereof. Each IC 2 is supported also by the substrate 14 as its bottom contacts with the substrate 14. However, because the width of the IC is thinner than the thickness thereof in the present invention, its mechanical support is provided by the supporting base 30, rather than the substrate 14. That is, a contact area of the IC 2 and the supporting base 30 is larger than that of the IC 2 and the substrate 14.

As described above, according the fourteenth embodiment, the very thin and long ICs may be stably supported by the supporting base. That is, the very thin and long ICs can be stably mounted by mechanically connecting the bottom with the substrate and by mechanically connecting the side with the supporting base. The electronic device in which the width of the IC is thinner than the thickness thereof may be stably mounted by the supporting base, rather than the substrate. Thereby, it became possible to mount the very thin ICs which had been difficult to mount in the past. As a result, it became possible to miniaturize the device and to lower the cost.

The inventive electronic device is suited to an image sensor or a thermal head for composing a facsimile.

Figure 71A:
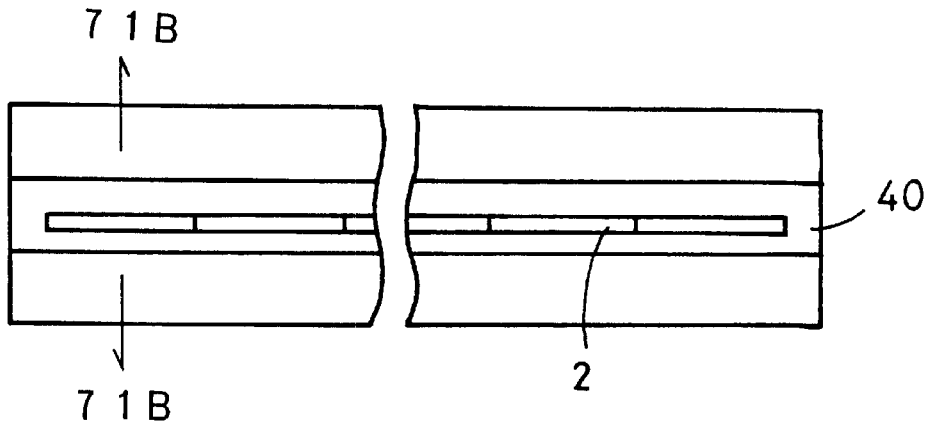
FIGS. 71a and 71b are a plan view and a section view, respectively, of the inventive electronic device.
Figure 71B:
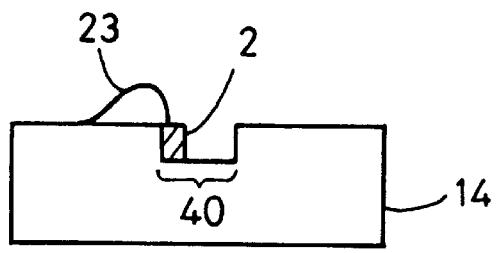

A fifteenth embodiment will be explained below. FIGS. 71a and 71b are a plan view and a section view, respectively, of an electronic device in which a plurality of very thin and long ICs 2 are placed in a line on the surface of a substrate 1.

All wires are printed on the surface of the substrate 14 and power and signals are supplied from the outside. The wire of the substrate 14 is connected electrically with each IC 2 by a bonding lead line 23 via each pad terminal. The length of the IC is longer than 7 mm and its width is thinner than 0.35 mm. A thickness of the IC is thinned to 0.35 mm by polishing the back of the wafer. The width of the IC in particular can be thinned to about 100 μm which is equal to a width of the pad by inventing various methods. That is, in the present invention, the width of the IC is 100 to 350 μm and is thinner than the thickness thereof. The length thereof is longer than the width by more than 10 times for application' sake and is 7 mm or more which is 20 times of the width in general. At least three or more ICs 2 or ten or more ICs 2 in general are mounted in a row linearly on the surface of the substrate.

In order to mechanically and stably leave the ICs having such new structure, a support groove 40 is provided in the longitudinal direction of each IC in the inventive electronic device. A width of the support groove 40 is larger than that of the IC 2 and a length thereof is longer than the length of each IC. The length of the support groove 40 is almost equal to that of the substrate 14 so that the plurality of ICs can be arranged continuously. A depth of the support groove 40 is larger than a contact area between the bottom of the IC 2 and the support groove 40 and is deeper than the width of the IC 2 so that the IC 2 is mechanically stabilized by contacting with the side of the support groove 40. That is, the IC 2 is supported almost by the adhesion with the side of the support groove 40. Further, because the surface of the IC 2 and the surface of the substrate 14 are lined up almost on the same plane, the IC 2 and the wire of the substrate 14 can be electrically connected readily.

The inventive electronic device is suited to the image sensor and the thermal head used in a facsimile described in the Related Art. In the image sensor in particular, there is a problem that when the IC is very thin, it detects not only light from the surface but also optical detection noise from the side thereof.

When the IC 2 is thin, a distance between the side of the IC 2 and a phototransistor provided on the surface of the IC 2 becomes short and optical detection noise is generated from the side. However, the inventive electronic device can prevent light from entering the side of the IC 2 as the side of the IC 2 contacts with the support groove 40. That is, it can prevent the noise which might be caused by light entering from the side of the IC 2. The other side of the IC 2 cannot be contacted with the groove. However, optical detection noise may be prevented from occurring from the non-contact side by mounting the photosensor by shifting it in the direction of contacting with the support groove 40 with respect to the width of the IC 2. Further, although not shown, the both sides of the IC 2 may be supported and light may be prevented from entering therefrom by capping the support groove on the non-contact side by opaque liquid resin and solidifying it by heat treatment.

As described above, according to the fifteenth embodiment, the very thin and long IC may be stably supported by the groove provided within the substrate. The groove is provided not only to position the IC but also to improve the mechanical strength of the IC by adhering it with the side of the groove. Further, in the case of the linear image sensor, it has the effect of preventing the noise from being generated by light entering the side of the IC. Accordingly, it became possible to mount the very thin ICs which had been difficult to mount in the past. As a result, it became possible to miniaturize the device and to lower the cost.

A sixteenth embodiment will be explained below. FIGS. 72a and 72b are a plan view and a section view, respectively, of an electronic device in which a plurality of very thin and long ICs 2 are placed in a line on the surface of a substrate 14. An electrical connecting board 50 which is electrically connected via a pad on the surface of the IC is provided. The IC 2 is mechanically stabilized by mounting it between the substrate 14 and the electrical connecting board 50 in contact with them. A length of each IC 2 is longer than 7 mm and its width is thinner than 0.35 mm. A thickness of the IC 2 is thinned to about 350 $\mu$m by polishing the back of the wafer. The width of the IC can be thinned to about 100 $\mu$m which is equal to a width of the pad. That is, the width of the inventive IC is 100 to 350 $\mu$m and is thinner than the thickness thereof. The length thereof is longer than the width by more than 10 times for application' sake and is 7 mm or more which is 20 times of the width in general. Generally, five or more ICs 2 or ten or more ICs 2, to accommodate with a width of A4 size paper, are mounted in a row linearly on the surface of the substrate.

In order to stably mount such thin and long ICs, the electrical connecting board 50 is provided on the surface of the IC, i.e., on the opposite side from the substrate 14. Even if the width of the IC 2 is thinner than 0.35 mm, it is stabilized not only by the adhesive strength between the bottom of the IC 2 and the substrate 14 but also by an adhesive strength between the IC 2 and a pressure between the electrical connecting board 50 and the substrate 14. Accordingly, the electrical connecting board 50 has functions of not only the electrical connection but also as a supporting board. It may be used only as a supporting board having no electrical connecting function. When it is used as a supporting board, the board itself has to be stabilized.

FIGS. 72a and 72b shows the embodiment in which the electrical connecting board 50 which is the supporting board is fixed and stabilized to the substrate 14 via a supporting base 39. That is, the supporting base 39 is provided stably on the surface of the substrate 14 at the side of the IC 2 along the longitudinal direction. A width of the supporting base 39 is fully larger than that of the IC 2 so as to be strongly secured to the substrate 14. The past actual result shows that if the supporting base 39 has more than 1 mm of width, it can be stably mounted. The electrical connecting board 50, i.e., the supporting board, is provided so as to bridge the supporting base 39 and the IC 2. Accordingly, the supporting base 39 is created so as to have a height almost equal to the thickness of the IC 2. By providing the supporting base 39 by adhering with the IC 2 as shown in FIGS. 72a and 72b, the IC 2 is considerably stabilized because it is supported by three faces of the bottom, surface and side. The electrical connection between the IC 2 and the electrical connecting board 50 may be achieved by providing a convex conductive film on the surface of either of them. A conductive film made of an elastic material is preferable. The electrical connection between the electrical connecting board 50 and the supporting base 39 or the substrate 14 is also made via the conductive film in the same manner. The use of the elastic material as the conductive film allows the IC 2 to be stabilized also mechanically because the pressure to the IC 2 may be enhanced.

FIG. 73 is a section view of the electronic device in the width direction when the substrate 14 and the electrical connecting board 50 are directly connected. The electrical connecting board 50 contacts with the substrate 14 with a large area and is stably mounted thereon. A groove having a depth equal to the thickness of the IC 2 is formed on the substrate 14 and the IC 2 is contacted with the side of the groove. Because the surface of the IC 2 and that of the substrate 14 have the same height, they can be connected by the electrical connecting board 50. The electrical connecting board 50 may be used solely as a supporting board for mechanically reinforcing and stabilizing the IC 2, not for the electrical connection also in FIG. 73. The mechanical stability is enhanced because not only the bottom and side but also the surface of the IC are supported by the substrate 14 and the electrical connecting board 50.

FIG. 74 is a section view of the electronic device in the width direction when the IC 2 is supported by providing a difference of level in the electrical connecting board 50.

The electrical connecting board 50 described above is laminar and can electrically connect a plurality of pads. Silicon mono-crystal which is mechanically strong is preferable as its material. It is required to transmit light in an electronic device in which photosensors are provided on the surface of the IC 2. Accordingly, the electrical connecting board is preferable to be a transparent glass substrate. Further, because the IC and the electrical connecting board contact in a plane, the size of the pads of the IC 2 may be reduced. The reduction of the size of the pads allows the width of the IC 2 itself to be reduced and thus allows the present invention to be practiced more effectively.

As described above, the electronic device of the sixteenth embodiment allows a double or more mechanical strength to be obtained by sandwiching the very thin IC with the substrate and the supporting base. Further, the supporting base has an effect of reducing the packaging cost because it has a function of the electrical connecting board.

The first through sixteenth embodiments described above may be implemented by combining in various ways.

As described above, the inventive image sensor IC is mounted by devising so that the circuit can be put into a thin and long pattern in the scanning direction, so that the chip having a width thinner than a thickness thereof which had been beyond expectation by the prior art can be realized. Further, the use of this very thin IC allows the compact IC assembling substrate having less fluctuation among ICs to be manufactured at low cost. Even more, it has become possible to mount ICs readily on a cylindrical substrate which had been difficult in the past.

Thereby, electronic devices such as a compact and low cost multi-chip type image sensor or multi-chip type thermal head can be realized. Accordingly, it has become possible to bring down the cost thereof, which had been difficult in the past, and to realize a low cost facsimile. While there have been described preferred forms of the invention, obviously modifications and variations are possible in light of the above teachings. It is therefore to be understood that within the scope of the appended claims, the invention may be practiced otherwise than as specifically described.

FIG. 1:
- 2: image sensor
- 3: scanning circuit array
- 4: driving circuit
- 5: pad
- 20: array of phototransistor and st FIG. 2:
- 3: scanning circuit array
- 21: phototransistor array
- 22: switch transistor array FIG. 7:
- 111: N− silicon substrate
- 112: P− base diffusion layer
- 113: P+ diffusion layer
- 114: N+ diffusion layer
- 115: LOCOS oxide film
- 116: N± isolation layer
- 117: Al
- 118: intermediate insulating film
- 119: passivation film
- 120: edge portion of IC chip FIG. 8:
- 111: N− silicon substrate
- 112: P− base diffusion layer
- 113: P+ diffusion layer
- 114: N+ diffusion layer
- 115: LOCOS oxide film
- 116: N± isolation layer
- 118: intermediate insulating film
- 119: passivation film
- 120: edge portion of IC chip FIG. 9:
- 33: base region
- 34: emitter region
- 35: collector electrode
- 36: st
- 37: shift register
- 38: phototransistor FIG. 10:
- 2: sensor IC chip
- 14: sensor head substrate
- 23: wire bonding
- 44: connecting portion of sensor IC chip FIG. 13:
- 2: image sensor IC chip
- 4: driving circuit
- 5: pad
- 24: array of phototransistor and sc FIG. 14a:
- 33: base region
- 34: emitter region
- 35: collector electrode
- 36: st
- 37: sc
- 38: phototransistor FIG. 14b:
- 33: base region
- 34: emitter region
- 35: collector electrode
- 36: st
- 37: sc
- 38: phototransistor FIG. 16a:
- 33: base region
- 34: emitter region
- 35: collector electrode
- 36: st
- 37: sc
- 38: phototransistor FIG. 16b:
- 33: base region
- 34: emitter region
- 35: collector electrode
- 36: st
- 37: sc
- 38: phototransistor FIG: 17
- 4: driving circuit
- 5: pad
- 126: array of phototransistor, switch transistor and ac FIG. 18a:
- 33: base region
- 34: emitter region
- 35: collector electrode
- 52: switch transistor-and-scanning circuit
- 38: phototransistor FIG. 18b:
- 33: base region
- 34: emitter region
- 35: collector electrode
- 52: switch transistor-and-scanning circuit
- 38: phototransistor FIG. 20a:
- 33: base region
- 34: emitter region
- 35: collector electrode
- 52: switch transistor-and-scanning circuit
- 38: phototransistor FIG. 20b:
- 33: base region
- 34: emitter region
- 35: collector electrode
- 52: switch transistor-and-scanning circuit
- 38: phototransistor FIG. 21a:
- 33: base region
- 34: emitter region 35: collector electrode
52: switch transistor-and-scanning circuit
38: phototransistor
FIG. 25:
  5: pad
  55: pad electrode main scanning direction
FIG. 28:
  2: image sensor IC
  3: scanning circuit array
  5: pad
  20: array of phototransistors and switch transistors
  44: 1–3 pin probe
  55: 4–6 pin probe
FIG. 29:
  2: image sensor IC
  5: pad
  44: 1–3 pin probe
  55: 4–6 pin probe
  56: first direction
  57: second direction
  58: third direction
FIG. 30:
  4: fourth direction
  5: pad
  55: pad electrode
  59: damaged trace of probe
FIG. 31:
  S2: photoelectric converter element
  SW: switching element
  SL1: first common line
  SL2: second common line
  FF: flip-flop
FIG. 32:
  RG1: first reset gate
  RG2: second reset gate
  RG3: third reset gate
  G1: first reading gate
  G2: second reading gate
  SL3: third common line
  SC: scanning circuit
  CC: control circuit
FIG. 34:
  S2: photoelectric converter element
  SW: switching element
  SL1: first common line
  SL2: second common line
  SL3: third common line
  SL4: fourth common line
FIG. 35:
  RG1: first reset gate
  RG2: second reset gate
  RG3: third reset gate
  RG4: fourth reset gate
  RG5: fifth reset gate
  G1: first reading gate
  G2: second reading gate
  G3: third reading gate
  G4: fourth reading gate SL5: fifth common line
  SIG: signal output terminal
  SC: scanning circuit
  CC: control circuit
FIG. 36:
  FF: flip-flop
FIG. 39a:
  1: wafer
  2: IC
  15: scribe line
FIG. 39b:
  2: IC chip
  16: adhesive tape
FIG. 39c:
  7: robot
  9: computer
  9: floppy disk
  14: assembling substrate
FIG. 40:
  5: pad
  32: light receiving element or driver transistor
FIG. 42:
  15: scribe line
FIG. 43:
  45: probe
  46: opening window
FIG. 44:
  #1: output voltage
  #2: time
FIG. 45:
  #1: output voltage
  #2: time
FIG. 46a:
  1: wafer
  2: IC
  15: scribe line
FIG. 46b:
  2: IC chip
  16: adhesive tape
FIG. 46c:
  7: robot
  9: computer
  9: floppy disk
  14: assembling substrate
FIG. 47:
  2: IC
  5: pad
  32: light receiving element
  #1: dual direction scanning
FIG. 48:
  15: scribe line
FIG. 49:
  45: probe
  46: opening window FIG. 51:
　#1: output voltage
　#2: scanning time
FIG. 52:
　#1: output voltage
　#2: scanning time
FIG. 53a:
　2: IC chip
　14: assembling substrate
　23: wire
　#1: scanning direction of light receiving element
FIG. 55a:
　71: transparent glass
FIG. 55b:
　2: image sensor IC
　14: assembling substrate
　23: wire
　71: transparent glass
　72: light source
　73: lens having one time magnification
　75: case
FIG. 56a:
　1: wafer
　2: IC
　15: scribe line
FIG. 56b:
　2: IC chip
　16: adhesive tape
FIG. 56c:
　7: robot
　9: computer
　9: floppy disk
　14: assembling substrate
FIG. 57:
　2: IC
　5: pad
　32: light receiving element
　#1: dual direction scanning
FIG. 58:
　15: scribe line
FIG. 59:
　45: probe
　46: opening window
FIG. 61:
　#1: output voltage
　#2: scanning time
FIG. 62:
　#1: output voltage
　#2: scanning time
FIG. 63a:
　2: IC chip
　14: assembling substrate
　23: wire
　#1: scanning direction of light receiving element
FIG. 65a:
　71: transparent glass
FIG. 65b:
　2: image sensor IC
　14: assembling substrate
　23: wire
　71: transparent glass
　72: light source
　73: lens having one time magnification
　74: color filter
　75: case
FIG. 66a:
　71: transparent glass
FIG. 66b:
　2: image sensor IC
　14: assembling substrate
　23: wire
　71: transparent glass
　72a: light source a
　72b: light source b
　72c: light source c
　73: lens having one time magnification
　75: case
FIG. 67:
　10: YAG laser
　17: optical fiber
　18: light focusing lens
FIG. 68:
　5: Al pad
　19: fail mark
FIG. 72:
　14: substrate
　39: supporting base
　50: electrical connecting board

What is claimed is:

1. An electronic device comprising:
an IC assembling substrate having a surface; and
a plurality of ICs arrayed linearly on the surface of the IC assembling substrate, each IC having a plurality of light receiving elements arranged linearly and control circuitry connected to the light receiving elements, and each IC having a width of about 0.4 mm or less.

2. The electronic device of claim 1, wherein the control circuitry includes switching circuits coupled to the light receiving elements, scanning circuits for sequentially switching the switching circuits, and driving circuits for operating the scanning circuits.

3. The electronic device of claim 1, wherein a length of each IC is larger than its width by about 20 times or more.

4. The electronic device of claim 1, comprising at least three ICs arrayed on the surface of the IC assembling substrate.

5. The electronic device of claim 1, wherein the ICs are arranged on the substrate in contact with each other, the device further comprising an electrical connecting board connecting the ICs to the substrate.

6. The electronic device of claim 5, further comprising a support base mounted on the substrate, the electrical connecting board being supported by the support base.

7. An electronic device comprising:
an IC assembling substrate having a surface; and
a plurality of ICs arrayed linearly on the surface of the IC assembling substrate, each IC having a plurality of light receiving elements arranged linearly and control circuitry connected to the light receiving elements, and each IC having a thickness and a width that is smaller than the thickness.

8. The electronic device of claim 7, wherein the control circuitry includes switching circuits coupled to the light receiving elements, scanning circuits for sequentially switching the switching circuits, and driving circuits for operating the scanning circuits.

9. The electronic device of claim 7, wherein a length of each IC is larger than its width by about 20 times or more.

10. The electronic device of claim 7, comprising at least three ICs arrayed on the surface of the IC assembling substrate.

11. The electronic device of claim 7, wherein the ICs are arranged on the substrate in contact with each other, the device further comprising an electrical connecting board connecting the ICs to the substrate.

12. The electronic device of claim 11, further comprising a support base mounted on the substrate, the electrical connecting board being supported by the support base.

* * * * *